(12) United States Patent
Shiga et al.

(10) Patent No.: US 12,144,189 B2
(45) Date of Patent: Nov. 12, 2024

(54) THREE DIMENSIONAL STACKED SEMICONDUCTOR MEMORY

(71) Applicant: Kioxia Corporation, Tokyo (JP)

(72) Inventors: Hidehiro Shiga, Yokohama Kanagawa (JP); Daisaburo Takashima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 253 days.

(21) Appl. No.: 17/939,859

(22) Filed: Sep. 7, 2022

(65) Prior Publication Data

US 2023/0284464 A1 Sep. 7, 2023

(30) Foreign Application Priority Data

Mar. 7, 2022 (JP) .................................. 2022-034559

(51) Int. Cl.
  *G11C 11/00* (2006.01)
  *G11C 11/16* (2006.01)
  (Continued)

(52) U.S. Cl.
  CPC ........ *H10B 63/845* (2023.02); *G11C 11/1673* (2013.01); *G11C 11/1675* (2013.01);
  (Continued)

(58) Field of Classification Search
  CPC ............ G11C 13/0009; G11C 13/0026; G11C 13/0028; G11C 13/004; G11C 13/0069;
  (Continued)

(56) References Cited

U.S. PATENT DOCUMENTS

| 11,264,106 B2 | 3/2022 | Maejima et al. |
| 2014/0145137 A1* | 5/2014 | Ju ......................... H10B 63/84 257/2 |

(Continued)

FOREIGN PATENT DOCUMENTS

JP 2021002629 A 1/2021

OTHER PUBLICATIONS

U.S. Appl. No. 17/495,103, First Named Inventor: Ryu Ogiwara; Title: "Memory Device"; Filed: Oct. 6, 2021.

(Continued)

*Primary Examiner* — Hien N Nguyen

(74) *Attorney, Agent, or Firm* — Holtz, Holtz & Volek PC

(57) ABSTRACT

According to a certain embodiment, the 3D stacked semiconductor memory includes: a first electrode line extending in a first direction orthogonal to the semiconductor substrate; a second electrode line adjacent to the first electrode line in a second direction orthogonal to the first direction, and extending in the first direction; a first variable resistance film extending in the first direction and in contact with the second electrode line; a first semiconductor film in contact with the first variable resistance film and the first electrode line; a first potential applying electrode extending in the second direction and in contact with a first insulator layer; a second semiconductor film in contact with a second variable resistance film and the first electrode line; and a second potential (Continued)

applying electrode extending in the second direction and in contact with a second insulator layer. The first and second potential applying electrodes are electrically different nodes.

20 Claims, 33 Drawing Sheets

(51) Int. Cl.
    *G11C 13/00*     (2006.01)
    *H10B 61/00*     (2023.01)
    *H10B 63/00*     (2023.01)
    *H10N 50/80*     (2023.01)
    *H10N 70/00*     (2023.01)

(52) U.S. Cl.
    CPC ........ *G11C 13/004* (2013.01); *G11C 13/0069* (2013.01); *H10B 61/22* (2023.02); *H10B 63/34* (2023.02); *H10N 50/80* (2023.02); *H10N 70/8413* (2023.02); *G11C 2213/71* (2013.01); *G11C 2213/75* (2013.01); *G11C 2213/79* (2013.01)

(58) Field of Classification Search
    CPC ............ G11C 13/0002; G11C 13/0004; G11C 13/0033; G11C 13/0061; G11C 2013/0092; G11C 2213/71; G11C 13/003; G11C 2213/75; H10B 63/845; H10B 63/34; H10N 70/826; H10N 70/8828; H10N 70/231
    See application file for complete search history.

(56) References Cited

U.S. PATENT DOCUMENTS

| | | | |
|---|---|---|---|
| 2018/0090220 A1* | 3/2018 | Minagawa | G11C 11/5671 |
| 2018/0277226 A1* | 9/2018 | Tokutomi | G11C 16/34 |
| 2020/0303400 A1* | 9/2020 | Arai | H10B 43/27 |
| 2020/0357469 A1* | 11/2020 | Joe | H10B 41/27 |
| 2020/0403035 A1 | 12/2020 | Ogiwara et al. | |
| 2021/0399049 A1 | 12/2021 | Iizuka et al. | |
| 2022/0028452 A1 | 1/2022 | Ogiwara et al. | |
| 2022/0109024 A1* | 4/2022 | Ogiwara | G11C 13/0004 |
| 2023/0050443 A1* | 2/2023 | Smith | H01L 29/0692 |

OTHER PUBLICATIONS

U.S. Appl. No. 17/495,747, First Named Inventor: Ryu Ogiwara; Title: "Memory Device"; Filed: Oct. 6, 2021.
U.S. Appl. No. 17/689,182, First Named Inventor: Reiko Sumi; Title: "Semiconductor Memory Device"; Filed: Mar. 8, 2022.
U.S. Appl. No. 17/690,387, First Named Inventor: Daisaburo Takashima; Title: "Nonvolatile Semiconductor Memory Device"; Filed: Mar. 9, 2022.
U.S. Appl. No. 17/877,714, First Named Inventor: Ryu Ogiwara; Title: "Memory Device With Memory Strings Using Variable Resistance Memory Regions"; Filed: Jul. 29, 2022.

* cited by examiner

THREE DIMENSIONAL STACKED SEMICONDUCTOR MEMORY

CROSS REFERENCE TO RELATED APPLICATIONS

This application is based upon and claims the benefit of priority from prior Japanese Patent Application No. P2022-034559 filed on Mar. 7, 2022, the entire contents of which are incorporated herein by reference.

FIELD

Embodiments described herein relate generally to a three dimensional (3D) stacked semiconductor memory.

BACKGROUND

There have been proposed 3D stacked semiconductor memories in which resistive switching memory elements, such as Resistive Random Access Memory (ReRAM) elements, alloy type Phase Change Memory (PCM) elements, and Interfacial Phase Change Memory (iPCM) elements, are integrated on a semiconductor substrate. In nonvolatile semiconductor memory devices having a memory cell including a resistive switching element, by flowing an electric current through the resistive switching element, the resistive switching element is put into a high resistivity state or a low resistivity state.

DETAILED DESCRIPTION

Next, certain embodiments will now be explained with reference to drawings. In the following explanation, the common reference signs are attached to constituents having substantially the same functions and configurations. In the following description, a direction vertical to a semiconductor substrate extending in an X-Y plane is defined as a Z axial direction, a direction orthogonal to the Z axial direction and in which a word line WL extends is defined as an X axial direction, and a direction which a bit line vertical to the Z axial direction and the X axial direction extends is defined as a Y axial direction. Moreover, a resistive switching element RE may be indicated as a variable resistance film RE.

Certain embodiments provide a 3D stacked semiconductor memory capable of increasing a cell density.

According to one embodiment, a three dimensional stacked semiconductor memory includes: a semiconductor substrate; a first electrode line extending in a first direction orthogonal to the semiconductor substrate; a second electrode line disposed so as to be adjacent to the first electrode line in a second direction, the second direction orthogonal to the first direction, the second electrode line extending in the first direction; a first variable resistance film extending in the first direction and in contact with the second electrode line; a first semiconductor film in contact with the first variable resistance film and the first electrode line; a first insulator layer extending in the first direction and in contact with the first semiconductor film; a first potential applying electrode extending in the second direction and in contact with the first insulator layer; a second variable resistance film extending in the first direction, the second variable resistance film disposed in a minus direction of the third direction orthogonal to the first direction and the second direction, the second variable resistance film in contact with the second electrode line; a second semiconductor film in contact with the second variable resistance film and the first electrode line; a second insulator layer extending in the second direction and in contact with the second semiconductor film; and a second potential applying electrode extending in the second direction and is contact with the second insulator layer. The first potential applying electrode and the second potential applying electrode are electrically different nodes.

First Embodiment (Memory System)

Figure 1:
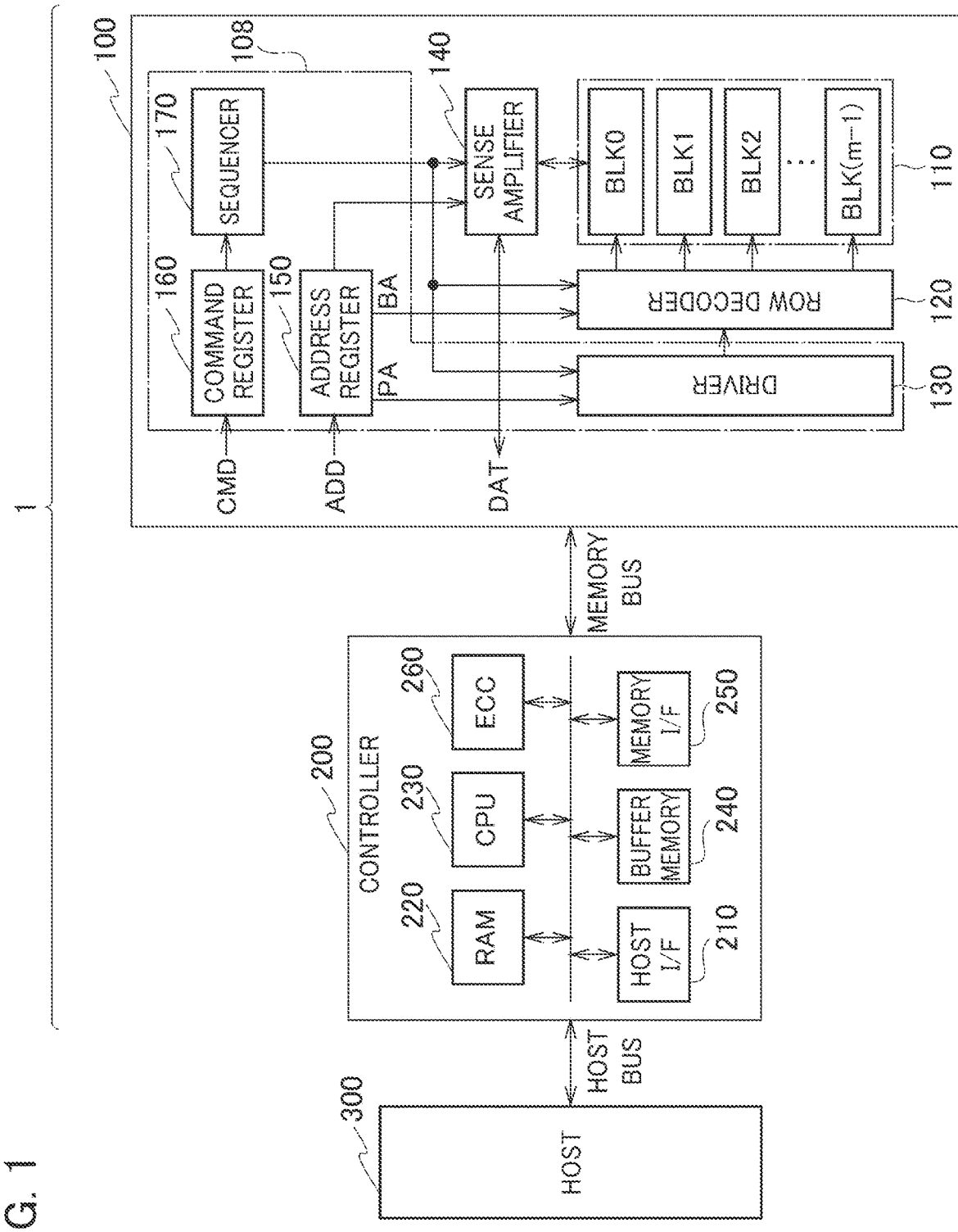
FIG. 1 is a block configuration diagram illustrating a memory system configured by applying a 3D stacked semiconductor memory according to the first embodiment.

There will now be described a block configuration of a memory system 1 to which a 3D stacked semiconductor memory 100 according to a first embodiment is applied. As illustrated in FIG. 1, the memory system 1 includes a 3D stacked semiconductor memory 100 and a controller 200. The 3D stacked semiconductor memory 100 and the controller 200 may constitute, for example, a single semiconductor device by combination thereof, and examples this single semiconductor device may include a memory card, a Solid State Drive (SSD), and the like.

The 3D stacked semiconductor memory 100 includes a plurality of memory cells and stores data in a nonvolatile manner. The controller 200 is connected to the 3D stacked semiconductor memory 100 through a memory bus and is connected to a host 300 through a host bus. The controller 200 controls the 3D stacked semiconductor memory 100, and also accesses the 3D stacked semiconductor memory 100 in response to a host command received from the host 300. The host 300 may be, for example, a digital camera, a personal computer (PC), or the like, and the host bus may be a bus according to, for example, a memory interface. The memory bus transmits and receives signals in accordance with the memory interface.

(Configuration of Controller 200)

As illustrated in FIG. 1, the controller 200 includes a host interface circuit (host I/F) 210, a built-in memory (e.g., Random Access Memory (RAM)) 220, a processor (Central Processing Unit (CPU)) 230, a buffer memory 240, a memory interface circuit (memory I/F) 250, and an Error Checking and Correcting (ECC) circuit 260.

The host interface circuit 210 is connected to the host 300 via the host bus, and respectively transfers the host command and data, which are received from the host 300, to the processor 230 and buffer memory 240. Moreover, the host interface circuit 210 transfers the data in the buffer memory 240 to the host 300 in response to an instruction from the processor 230.

The processor 230 controls the overall operation of the controller 200. For example, when the processor 230 receives a host command regarding a read operation from the host 300, the processor 230, in response thereto, causes the memory interface circuit 250 to issue a read command (memory command) to the 3D stacked semiconductor memory 100. The processor 230 performs a similar operation also when receiving a host command regarding a write operation from the host 300. Moreover, the processor 230 executes various processes for managing the 3D stacked semiconductor memory 100.

The memory interface circuit 250 is connected to the 3D stacked semiconductor memory 100 through the memory bus, and manages communication with the 3D stacked semiconductor memory 100. The memory interface circuit 250 transmits, on the basis of the instruction received from the processor 230, various signals to the 3D stacked semiconductor memory 100, and receives various signals from the 3D stacked semiconductor memory 100.

The buffer memory 240 temporarily stores write data to the 3D stacked semiconductor memory 100 and read data from the 3D stacked semiconductor memory 100.

The built-in memory 220 is a semiconductor memory, such as a Dynamic Random Access Memory (DRAM) or a Static Random Access Memory (SRAM), for example, and is used as a work area for the processor 230. Then, the built-in memory 220 stores firmware for managing the 3D stacked semiconductor memory 100, and various management tables, such as, a shift table, a history table, a flag table, and the like.

The Error Checking and Correcting (ECC) circuit 260 performs error detection and error correction processes regarding data stored in the 3D stacked semiconductor memory 100. More specifically, the ECC circuit 260 generates an error correction code during the write operation of data and assigns the error correction code to the write data, and decodes the error correction code during read operation of data.

(Configuration of 3D Stacked Semiconductor Memory 100)

As illustrated in FIG. 1, the 3D stacked semiconductor memory 100 includes a cell array 110, a row decoder 120, a driver circuit 130, a sense amplifier 140, an address register 150, a command register 160, and a sequencer 170. A peripheral circuit 108 includes the driver circuit 130, the address register 150, the command register 160, and the sequencer 170.

The cell array 110 includes a plurality of blocks BLK including a plurality of nonvolatile memory cells, each associated with a row (word line) and a column (bit line). FIG. 1 illustrates m blocks BLK0 to BLK(m−1), as an example. Each bit line of the blocks BLK0 to BLK(m−1) is commonly connected. Each word line of the block BLK0 to BLK(m−1) is connected to the row decoder 120. Moreover, the cell array 110 stores data provided from the controller 200. A configuration of the cell array 110 will be described below (refer to FIG. 9B).

The row decoder 120 selects any one of the blocks BLK0 to BLK(m−1) in the cell array 110 on the basis of a block address BA in the address register 150, and further selects a word line direction in the selected block BLK. A configuration of the row decoder 120 will be described below (refer to FIG. 9C).

The driver circuit 130 supplies a voltage through the row decoder 120 to the selected block BLK on the basis of a page address PA in the address register 150. The driver circuit 130 includes, for example, a source line driver and the like.

A sense amplifier 140 includes a sense amplifier module provided for each bit line BL, senses data read from the cell array 110 during reading the data, and performs required calculation. Then, the aforementioned data DAT is provided to the controller 200. At the time of writing data, write data DAT received from the controller 200 is transferred to the cell array 110. The address register 150 stores an address ADD received from the controller 200. The address ADD includes a block address BA and a page address PA.

The command register 160 stores a command CMD received from the controller 200.

The sequencer 170 controls the overall operation of the 3D stacked semiconductor memory 100 on the basis of the command CMD stored in the command register 160.

(3D Stacked Semiconductor Memory According to First Embodiment)

Figure 2:
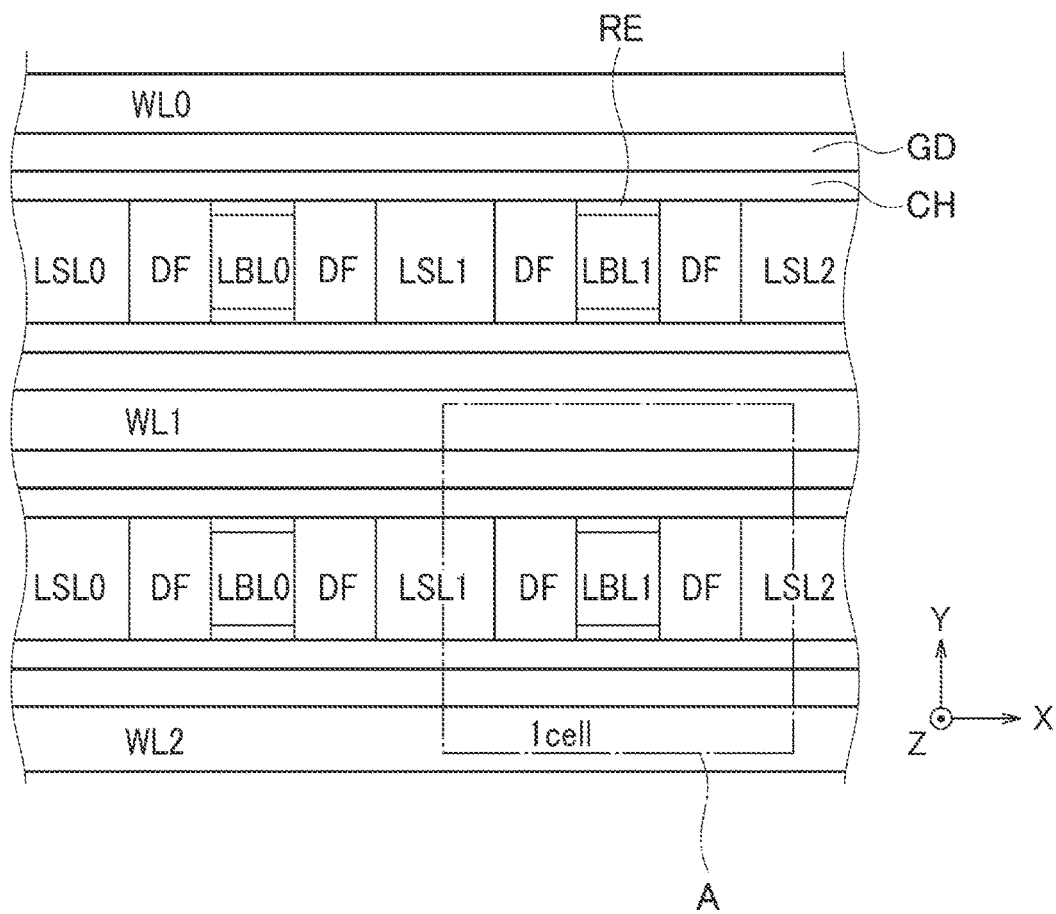
FIG. 2 is a top view diagram illustrating a configuration of a cell array of the 3D stacked semiconductor memory according to the first embodiment.

FIG. 2 is a top view diagram illustrating a configuration of a cell array of the 3D stacked semiconductor memory according to the first embodiment. As illustrated in FIG. 2, the 3D stacked semiconductor memory according to the first embodiment includes:

a plurality of word lines WL0, WL1, and WL2 extended to the X axial direction; and a plurality of local bit lines LBL and a plurality of local source lines LSL which are sandwiched through a gate insulator film GD and a semiconductor film CH between the word lines WL which are adjacent to one another in the Y axial direction. A variable resistance film RE is disposed between the local bit line LBL and the semiconductor film CH. The plurality of local bit lines LBL0, LBL1, and LBL2, and the plurality of local source lines LSL0, LSL1, and LSL2 are alternately disposed with respect to each other in a linear shape sandwiching the insulating layer DF. The plurality of local bit lines LBL0, LBL1, and LBL2, and the plurality of local source lines LSL0, LSL1, and LSL2 are disposed in a pillar shape in the Z axial direction. The plurality of word lines WL0, WL1, and WL2 have a flat plate structure extending in the XY plane, and are stacked in the Z axial direction. A three-dimensional structure of the 3D stacked semiconductor memory according to the first embodiment will be described in detail, in the description of FIG. 11. Moreover, details of each unit will also be described in detail, in description of FIGS. 8B to 8C and FIGS. 12 to 18.

Figure 3:
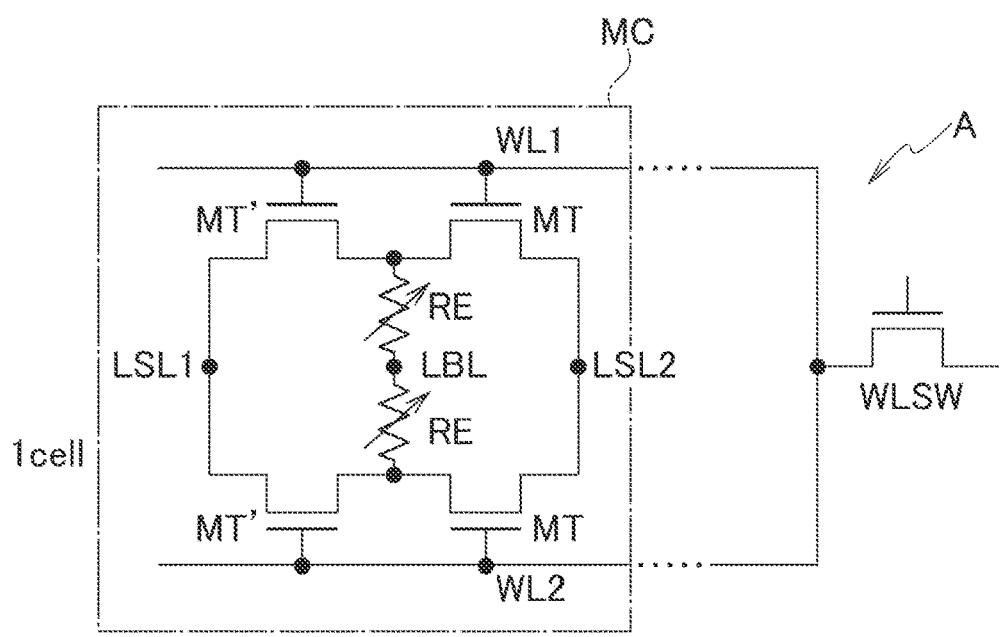
FIG. 3 is an equivalent circuit diagram illustrating one cell of a 3D stacked semiconductor memory according to a comparative example corresponding to the portion A illustrated in FIG. 2.

FIG. 3 is an equivalent circuit diagram illustrating one cell of a 3D stacked semiconductor memory according to a comparative example corresponding to the portion A illustrated in FIG. 2. The 3D stacked semiconductor memory according to the comparative example constitutes one memory cell MC with two variable resistance films RE and four cell transistors (i.e., two MTs and two MT's). The word lines WL1 and WL2 are electrically and commonly connected to each other, and are connected to one word line select transistor WLSW.

Figure 4:
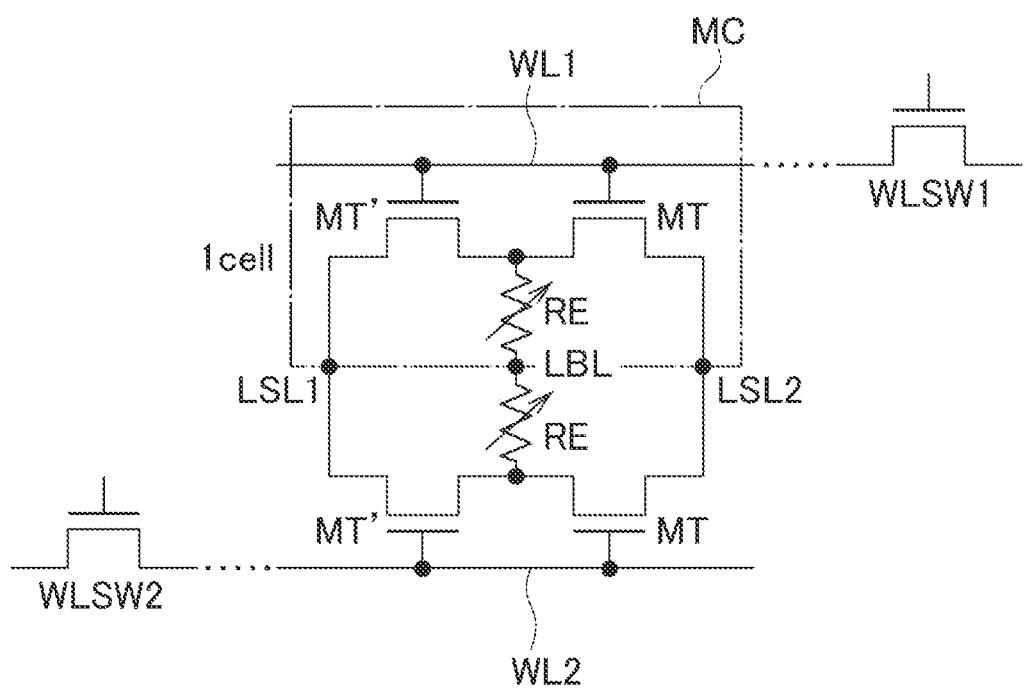
FIG. 4 is an equivalent circuit diagram illustrating one-cell portion of the 3D stacked semiconductor memory according to the first embodiment.

FIG. 4 is an equivalent circuit diagram illustrating one-cell portion of the 3D stacked semiconductor memory according to the first embodiment. The memory cell MC in the 3D stacked semiconductor memory according to the first embodiment constitutes one memory cell MC with one variable resistance film RE and two cell transistors MT and MT'. The word lines WL1 and WL2 are electrically separated from each other, and the word line WL1 is connected to the word line select transistor WLSW1 and the word line WL2 is connected to the word line select transistor WLSW2. The word line select transistor WLSW1 and the word line select transistor WLSW2 are respectively connected to the row decoder 120 and the driver 130, and can be independently controlled.

In the 3D stacked semiconductor memory according to the first embodiment, as illustrated in FIG. 4, the word line WL is a separate electrode every other line. This configuration allows ON voltage to be applied to any one of the word lines WL. More specifically, one cell can be formed with one variable resistance film RE and two cell transistors MT and MT', and thereby the cell density can be doubled compared with that of the comparative example (FIG. 3). It is to be noted that in the structure illustrated FIGS. 1 to 3, the right and left local source lines LSL1 and LSL2 are common local source lines for adjacent cells on the right and left side of the same line. Furthermore, a plurality of local source lines are commonly connected to the wide plate-shaped source line SL common to not only the adjacent cells but also the entire plane (refer to FIG. 11).

An alloy type phase transition element ($Ge_2Sb_2Te_5$) is listed as an example of the resistive switching element RE.

The resistive switching element RE is in a state of low resistivity or high resistivity by a crystalline state is changed. The change in the crystalline state of the resistive switching element RE is called a "phase change", and the case where the resistive switching element RE is in the low resistivity state (LRS) is described as a "set state" and is in the high resistivity state (HRS) is described as a "reset state." For example, when the crystalline state changes to be amorphous, it will be in the high resistivity state. When the crystalline state changes and crystallizes, it will be in the low resistivity state.

Comparative Example

Figure 5:
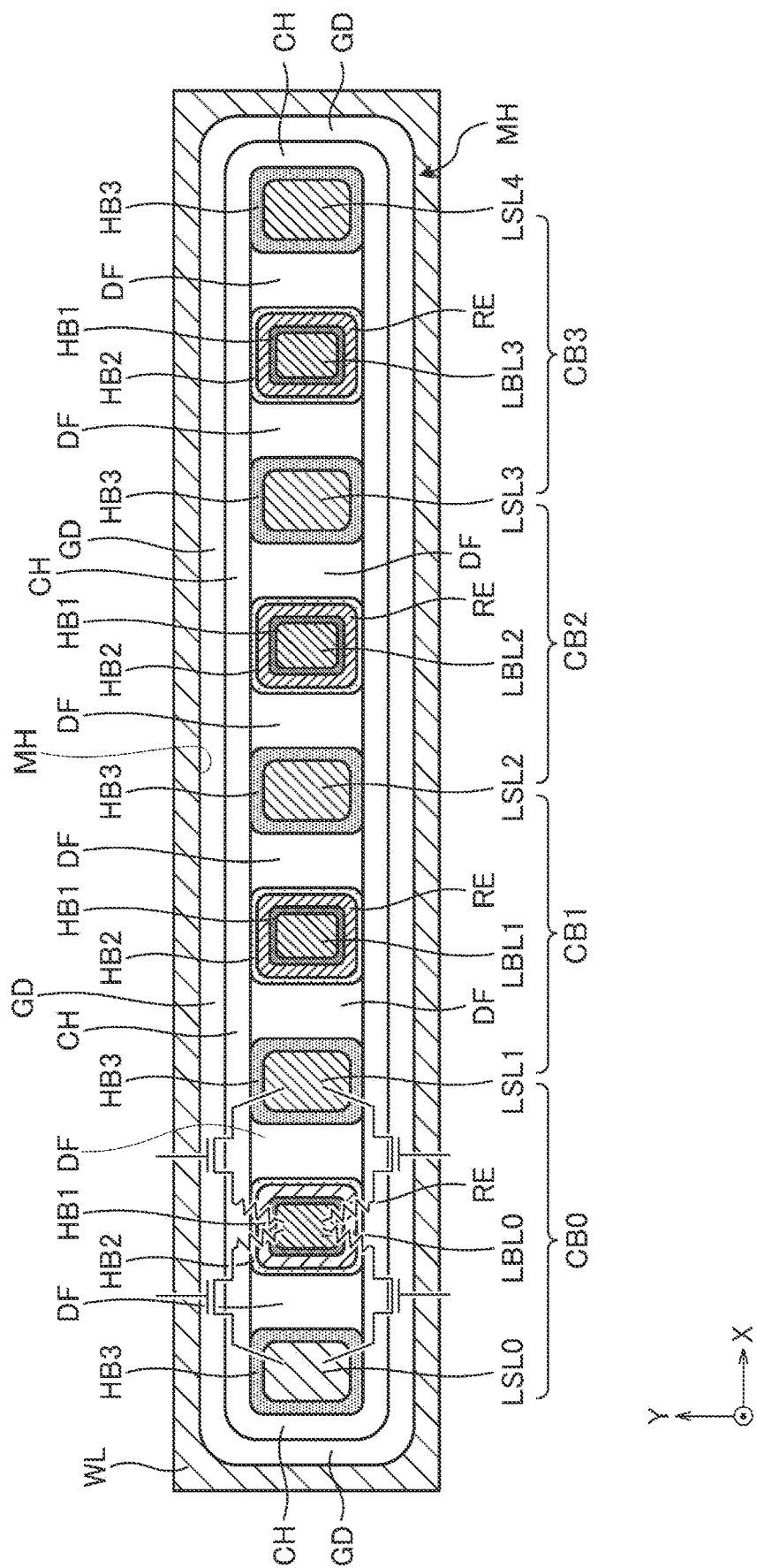
FIG. 5 is a cross-sectional diagram of an XY plane direction illustrating a configuration of cell blocks in the 3D stacked semiconductor memory according to the comparative example.

FIG. 5 is a cross-sectional diagram of an XY plane direction illustrating a configuration of cell blocks CB0 to CB3 in the 3D stacked semiconductor memory according to the comparative example. An equivalent circuit of the one-cell portion of FIG. 5 is similarly illustrated to that of FIG. 3. FIG. 5 illustrates a configuration in which four cell blocks CB0 to CB3 are arranged in one memory hole MH surrounded by the word line WL.

The memory hole MH is formed in a line shape extending in the X axial direction in XY planar view, and is extended in plate shape in the XZ axial direction. The plurality of cell blocks CB0 to CB3 are aligned with one another in the X axial direction. Each cell block CB is formed of a pillar structure. The pillar structure includes a plurality of local source lines LSL0 to LSL3 and a plurality of local bit lines LBL0 to LBL3.

For example, the pillar structure of the cell block CB0 includes the local bit line LBL0, and a plurality of local source lines LSL0 and LSL1. The local source line LSL0 is arranged at the minus X side of the local bit line LBL0, and extends in the Z axial direction to pass through a plurality of word lines WL0 to WL63. The local source line LSL1 is arranged at the plus X side of the local bit line LBL0, and extends in the Z axial direction to pass through a plurality of word lines WL0 to WL63. The pillar structure of the cell block CB3 includes the local bit line LBL3, and a plurality of local source lines LSL3 and LSL4. The local source line LSL3 is arranged at the minus X side of the local bit line LBL3, and extends in the Z axial direction to pass through a plurality of word lines WL0 to WL63. The local source line LSL4 is arranged at the plus X side of the local bit line LBL3, and extends in the Z axial direction to pass through a plurality of word lines WL0 to WL63.

Accordingly, in the memory hole MH, the local source line LSL and the local bit line LBL are alternately and repeatedly arranged along the X axial direction so as to sandwich the insulating layer DF. In FIG. 5, the local source line LSL0, the local bit line LBL0, the local source line LSL1, the local bit line LBL1, the local source line LSL2, the local bit line LBL2, the local source line LSL3, the local bit line LBL3, and the local source line LSL4 are arranged from the minus X side to the plus X side, in the memory hole MH.

The point that the local source line LSL is shared by the plurality of cell blocks CB is the same as that in FIGS. 2 to 4. For example, the local source line LSL1 is shared by the cell block CB0 and the cell block CB1. The local source line LSL3 is shared by the cell block CB2 and the cell block CB3.

Figure 6:
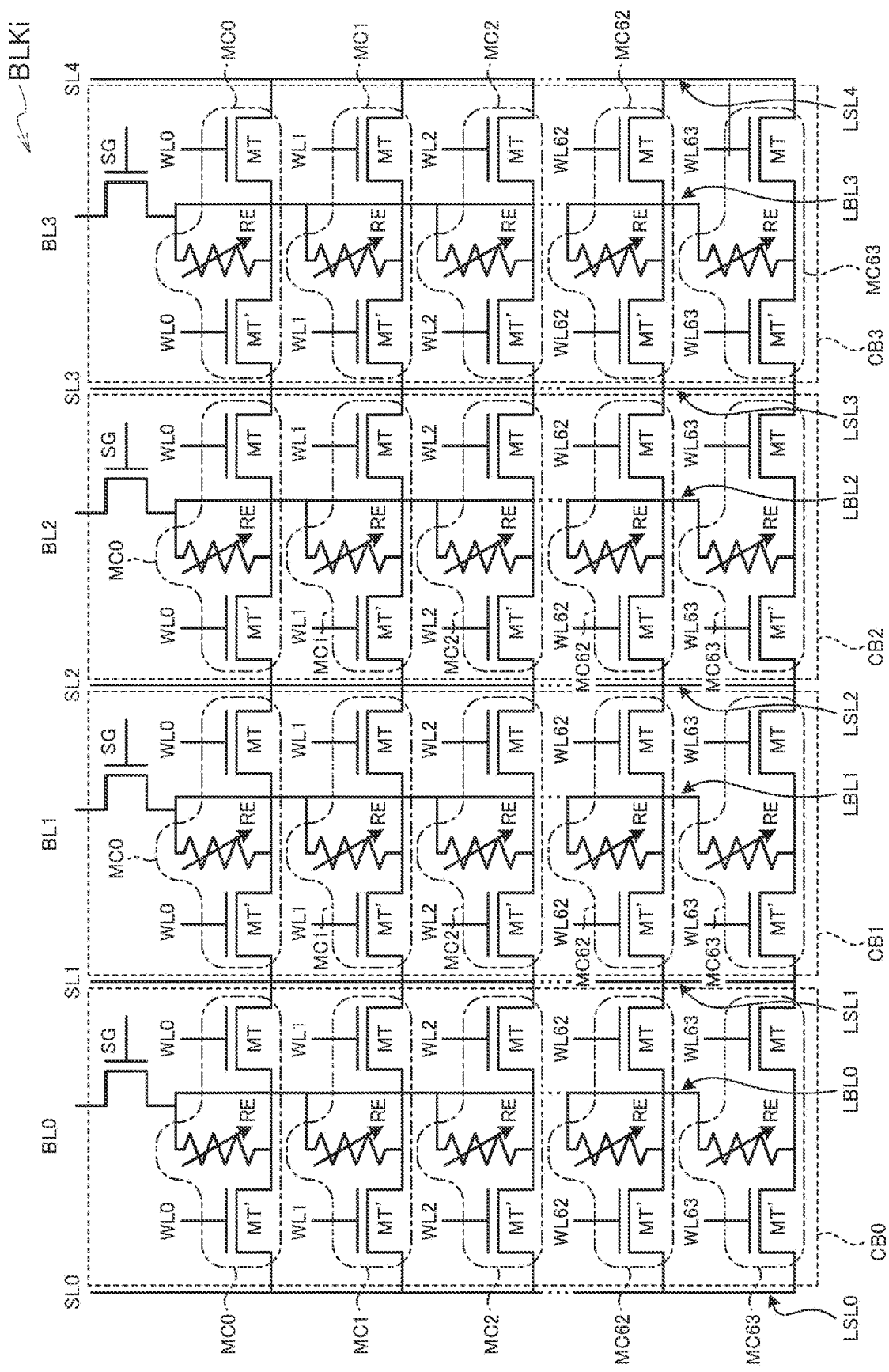
FIG. 6 is a circuit diagram illustrating a configuration of blocks in the 3D stacked semiconductor memory according to the comparative example.

FIG. 6 is an equivalent circuit diagram illustrating a configuration of blocks BLKi in the 3D stacked semiconductor memory according to the comparative example. As illustrated in FIG. 6, the memory cell MC includes two series connection. For example, the memory cell MC0 in the cell block CB0 includes a series connection of the resistive switching element RE and the cell transistor MT' between the local bit line LBL0 and the local source line LSL0, and includes a series connection of the resistive switching element RE and the cell transistor MT between the local bit line LBL0 and the local source line LSL1. Both of a gate of the cell transistor MT' and a gate of the cell transistor MT in the memory cell MC0 are connected to the word line WL0. The memory cell MC1 in the cell block CB1 includes a series connection of the resistive switching element RE and the cell transistor MT' between the local bit line LBL1 and the local source line LSL1, and includes a series connection of the resistive switching element RE and the cell transistor MT between the local bit line LBL1 and the local source line LSL2. Both of a gate of the cell transistor MT' and a gate of the cell transistor MT in the memory cell MC1 are connected to the word line WL1. The memory cell MC63 in the cell block CB3 includes a series connection of the resistive switching element RE and the cell transistor MT' between the local bit line LBL3 and the local source line LSL3, and includes a series connection of the resistive switching element RE and the cell transistor MT between the local bit line LBL3 and the local source line LSL4. Both of a gate of the cell transistor MT' and a gate of the cell transistor MT in the memory cell MC63 are connected to the word line WL63.

The local bit lines LBL0 to LBL3 are connected to bit lines BL0 to BL3 through select gate lines SGD0 to SGD3, as will be described later. The local source lines LSL0 to LSL2 are connected to the source line SL. Moreover, the number of the memory cells MC included in each of the cell block CB may be 8, 32, 48, 64, 96, 128, or the like, and the number of the memory cells is not limited. Moreover, the number of the local source lines and the number of the local bit lines may be 4, 8, 32, 48, 64, 96, 128, or the like, and the number of the memory cells is not limited.

During an access operation to the resistive switching element (variable resistance film) RE, the select gate transistor SG of the selected cell block CB is turned on, and the select gate transistor SG of the non-selected cell block CB is still off. In the selected cell block CB, the cell transistor MT of the selected memory cell MC is turned on, and the cell transistor MT of the non-selected memory cell MC is still off. When a voltage is applied to the bit line BL and the source line SL, a cell current flows through the following path: the bit line BL→the local bit line LBL→the resistive switching element RE of the selected memory cell MC→the cell transistor MT of the selected memory cell MC→the local source line LSL→the source line SL.

In other words, it corresponds to a parallel connection of the channel regions of the plurality of cell transistors MT in the cell block CB, and thereby the current path through the semiconductor film (CH) can be shorten during the access operation to the resistive switching element (variable resistance film) RE. Accordingly, even if the electric current drops due to an effect of grain boundary in the semiconductor film, or the like, the amount of the cell currents can be secured to an extent that the write operation (set/reset operation) and the read operation (detection of set/reset state) of the resistive switching element RE can be performed.

Figure 7:
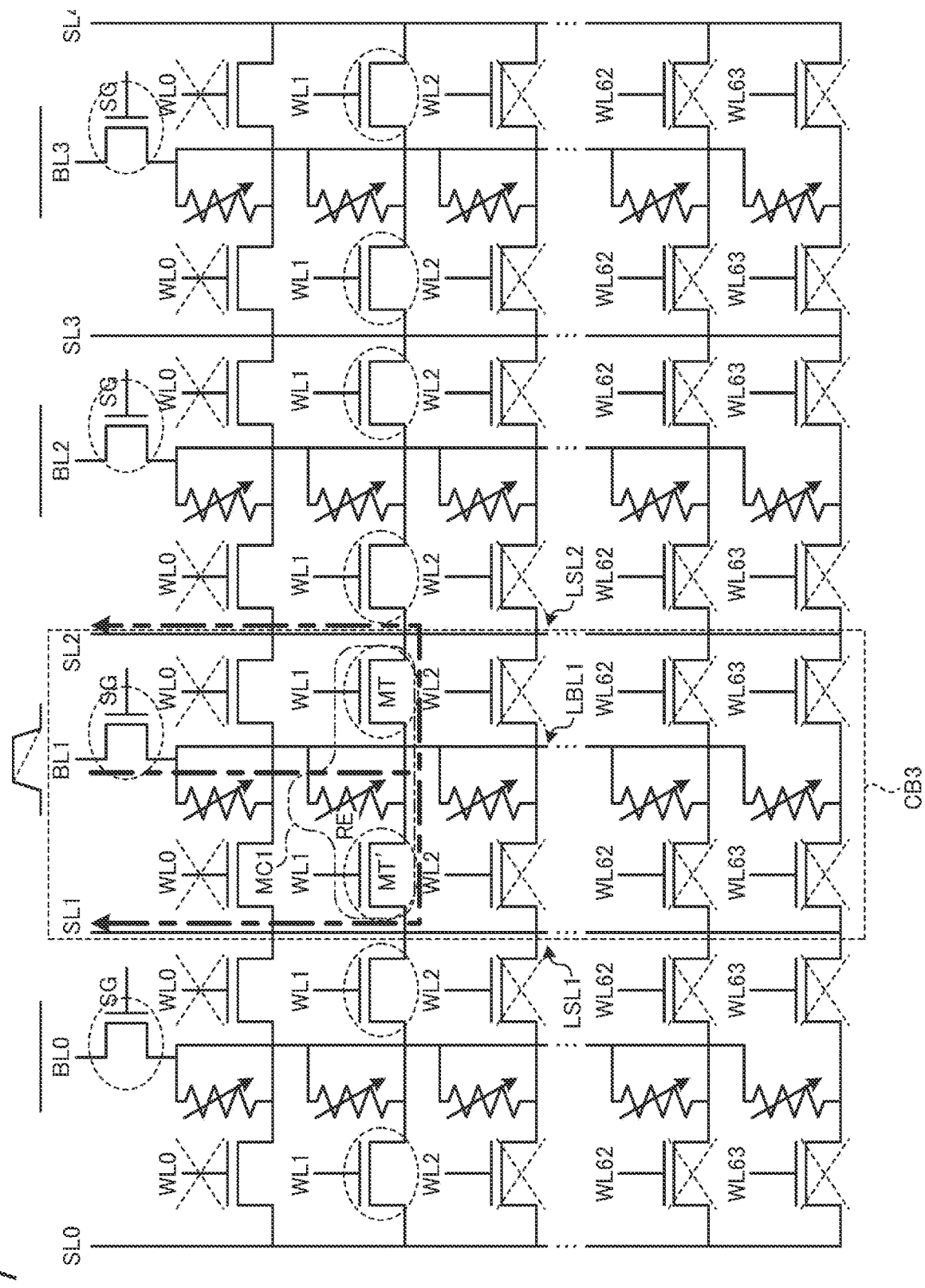
FIG. 7 is a circuit diagram illustrating an operation of the cell block of the 3D stacked semiconductor memory according to the comparative example.

FIG. 7 is a circuit diagram illustrating an operation of a cell block of the 3D stacked semiconductor memory according to the comparative example. In accordance with such a configuration, as illustrated in FIG. 7, an electric current can be flowed from the local bit line LBL1 through the resistive switching element RE, and then through the right and left local source lines LSL1 and LSL2 respectively via semiconductor channels of right and left cell transistors MT and MT'. When the word line WL1 among the plurality of word lines WL0 to WL63 is selectively set to the high level VH3 and the bit line BL1 among the plurality of bit lines BL0 to BL3 is selectively set to the high level VH4, each the cell transistor MT' and the cell transistor MT of the memory cell MC1 is turned on. Consequently, the current path of cell current is parallelized to a first current path: a first current path; the bit line BL1→the local bit line LBL1→the resistive switching element RE→the cell transistor MT'→the local source line LSL1→the source line SL1, and a second current path: the bit line BL1→the local bit line LBL1→the resistive switching element RE→the cell transistor MT→the local source line LSL2→the source line SL2. Accordingly, the current path of the cell current can be reduced in resistance, and the cell current can be easily secured.

Figure 8A:
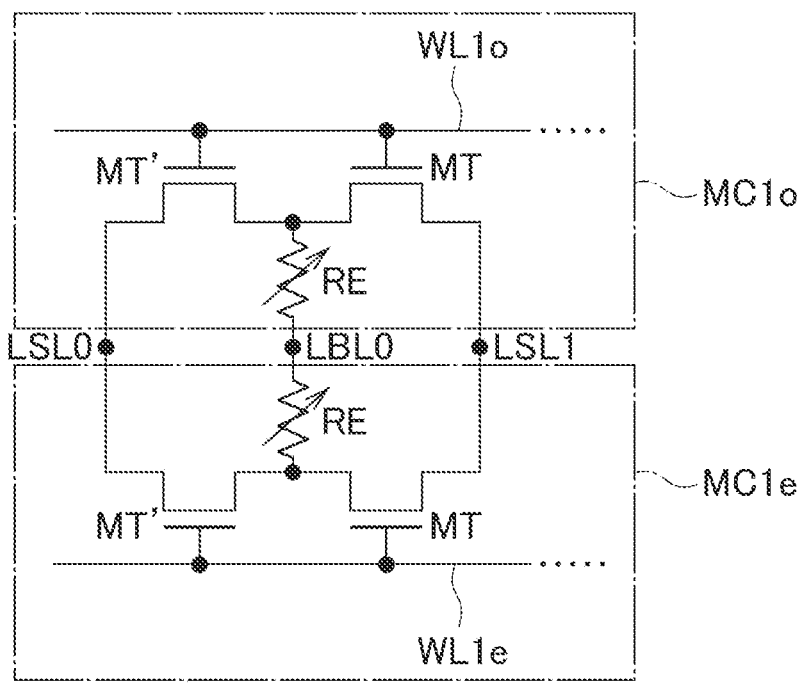
FIG. 8A is an equivalent circuit diagram illustrating two-cell portion of the 3D stacked semiconductor memory according to the first embodiment.

Next, Returning to the 3D stacked semiconductor memory according to the first embodiment to be described. FIG. 8A is an equivalent circuit diagram illustrating two-cell portion of the 3D stacked semiconductor memory according to the first embodiment. In the equivalent circuit illustrated in FIG. 4, each word line WL is a separate electrode, and therefore it does not distinguish between an odd word line $WL1_o$ and an even word line $WL1_e$. In FIG. 8A, memory cell $MC1_o$ and memory cell MC1e are disposed to face each other. The memory cell MC1o includes the cell transistors MT and MT' connected to the odd word line $WL1_o$, and the resistive switching element RE, and the memory cell $MC1_e$ includes the cell transistors MT and MT' connected to the even word line $WL1_e$, and the resistive switching element RE. Similar to the case in FIG. 4, both two local source lines LSL0, and LSL1 and one local bit line LBL0 are used as common lines for the memory cell MC1$_o$ and the memory cell MC1$_e$.

Figure 8B:
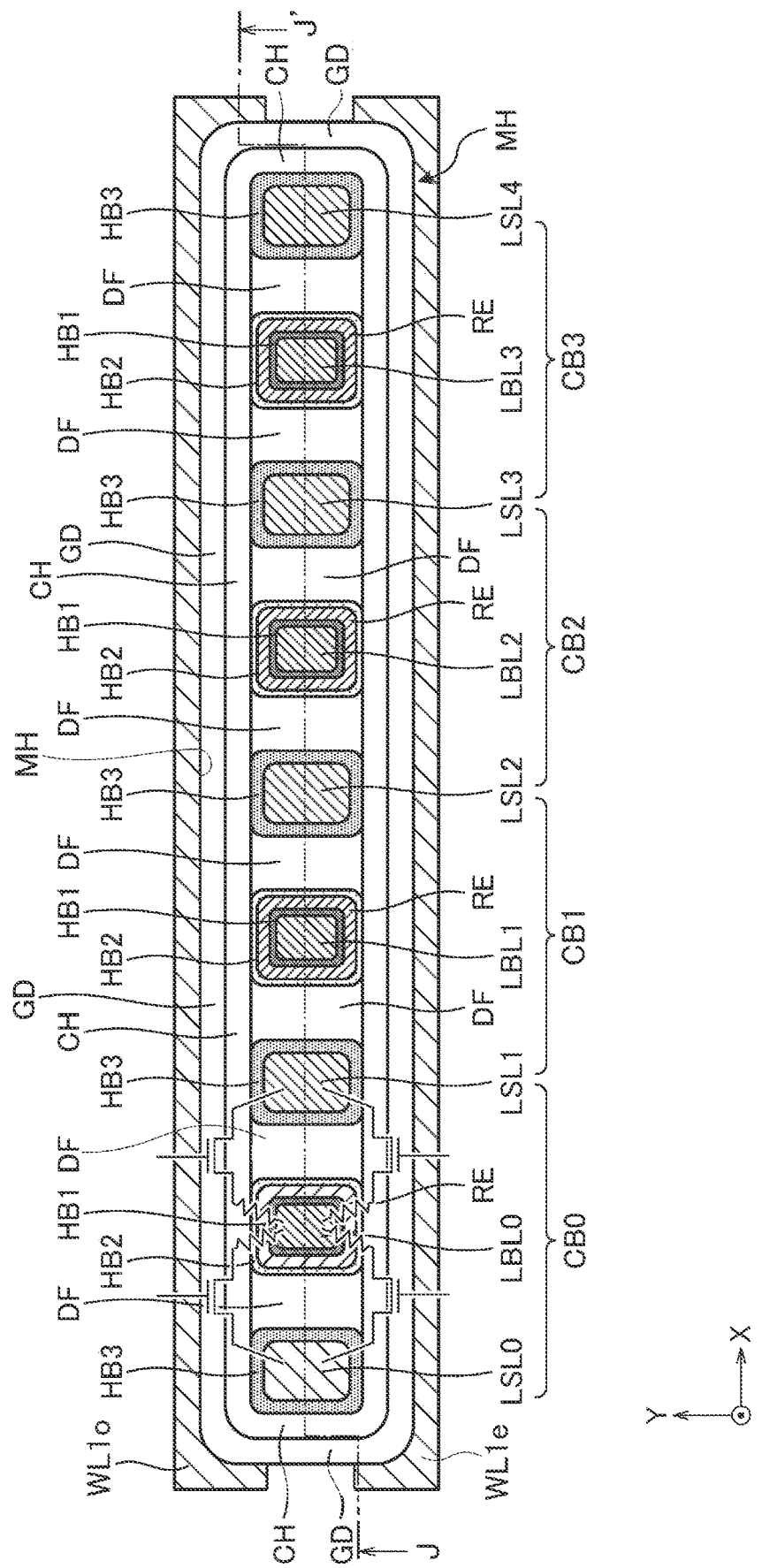
FIG. 8B is a cross-sectional diagram of an XY plane direction illustrating a configuration of a cell block in the 3D stacked semiconductor memory according to the first embodiment.

FIG. 8B is a cross-sectional diagram of an XY plane direction illustrating a configuration of a cell block in the 3D stacked semiconductor memory according to the first embodiment. In the cell block of 3D stacked semiconductor memory according to the first embodiment, as illustrated in FIG. 8B, the word line WL corresponding to that in FIG. 5 (comparative example) is divided into the odd word line WL1$_o$ and the even word line WL1$_e$. The rest of the configuration thereof is the same as that of FIG. 5 (comparative example).

FIG. 8B illustrates a configuration in which four cell blocks CB0 to CB3 are arranged in one memory hole MH so as to be surrounded by the odd word line WL1$_o$ and the even word line WL1$_e$. The number of the cell block CBs arranged in one memory hole MH may be 1 to 3, or may be equal to or more than 5.

Figure 8C:
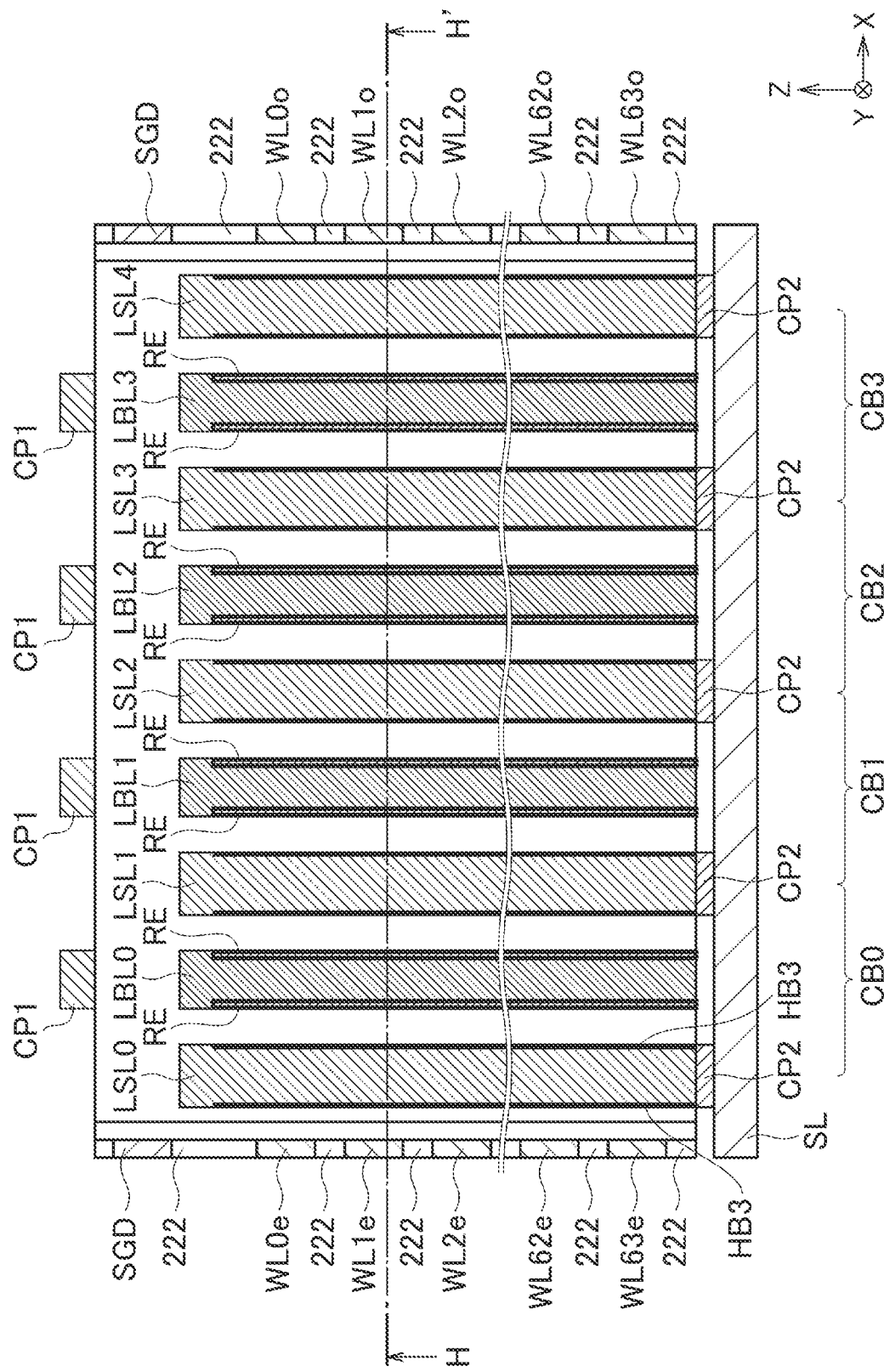
FIG. 8C is a cross-sectional diagram of an XZ plane direction illustrating the configuration of the cell block in the 3D stacked semiconductor memory according to the first embodiment.

The memory hole MH is formed in a line shape extending in the X axial direction in XY planar view, and is extended in plate shape in the XZ axial direction. A set of a plurality of cell blocks CB0 to CB3 is arranged in the memory hole MH. The plurality of cell blocks CB0 to CB3 are aligned with one another in the X axial direction. Each cell block CB is formed of a pillar structure, as illustrated in FIGS. 8B and 8C. The pillar structure includes a plurality of local source lines LSL0 to LSL3 and a plurality of local bit lines LBL0 to LBL3. It is to be noted that the plurality of cell blocks CB0 to CB3 do not necessarily to include such a memory hole MH surrounded by the odd word line WL1$_o$ and the even word line WL1$_e$. As illustrated in FIGS. 11 to 27 described below, the plurality of cell blocks CB0 to CB3 may have a line structure sandwiched by the odd word line WL1$_o$ and the even word line WL1$_e$.

For example, the pillar structure of the cell block CB0 includes the local bit line LBL0, and the plurality of local source lines LSL0 and LSL1. The local source line LSL0 is arranged at the minus X side of the local bit line LBL0, and extends in the Z axial direction to pass through a plurality of word lines WL0 to WL63. The local source line LSL1 is arranged at the plus X side of the local bit line LBL0, and extends in the Z axial direction to pass through a plurality of word lines WL0 to WL63. The pillar structure of the cell block CB3 includes the local bit line LBL3, and a plurality of local source lines LSL3 and LSL4. The local source line LSL3 is arranged at the minus X side of the local bit line LBL3, and extends in the Z axial direction to pass through a plurality of word lines WL0 to WL63. The local source line LSL4 is arranged at the plus X side of the local bit line LBL3, and extends in the Z axial direction to pass through a plurality of word lines WL0 to WL63.

Accordingly, in the memory hole MH, the local source line LSL and the local bit line LBL are alternately and repeatedly arranged along the X axial direction. In FIG. 8B, the local source line LSL0, the local bit line LBL0, the local source line LSL1, the local bit line LBL1, the local source line LSL2, the local bit line LBL2, the local source line LSL3, the local bit line LBL3, and the local source line LSL4 are arranged from the minus X side to the plus X side, in the memory hole MH.

The local source line LSL is shared by a plurality of cell blocks CB. For example, the local source line LSL1 is shared by the cell block CB0 and the cell block CB1. The local source line LSL3 is shared by the cell block CB2 and the cell block CB3.

FIG. 8C is a cross-sectional diagram of an XZ plane direction illustrating the configuration of the cell block in the 3D stacked semiconductor memory according to the first embodiment. FIG. 8C corresponds to a cross-sectional structure taken in the line J-J' of FIG. 8B. FIG. 8B also corresponds to a cross-sectional structure taken in the line H-H' of FIG. 8C. As illustrated in FIG. 8C, odd word lines WL0$_o$ to WL63$_o$ are stacked in the Z axial direction sandwiching the insulation layer 222. Similarly, even word lines WL0$_e$ to WL63$e$ are stacked in the Z axial direction sandwiching the insulation layer 222. A select gate line SGD is disposed on the uppermost insulation layer 222. The local source lines LSL0 to LSL4 are electrically and commonly connected to the plate-shaped source line SL through a contact plug CP2 at the bottom in the Z axial direction. The local bit lines LBL0 to LBL3 are connected to the bit lines BL0 to BL3 which extends in the Y axial direction through a contact plug CP1 at the uppermost portion (i.e., end portion of the local bit line) in the Z axial direction.

As illustrated in FIGS. 8B to 8C, in each cell block CB, a heat barrier film HB1 may be interposed between the variable resistance film RE and the local bit line LBL, and a heat barrier film HB2 may be interposed between the variable resistance film RE and the semiconductor film CH. Furthermore, a heat barrier film HB3 may be interposed between the local source line LSL and the semiconductor film CH.

In this case, both the heat barrier film HB1 and the heat barrier film HB2 have the same thickness, and are formed of, for example, TiN, TaN, TiO$_x$, C, CN, C—W, C—WN, or the like. In addition, a heat generation film HT may be applied thereto instead of the heat barrier film HB1 and the heat barrier film HB2. Moreover, if structurally acceptable, both of the heat barrier films HB1, HB2 and the heat generation film HT may be adopted. For example, the heat generation film HT may be formed between the semiconductor film CH and an outer periphery of the variable resistance film RE.

As materials of the heat barrier film HB1 and HB2, although conductive materials, such as TiN, TaN, TiO$_x$, C, or CN, may be used, for example, the thermal resistance can be further increased by using conductive materials, such as C—W or C—WN, and the heat generation efficiency can be improved also in terms of a suppressing heat leakage to a side of the local bit line LBL.

For example, germanium containing indium as an impurity may be used as the material of the heat generation film HT. Germanium containing indium can be easily increased in resistance by adjusting the concentration and the conductivity type (i.e., p type or n type) of indium as the impurity. For example, it is preferable to set the specific resistance of the heat generation film HT to approximately 0.5 to 4 Ωcm by adjusting the impurity concentration of p type indium to approximately $1 \times 10^{15}$ to $1 \times 10^{16}$ cm$^{-3}$. Moreover, tellurium containing indium as an impurity may be used or a compound of group III-V may be used, as the material of the heat generation film HT.

Since the structure illustrated in FIGS. 8B to 8C has the memory hole MH in a line shape in XY planar view, a margin to lithography can be easily secured and arrangement of the cell block CB with a narrow arrangement pitch in the Y axial direction can be formed. Moreover, since the local bit line LBL and the local source line LSL are formed to be separated from each other in the X axial direction in the memory hole MH extending in a line shape in the X axial direction, a margin for lithography can be easily secured and arrangement of the cell block CB with a narrow arrangement pitch in the X axial direction can be formed.

Figure 9A:
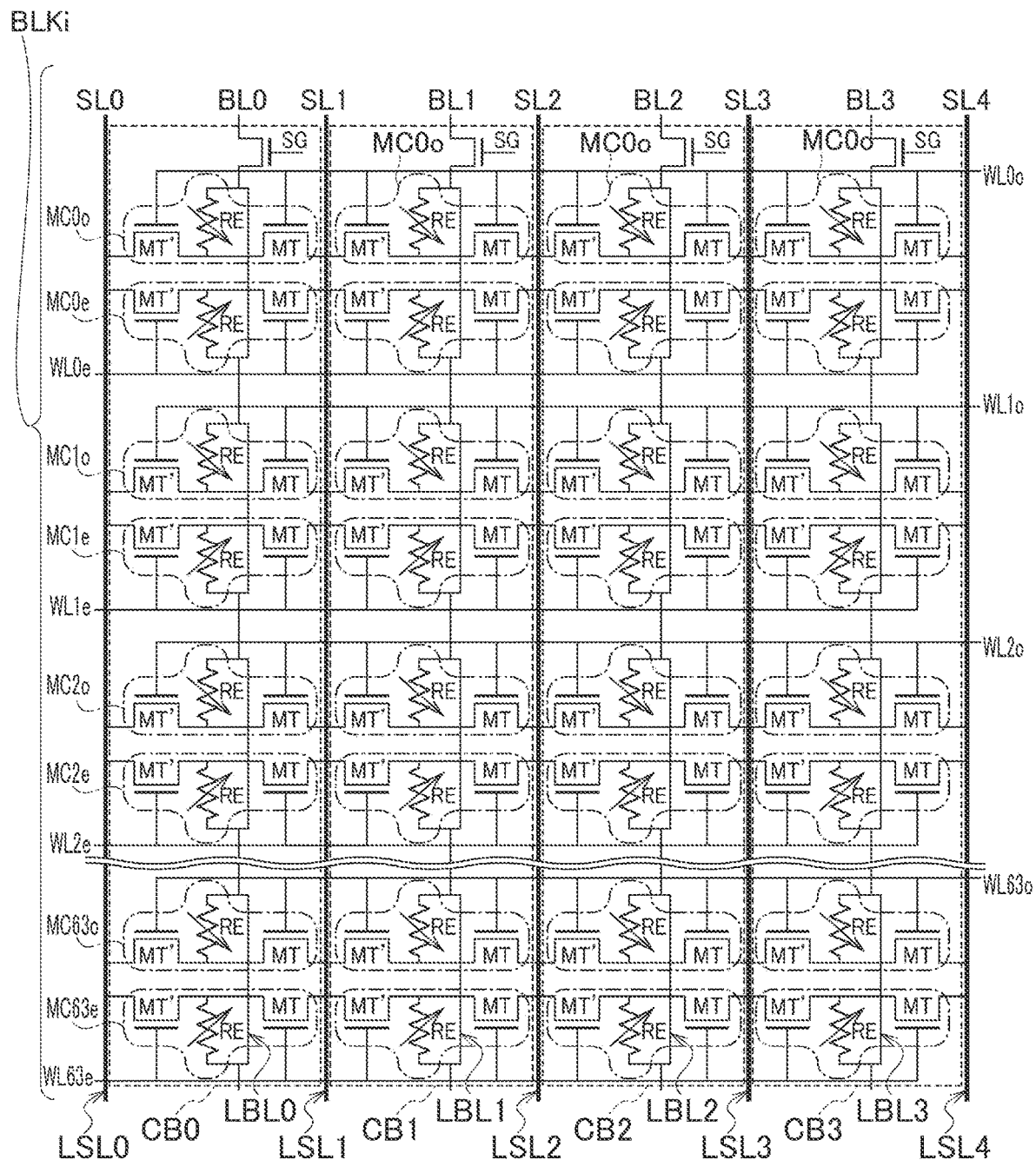
FIG. 9A is a circuit diagram illustrating a configuration of a block in the 3D stacked semiconductor memory according to the first embodiment.

FIG. 9A is an equivalent circuit diagram illustrating a configuration of blocks BLKi in the 3D stacked semiconductor memory according to the first embodiment. The block BLKi (where i=0 to m−1) corresponds to any one of the blocks BLK0 to BLK(m−1) disposed in the cell array 110 illustrated in FIG. 1. FIG. 9A shows an equivalent circuit of a set of a plurality of cell blocks CB0 to CB3. As illustrated in FIG. 9A, the memory cell MC includes two series connection. For example, the memory cell $MC0_0$ in the cell block CB0 includes a series connection of the resistive switching element RE and the cell transistor MT' between the local bit line LBL0 and the local source line LSL0, and includes a series connection of the resistive switching element RE and the cell transistor MT between the local bit line LBL0 and the local source line LSL1. Both of a gate of the cell transistor MT' and a gate of the cell transistor MT in the memory cell $MC0_o$ are connected to the odd word line $WL0_o$. Similarly, the memory cell $MC0_e$ in the cell block CB0 includes a series connection of the resistive switching element RE and the cell transistor MT' between the local bit line LBL0 and the local source line LSL0, and includes a series connection of the resistive switching element RE and the cell transistor MT between the local bit line LBL0 and the local source line LSL1. Both of a gate of the cell transistor MT' and a gate of the cell transistor MT in the memory cell $MC0_e$ are connected to the even word line $WL0_e$.

The memory cell $MC1_o$ in the cell block CB1 includes a series connection of the resistive switching element RE and the cell transistor MT' between the local bit line LBL1 and the local source line LSL1, and includes a series connection of the resistive switching element RE and the cell transistor MT between the local bit line LBL1 and the local source line LSL2. Both of a gate of the cell transistor MT' and a gate of the cell transistor MT in the memory cell $MC1_o$ are connected to the odd word line $WL1_o$. Similarly, the memory cell $MC1_e$ in the cell block CB1 includes a series connection of the resistive switching element RE and the cell transistor MT' between the local bit line LBL1 and the local source line LSL1, and includes a series connection of the resistive switching element RE between the local bit line LBL1 and the local source line LSL2. Both of a gate of the cell transistor MT' and a gate of the cell transistor MT in the memory cell $MC1_e$ are connected to the even word line $WL1_e$.

The memory cell $MC63_o$ in the cell block CB63 includes a series connection of the resistive switching element RE and the cell transistor MT' between the local bit line LBL3 and the local source line LSL3, and includes a series connection of the resistive switching element RE and the cell transistor MT between the local bit line LBL3 and the local source line LSL4. Both of a gate of the cell transistor MT' and a gate of the cell transistor MT in the memory cell $MC63_o$ are connected to the odd word line $WL63_o$. Similarly, the memory cell $MC63_e$ in the cell block CB63 includes a series connection of the resistive switching element RE and the cell transistor MT' between the local bit line LBL3 and the local source line LSL3, and includes a series connection of the resistive switching element RE and the cell transistor MT between the local bit line LBL3 and the local source line LSL4. Both of a gate of the cell transistor MT' and a gate of the cell transistor MT in the memory cell $MC63_e$ are connected to the even word line $WL63_e$.

(Operation of Cell Block in 3D Stacked Semiconductor Memory According to First Embodiment)

An operation of the cell block in the 3D stacked semiconductor memory according to the first embodiment is the same as that in FIG. 7. An electric current can be flowed from the local bit line LBL1 through the resistive switching element RE, and then through the right and left local source lines LSL1 and LSL2 respectively via semiconductor channels of right and left cell transistors MT and MT'. When the word line $WL1_o$ among the plurality of word lines $WL0_0$ to $WL63_o$ is selectively set to the high level VH3 and the bit line BL1 among the plurality of bit lines BL0 to BL3 is selectively set to the high level VH4, each the cell transistor MT' and the cell transistor MT of the memory cell $MC1_o$ is turned on. Consequently, the cell current path is parallelized to a first current path: the bit line BL1→the local bit line LBL1→the resistive switching element RE→the cell transistor MT'→the local source line LSL1→the source line SL1, and second current path: the bit line BL1→the local bit line LBL1→the resistive switching element RE→the cell transistor MT→the local source line LSL2→the source line SL2. Accordingly, the current path of the cell current can be reduced in resistance, and the cell current can be easily secured.

As described above, in the 3D stacked semiconductor memory according to the first embodiment, the pillar structure of each cell block includes a plurality of local source lines LSL, in the cell array 110 of the 3D stacked semiconductor memory 100. Consequently, the current path of the cell current in each cell block can be parallelized, and the resistance of the current path in the cell current can be reduced. Moreover, the memory capacity can be doubled as compared with the comparative example by disposing the even word line and the odd word line.

Figure 9B:
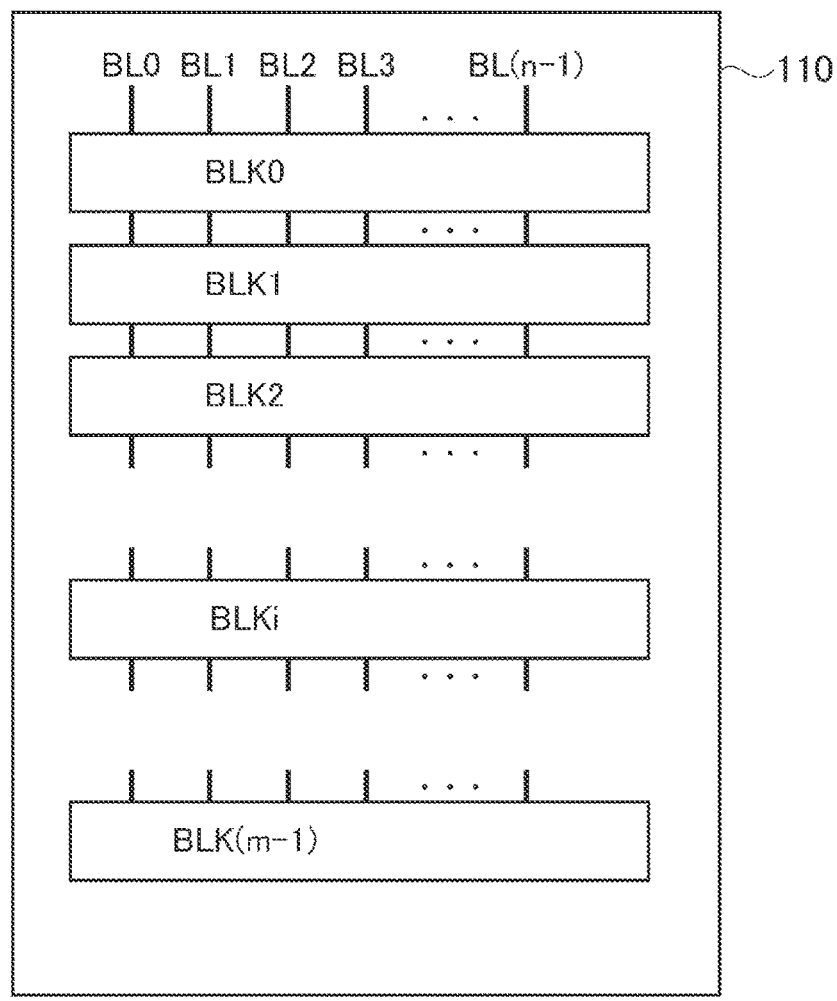
FIG. 9B is a block diagram illustrating a configuration of a cell array in the 3D stacked semiconductor memory according to the first embodiment.

FIG. 9B is a block diagram illustrating a configuration of a cell array 110 in the 3D stacked semiconductor memory according to the first embodiment. As illustrated in FIG. 9B, the 3D stacked semiconductor memory according to the first embodiment includes m blocks BLK0 to BLK(m−1). The m blocks BLK0 to BLK(m−1) include n bit lines BL0 to BL(n−1). Each block includes a circuit configuration similar to that of the block BLKi illustrated in FIG. 9A. Moreover, in the block, a three dimensional (3D) structure of cell blocks CB0 to CB3 as illustrated in FIGS. 8B and 8C is disposed.

Figure 9C:
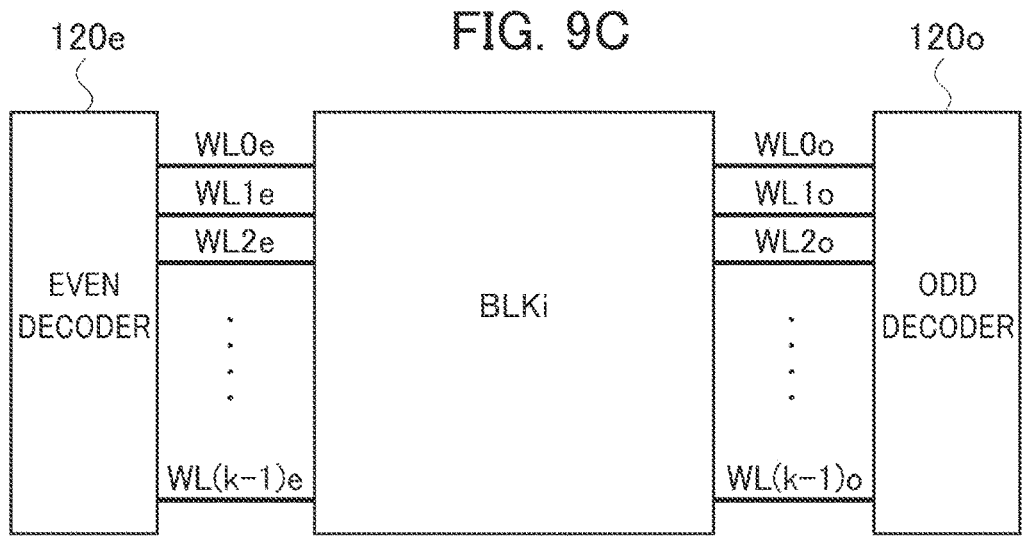
FIG. 9C is a block diagram illustrating a configuration of a block BLKi, and an even decoder and an odd decoder, in the 3D stacked semiconductor memory according to the first embodiment.

FIG. 9C is a block diagram illustrating a configuration of a block BLKi, and an odd decoder 120, and an even decoder $120_e$, in the 3D stacked semiconductor memory according to the first embodiment. For example, the odd decoder $120_o$ and the block BLKi are connected through odd word lines $WL0_o$ to $WL(k−1)_o$. Similarly, the even decoder $120_e$ and the block BLKi are connected through even word lines $WL0_e$ to $WL(k−1)_e$. The odd word lines $WL0_o$ to $WL(k−1)_o$ and the even word lines $WL0_e$ to $WL(k−1)_e$ are connected to each of the blocks BLK0 to BLK(m−1) illustrated in FIG. 9B. A driver is connected to each the even decoder $120_e$ and the odd decoder $120_o$ to can be independently controlled.

(Timing Chart of Operating Waveform of 3D Stacked Semiconductor Memory According to First Embodiment)

Figure 10A:
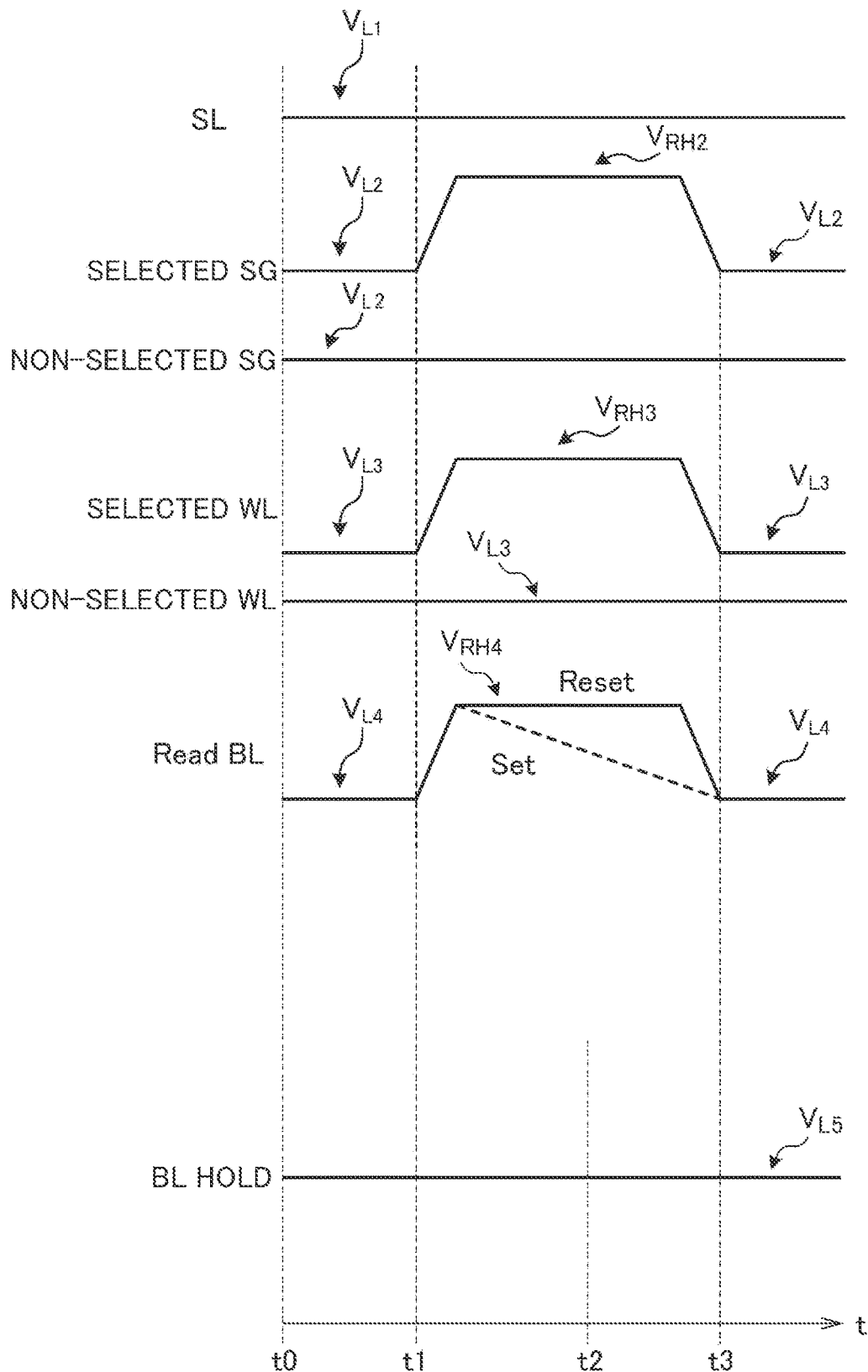
FIG. 10A is a timing chart of an operating waveform during a read operation of the cell block in the 3D stacked semiconductor memory according to the first embodiment.
Figure 10B:
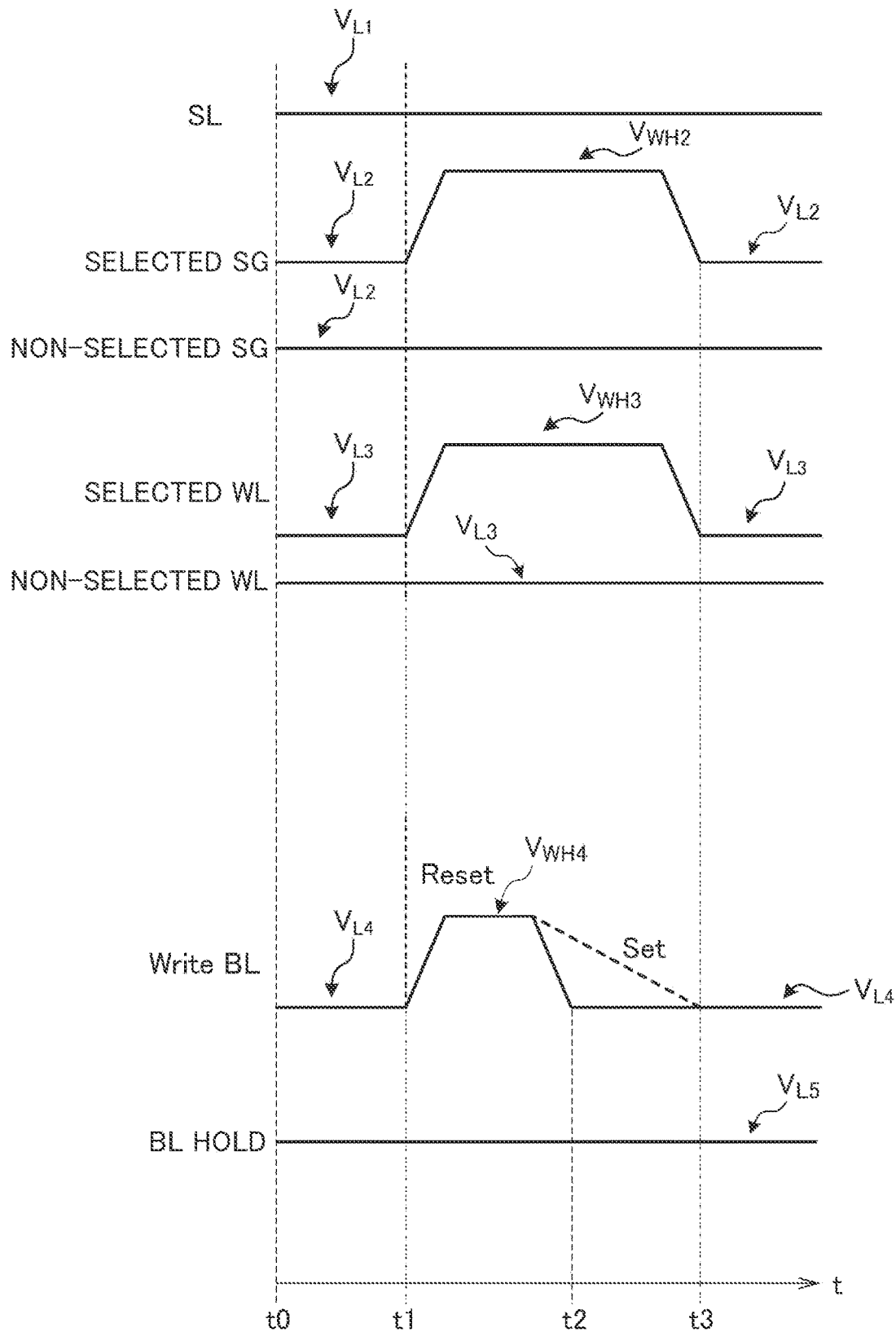
FIG. 10B is a timing chart of an operating waveform during a write operation of the cell block in the 3D stacked semiconductor memory according to the first embodiment.

FIG. 10A is a timing chart of an operating waveform during a read operation of the cell block, and FIG. 10B is a timing chart of an operating waveform during a write operation, in the 3D stacked semiconductor memory according to the first embodiment. Each FIGS. 10A and 10B illustrates an operation example of a memory cell block. When the memory cell MC is non-selected, the cell transistors MT and MT' are turned to the OFF state (i.e., nonconductive state). When the cell transistors MT and MT' are in the OFF states, no inversion layer is formed on the semiconductor film of each cell transistors MT and MT'. Therefore, electric current hardly flows through the semiconductor film, and no electric current flows through the resistive switching element RE. When the memory cell MC is selected, the cell transistors MT and MT' are made to be turned to the ON state (i.e., conductive state). Since the inversion layer is formed on the semiconductor film of each cell transistors MT and MT', the electric current flows through the inversion layer. This electric current flows also into the resistive switching element RE connected in series to the cell transistors MT and MT'.

In FIGS. 10A and 10B, an operation during the standby is performed before the timing t1. The odd decoder $120_o$ and the even decoder $120_e$ maintain the source line SL to the low level $V_{L1}$ (e.g., $V_{L1}$=0 V), maintains the cell block select gate line SGD0 and the cell block non-select gate lines SGD1 to SGD(n-1) are to the low level $V_{L2}$ (e.g., $V_{L2}$=0 V or negative potential), and maintains both of the non-selected word line $WL0_e$, $WL0_o$, $WL1_o$, $WL2_e$, $WL2_o$, ..., $WL63_e$, $WL63_o$ and the selected word line $WL1_e$ are to the low level $V_{L3}$ (e.g., $V_{L3}$=0 V). The low level $V_{L3}$ may be negative potential (e.g., -2 V) in order to improve OFF characteristics of the cell transistors MT and MT'. Since the cell block select gate transistor SG0 is maintained in the OFF state, the bit line BL may be 0V or selected potential.

The read/write operations are started at the timing t1. For example, the even decoder $120_e$ transits a signal of the cell block select gate line SGD0 from the low level $V_{L2}$ to the high level $V_{RH2}$ during the read operation, and transits the signal from the low level $V_{L2}$ to the high level $V_{WH2}$ during the write operation, thereby selecting the cell block CB0. In this case, the signal of the cell block select gate line SGD0 during the write operation is preferred to be set higher than that during the read operation. That is, it is preferred to be $V_{WH2}>V_{RH2}$. This is because the potential of the bit line BL0, which is higher during the write operation than during the read operation, can be transferred.

For example, when the memory cell $MC1_e$ corresponding to the word line $WL1_e$ is selected (refer to FIG. 9A), a signal of the even word line $WL1_e$ is transitioned from the low level $V_{L3}$ to the high level $V_{RH3}$ during the read operation and is transitioned from the low level $VL_3$ to the high level $V_{WH3}$ during the write operation, and signals of rest word lines $WL0_e$, $WL0_o$, $WL1_o$, $WL2_e$, $WL2_o$, ..., $WL63_e$, and $WL63_o$ are maintained to the low level $V_{L3}$. The signal of the even word line $WL1_e$, which is the low level $V_{L3}$, is a non-selected voltage, and which is the high level $V_{RH3}$ during the read operation and is the high level $V_{WH3}$ during the write operation, is a selected voltage. In this case, the signal of the even word line $WL1_e$ during the write operation is preferred to be set higher than that during the read operation. That is, it is preferred to be $V_{WH3}>V_{RH3}$. This is because the potential of the bit line BL0, which is higher during the write operation than during the read operation, can be transferred.

Thus, the memory cell $MC1_e$ corresponding to the cell block select gate line SGD0 and the even word line $WL1_e$ in the cell block CB0 can be accessed. More specifically, the bit line BL0 and the source lines SL0 and SL1 conduct through the resistive switching element RE of the selected memory cell $MC1_e$. While one memory cell $MC1_e$ is in a state to be selected, and the source lines SL0 and SL1 are fixed to the low level $V_{L1}$, when the selected bit line BL0 among the plurality of bit lines BL0 and BL1 is turned to the high level $V_{RH4}$ during the read operation and is turned to the high level $V_{WH4}$ from the low level $V_{L4}$ during the write operation and, the remaining bit line BL1 is fixed to the low level $VL_4$, an electric current flows between the selected bit line BL0 and the source lines SL0 and SL1. The potential of the bit line BL0, which is the high level $V_{PH4}$ during the read operation and the high level $V_{WH4}$ during the write operation, is selected potential, and which is the low level $V_{L4}$, is non-selected potential. In this case, for example, the potential of the selected bit line BL0 is preferred to be different between the high level $V_{RH4}$ during the read operation and the high level $V_{WH4}$ during the write operation. That is, it is preferred to be $V_{WH4}>V_{RH4}$. For example, the value of high level $V_{RH4}$ during the read operation is preferred to be set as low as 1 V or less, and the value of high level $V_{WH4}$ during the write operation is preferred to be set as high as approximately 5V.

At the time of the read operation, at the timing t1, the even decoder $120_e$ turns the selected bit line BL0 from the low level $V_{L4}$ to the high level $V_{RH4}$ and then to be set in a floating state. According to this, if the selected memory cell $MC1_e$ is a high resistivity state (i.e., reset state), the potential of the bit line BL0 does not easily decrease and is maintained in the vicinity of the high level $V_{RH4}$. Thus, the sense amplifier 140 detects that the potential of the bit line BL0 is the high level $V_{RH4}$, and "1" is read from the memory cell $MC1_e$. If the memory cell $MC1_e$ is in the low resistivity state (i.e., set state), the potential of the bit line BL0 drops to the low level $V_{L4}$. Thus, the sense amplifier 140 detects that the potential of the bit line BL0 is the low level $V_{L4}$, and "0" is read from the memory cell $MC1_e$. At this time, the number of transistors through which the cell current in the cell block CB0 passes is two.

At the time of the write operation, at the timing t1, the sense amplifier 140 raises the potential of bit line BL0 to be written from the low level $V_{L4}$ to the high level $V_{WH4}$, and causes the electric current to flow through the selected memory cell $MC1_e$. Also at this time, the number of transistors through which the cell current in the cell block CB0 passes is two.

At the timing t2 later than the timing t1, when the sense amplifier 140 sharply drops the potential of the bit line BL0 from the high level $V_{WH4}$ to the low level $V_{L4}$, the resistive switching element (i.e., phase change element) RE in the selected memory cell $MC1_e$ is rapidly cooled and thereby becomes amorphous (i.e., high resistance). Thus, the memory cell $MC1_e$ becomes in the high resistivity state (reset state), and "1" is written to the memory cell $MC1_e$. When the sense amplifier 140 slowly drops the potential of the bit line BL0 from the high level $V_{WH4}$ to the low level $V_{L4}$, the resistive switching element (i.e., phase change element) RE in the selected memory cell $MC1_e$ becomes slowly cooled and thereby be crystallized (reducing resistance). Thus, the memory cell $MC1_e$ becomes in the low resistivity state (i.e., set state), and "0" is written to the memory cell $MC1_e$.

Each signal can then be returned to its pre-transition level in response to the completion of the read/write operations. For example, the signal of the cell block select gate line SGD0 is returned, to the low level $V_{L2}$, from the high level $V_{RH2}$ during the read operation and the high level $V_{WH2}$ during the write operation. Signals of the non-selected word lines $WL0_e$, $WL0_o$, $WL1_o$, $WL2_e$, $WL2_o$, ..., $WL63_e$, and $WL63_o$ are still maintained to the low level $VL_3$. The signal of the selected word line $WL1_e$ is returned, to the low level $V_{L3}$, from the high level $V_{RH3}$ during the read operation and the high level $V_{WH3}$ during the write operation. When the bit line BL0 is set in the hold state, it is maintained to the hold level $V_LS$.

As described above, in the 3D stacked semiconductor memory 100 according to the first embodiment, the number of transistors through which the cell current in the cell block CB0 passes is two during the read/write operations for the selected memory cell MC. In other words, since the path length of the semiconductor film through which the cell current passes is suppressed during the read/write operations, the cell current can be easily increased, and thereby the set/reset driving operations for the resistive switching element RE is easy.

(Bird's-Eye View Configuration of Cell Array 110 in 3D Stacked Semiconductor Memory According to First Embodiment)

Figure 11:
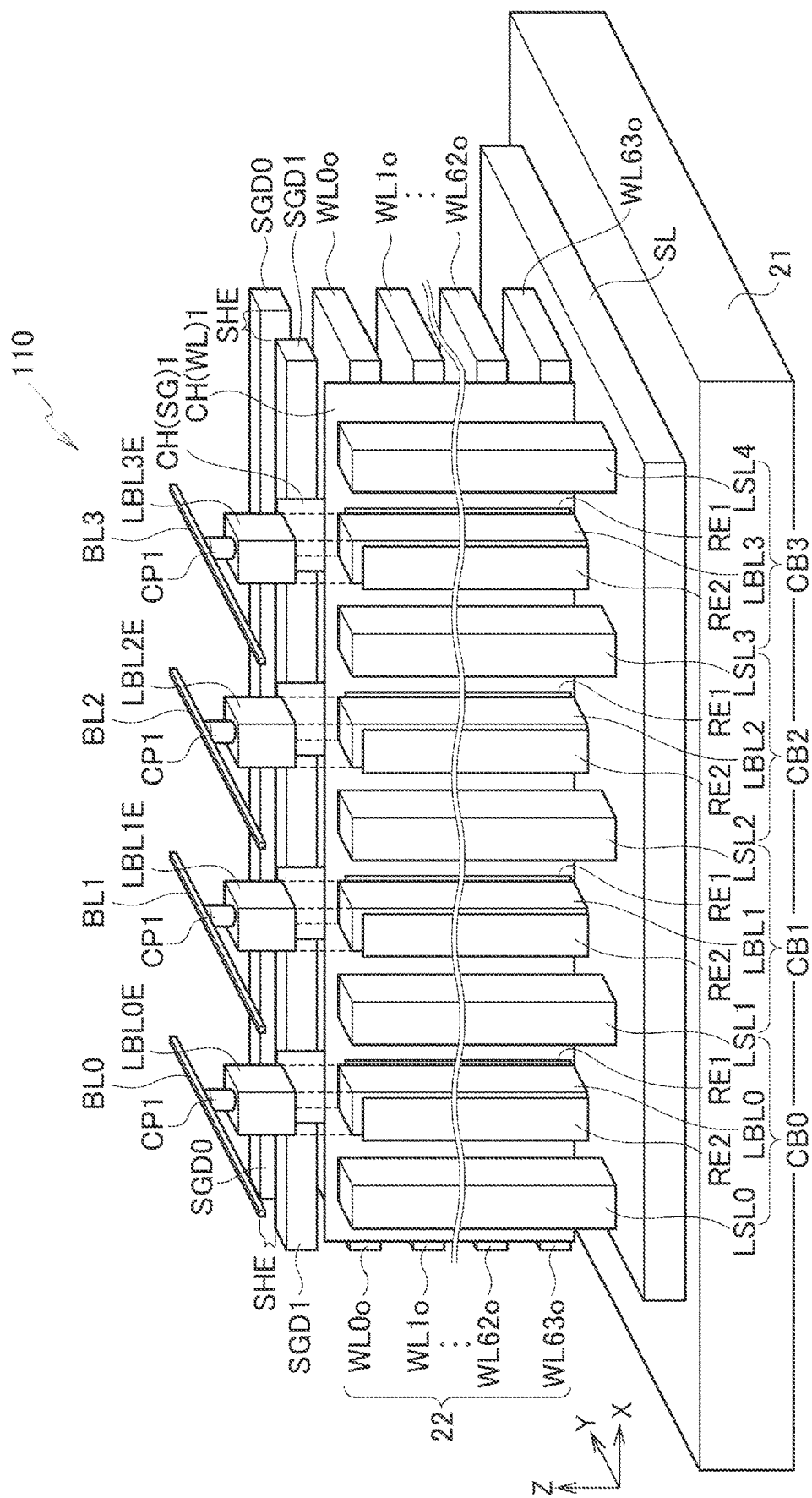
FIG. 11 is a bird's-eye view illustrating a cell array in the 3D stacked semiconductor memory according to the first embodiment.

FIG. 11 is a bird's-eye view illustrating a cell array 110 in the 3D stacked semiconductor memory according to the first embodiment. In FIG. 11, an extended direction of bit lines BL is the Y axial direction, a stacked direction of the memory cells MC is the Z axial direction, and a direction vertical to the Y axial direction and the Z axial direction is the X axial direction. As illustrated in FIG. 11, in the cell array 110 of the 3D stacked semiconductor memory according to the first embodiment, pillar-shaped cell blocks CB0 to CB3 are two-dimensionally arranged in the XY axial direction, at a plus Z axial direction side. The pillar-shaped cell blocks CB0 to CB3 are passed through in the Z axial direction, and is formed as arrangement of three-dimensional memory cells MC. On the semiconductor substrate 21, a source line SL is two-dimensionally disposed in the XY axial direction. It is to be noted that the plurality of cell blocks CB0 to CB3 do not necessarily to include such a memory hole MH surrounded by the odd word line $WL1_o$ and the even word line $WL1_e$. The plurality of cell blocks CB0 to CB3 may have a line structure sandwiched by the odd word line $WL1_o$ and the even word line $WL1_e$. The number of the cell block CBs arranged in the line structure may be 1 to 3, or may be equal to or more than 5.

Each cell block CB0 to CB3 extends in the Z axial direction to pass through the stacked structure 22 in the Z axial direction. The cell block CB is formed of a pillar structure that passes through a plurality of conductive films WL0 to WL63 in the Z axial direction. The plurality of cell blocks CB0 to CB3 are two-dimensionally arranged in the XY axial direction. Each cell block CB includes a semiconductor film CH(WL) and a semiconductor film CH(SG) that extend in the Z axial direction and function as an extension semiconductor channel. The semiconductor film CH(WL) passes through the stacked structure 22 in the Z axial direction and functions as the semiconductor channel. The memory cell MC is constituted at a location where the semiconductor film CH(WL) and the conductive film WL intersect with each other, and the cell block select gate transistor SG is constituted at a location where the semiconductor film CH(SG) and the conductive film SGD intersect with each other. The semiconductor film CH(SG) is a channel of the cell block select gate transistor SG, and turns on and off the connection between the bit line BL and the local bit line LBL.

Figure 12:
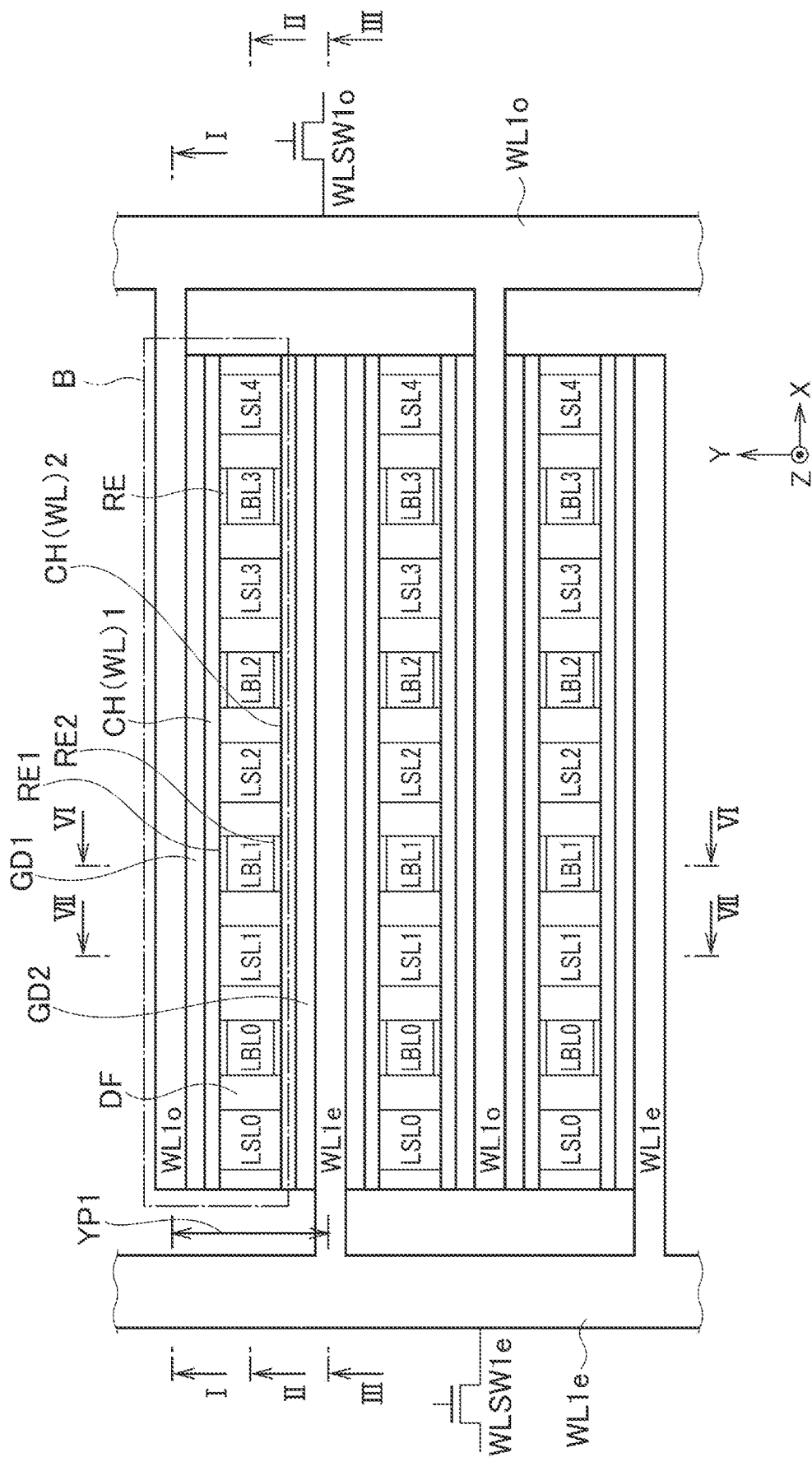
FIG. 12 is a top view diagram illustrating word line level of the 3D stacked semiconductor memory according to the first embodiment.

FIG. 12 is a top view diagram illustrating odd word line $WL1_o$ and even word line $WL1_e$ level of the 3D stacked semiconductor memory according to the first embodiment. The 3D configuration illustrated in FIG. 11 corresponds to the region B surrounded with the dashed line in FIG. 12.

Figure 13:
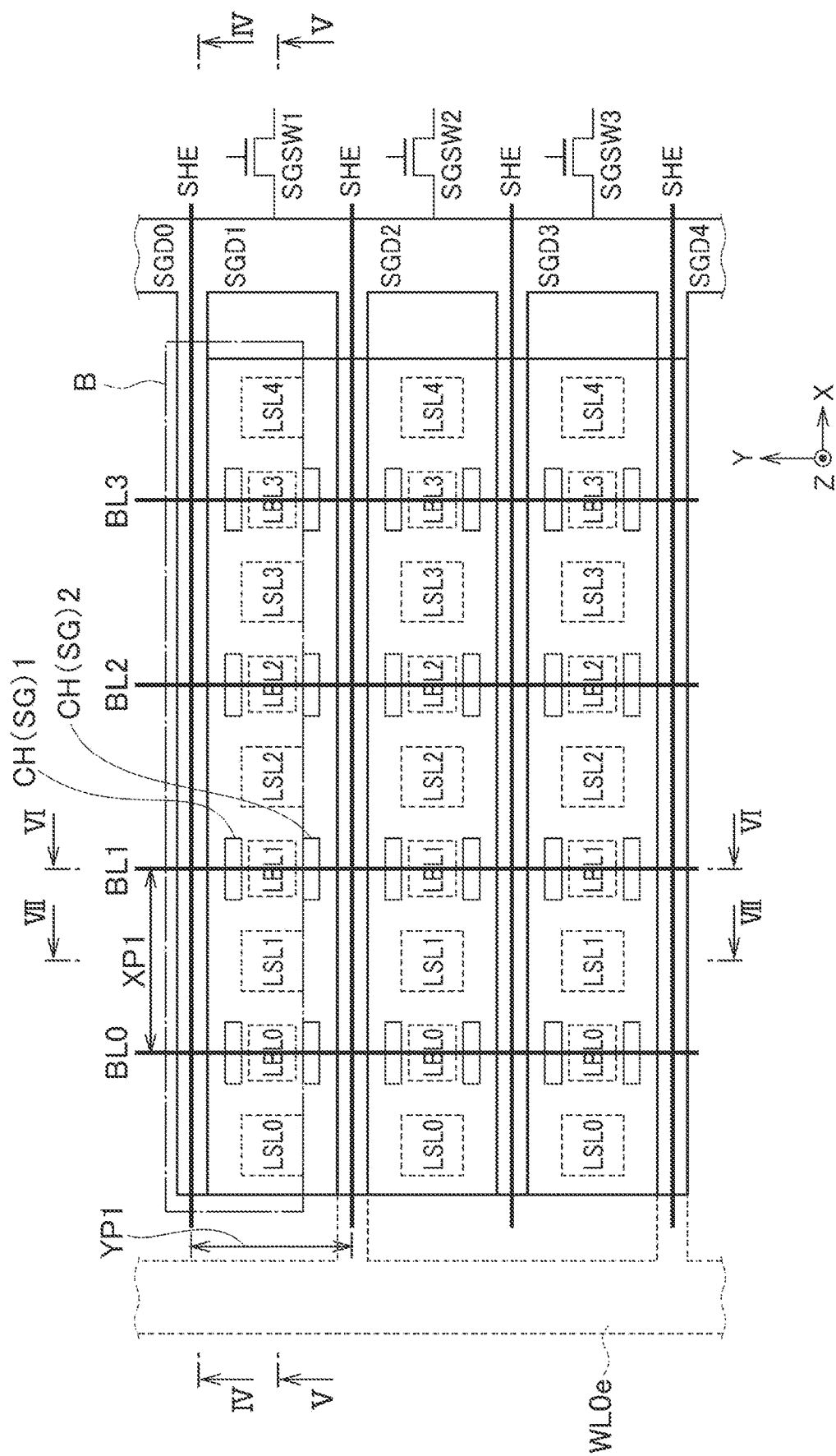
FIG. 13 is a top view diagram illustrating select gate line level of the 3D stacked semiconductor memory according to the first embodiment.

The 3D stacked semiconductor memory according to the first embodiment has the same structure of arrangement of the local bit line LBL and the local source line LSL in the X axial direction in both an even-numbered line and an odd-numbered line, as illustrated in FIGS. 12 and 13. The even-numbered line used herein is an arrangement line of the local bit line LBL and the local source line LSL alternately arranged in the X axial direction in a line shape between the odd word line $WL_o$ and the even word lines $WL_e$ arranged at a minus Y axial direction side with respect to the odd word line $WL_o$. The odd-numbered line used herein is an arrangement line of the local bit line LBL and the local source line LSL alternately arranged in the X axial direction in a line shape between the even word line $WL_e$ and the odd word lines $WL_o$ arranged at a minus Y axial direction side with respect to the even word line $WL_e$. For example, in an example of FIG. 12, the 0th line is an arrangement line of the local source line LSL and the local bit line LBL alternately arranged in the X axial direction in a line shape between the odd word line $WL1_o$ and the even word line $WL1_e$ arranged at the minus Y axial direction side with respect to the odd word line $WL_o$. The first line is an arrangement line of the local source line LSL and the local bit line LBL alternately arranged in the X axial direction in a line shape between the even word line $WL1_e$ and the odd word line $WL1_o$ arranged at the minus Y axial direction side with respect to the even word line $WL_e$. The second line is an arrangement line of the local source line LSL and the local bit line LBL alternately arranged in the X axial direction in a line shape between the odd word line $WL1_o$ and the even word line $WL1_e$ arranged at the minus Y axial direction side with respect to the odd word line $WL_o$. In each line, the same structure where LSL0, LBL0, LSL1, LBL1, LSL2, LBL2, LSL3, LBL3, and LSL4 sequentially is arranged.

As illustrated in FIG. 12, the 3D stacked semiconductor memory according to the first embodiment includes: a plurality of odd word lines $WL1_o$ and a plurality of even word lines $WL1_e$ which extend in the X axial direction; and a plurality of local bit lines LBL0 to LBL3 and a plurality of local source lines LSL0 to LSL4 sandwiched through the gate insulator film GD and the semiconductor film CH(WL) between the odd word line $WL1_o$ and the even word line $WL1_e$ adjacent to each other in the Y axial direction. A variable resistance film RE is disposed between each local bit line LBL0 to LBL3 and the semiconductor film CH(WL). The plurality of local bit lines LBL0 to LBL3 and the plurality of local source lines LSL0 to LSL4 are alternately disposed with respect to one another in a linear shape sandwiching the insulating layer DF. The plurality of local bit lines LBL0 to LBL3 and the plurality of local source lines LSL0 to LSL4 are disposed in a pillar shape in the Z axial direction. The plurality of odd word lines $WL1_o$ and the plurality of even word lines $WL1_e$ have a flat plate structure extending in the XY plane, and are stacked in the Z axial direction. The plurality of odd word lines $WL1_o$ are commonly connected at an end portion in the plus X axial direction. The plurality of even word line $WL1_e$ are commonly connected at an end portion in the minus X axial direction. The odd word line $WL1_o$ is connected to an odd word line select transistor $WLSW1_o$ and the even word line $WL1_e$ is connected to an even word line select transistor $WLSW1_e$, and can be respectively controlled independently. A structure of each unit may be formed in the same way as in FIG. 8B. For example, the variable resistance film RE may be disposed around each local bit line LBL0 to LBL3. The heat barrier film HB1 may be interposed between the variable resistance film RE and the local bit line LBL, and the heat barrier film HB2 may be interposed between the variable resistance film RE and the semiconductor film CH. Furthermore, a heat barrier film HB3 may be interposed between the local source line LSL and the semiconductor film CH. A heat generation film HT may be applied thereto instead of the heat barrier film HB1 and the heat barrier film HB2. Moreover, both of the heat barrier films HB1 and HB2 and the heat generation film HT may be adopted. The heat generation film HT may be formed between the semiconductor film CH and an outer periphery of the variable resistance film RE.

As illustrated in FIGS. 11 and 12, the 3D stacked semiconductor memory according to the first embodiment includes a semiconductor substrate 21, a first electrode line (LSL1), a second electrode line (LBL1), a first variable resistance film RE1, a first semiconductor film CH(WL)1, a first gate insulator film GD1, a first potential applying electrode ($WL1_o$), a second variable resistance film RE2, a second gate insulator film GD2, and a second potential applying electrode ($WL1_e$).

The first electrode line (LSL1) extends in the Z axial direction orthogonal to the semiconductor substrate 21. The second electrode line (LBL1) is disposed so as to be adjacent to the first electrode line in the X axial direction orthogonal to the Z axial direction, and extends in the Z axial direction. The first variable resistance film RE1 extends in the Z axial direction, and is in contact with the second electrode line (LBL1). The first semiconductor film CH(WL)1 is in contact with the first variable resistance film RE1 and the first electrode line (LSL1). The first gate insulator film GD1 extends in the Z axial direction, and is in contact with the first semiconductor film CH(WL)1. The first potential applying electrode ($WL1_o$) extends in the X axial direction, and is in contact with the first gate insulator film GD1. The second variable resistance film RE2 extends in the Z axial direction, and is disposed in the minus Y axial direction (−Y axial direction) with respect to the first variable resistance film RE1, and is in contact with the second electrode line (LBL1). The second semiconductor film CH(WL)2 is in contact with the second variable resistance film RE2 and the first electrode line (LSL1). The second gate insulator film GD2 extends in the X axial direction, and is in contact with the second semiconductor film CH(WL)2. The second potential applying electrode ($WL1_e$) extends in the X axial direction, and is in contact with the second gate insulator film GD2. In this case, the first potential applying electrode ($WL1_o$) and the second potential applying electrode ($WL1_e$) are electrically different nodes, and can be controlled independently.

In a case of a write operation for the first memory cell $MC1_e$ disposed at a location where the second semiconductor film CH(WL)2 and the second potential applying electrode ($WL1_e$) intersect with each other, a selected voltage ($V_{WH3}$) is applied to the second potential applying electrode ($WL1_e$), and a non-selected voltage ($V_{L3}$) lower than the selected voltage ($V_{WH3}$) is applied to the first potential applying electrode ($WL1_o$). In this case, $V_{L3}<V_{WH3}$ is satisfied. A value of the $V_{L3}$ is a low level voltage $V_{SS}$ or 0 V.

(Separating Film SHE)

FIG. 13 is a top view diagram illustrating select gate lines SGD0 to SGD4 level in the 3D stacked semiconductor memory according to the first embodiment. The 3D configuration illustrated in FIG. 11 corresponds to the region B surrounded with the dashed line in FIG. 13. As illustrated in FIG. 13, the 3D stacked semiconductor memory according to the first embodiment includes a plurality of select gate lines SGD0 to SGD4 extending to the X axial direction. A separating film SHE is disposed between the select gate line SGD0 and the select gate line SGD1 is electrically insulated therefrom. A separating film SHE is disposed also between the select gate line SGD1 and the select gate line SGD2. A separating film SHE is disposed also between the select gate line SGD2 and the select gate line SGD3. A separating film SHE is disposed also between the select gate line SGD3 and the select gate line SGD4. The select gate lines SGD1 to SGD3 are respectively connected to the select gate line select transistors SGSW1 to SGSW3, and can be controlled independently. The reason for separating the select gate lines SGD0 to SGD4 with the separating film SHE is that two local bit lines LBL are connected to one bit line BL if the select gate lines SGD0 to SGD4 are not separated with the separating film SHE. By separating the select gate lines SGD0-SGD4 with the separating film SHE, the bit lines BL0 to BL3 can be connected respectively to the local bit lines LBL0 to LBL3.

As illustrated in FIG. 13, in the 3D stacked semiconductor memory according to the first embodiment, an arrangement pitch of the bit line BL is expressed by XP1. An arrangement pitch of the word line WL is expressed by YP1. In the 3D stacked semiconductor memory according to the first embodiment, as illustrated in FIG. 13, the arrangement pitch XP1 of the bit line BL is equal to the distance between two local bit lines LBL. Accordingly, the bit line BL can be formed widely and thickly, and thereby the wiring sheet resistance of the bit line BL can be reduced.

As illustrated in FIG. 13, the 3D stacked semiconductor memory according to the first embodiment includes third potential applying electrodes (SGD1, SGD0) that are disposed on the first potential applying electrode ($WL1_o$) in the Z axial direction and extends in the X axial direction. As illustrated in FIG. 13, the 3D stacked semiconductor memory according to the first embodiment includes a separating film SHE that extends in the X axial direction and in contact with the third potential applying electrodes (SGD1, SGD0), and the third potential applying electrodes (SGD1, SGD0) are separated from each other in the Y axial direction through a separating film SHE.

Figure 14:
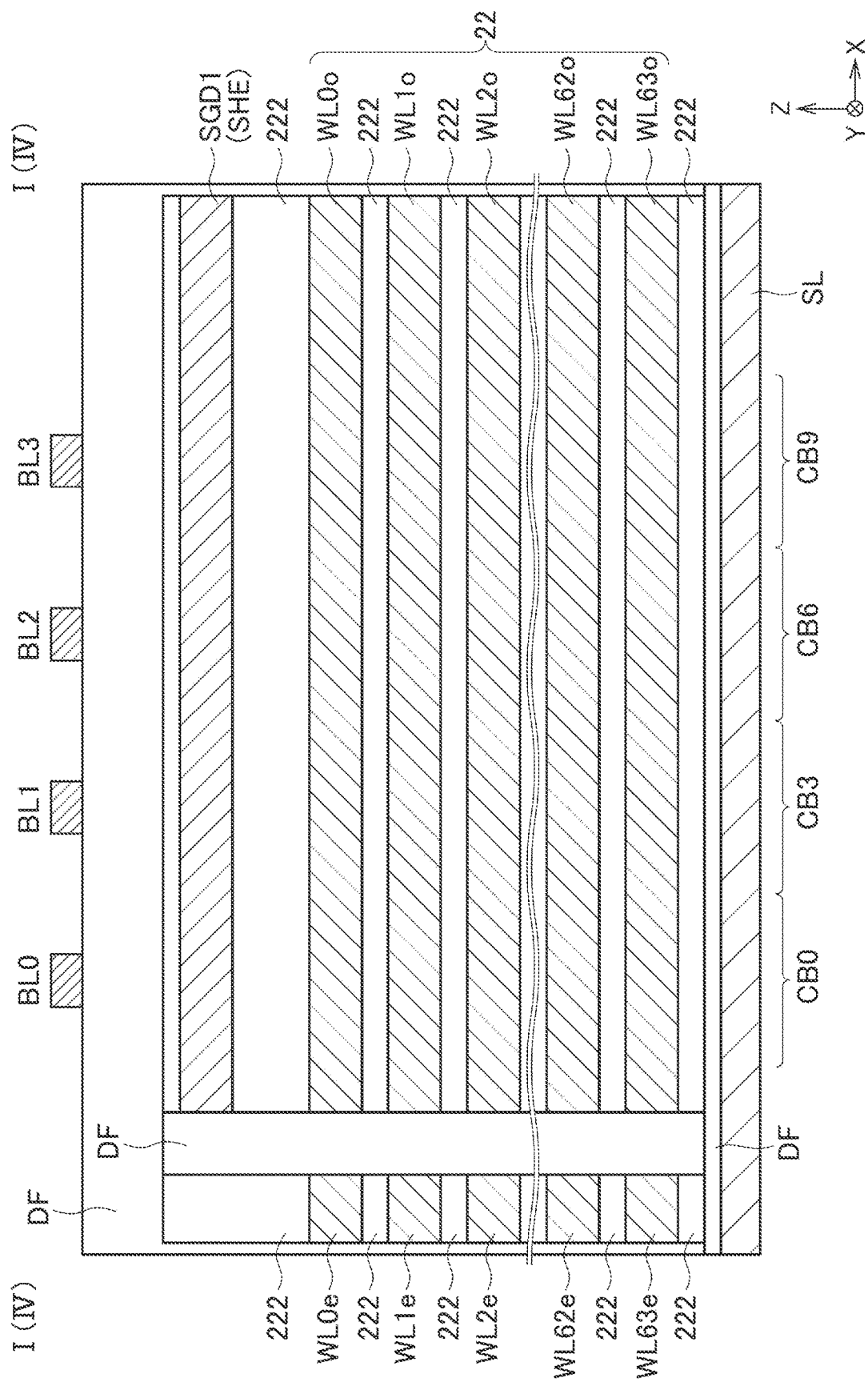
FIG. 14 is a cross-sectional diagram taken in the line I-I of FIG. 12 and the line IV-IV of FIG. 13.

FIG. 14 is a cross-sectional diagram taken in the line I-I of FIG. 12 and the line IV-IV of FIG. 13. Select gate lines SGD0 and SGD1 are stacked on the uppermost insulation layer 222 of the stacked structure 22. The select gate line SGD0 and SGD1 respectively select the cell blocks CB0 to CB3. The select gate line SGD0 and SGD1 are respectively composed of plate-shaped conductive films extending in the XY axial direction. In the following, the select gate lines SGD0 and SGD1 may be respectively referred to as conductive films SGD0 and SGD1. The conductive films SGD0 and SGD1 are formed with a material that is formed of a conductive material (e.g., a metal such as tungsten) as a principal component. The conductive films SGD0 and SGD1 are separated in the Y axial direction with the separating film SHE (refer to FIGS. 11 and 13). The separating film SHE is provided above the conductive films $WL0_o$ and $WL0_e$ (i.e., plus Z axial direction side), extends in the XZ axial direction, and reaches the uppermost insulation layer 222 in the stacked structure 22. The separating film SHE is formed with an insulating material (e.g., silicon oxide). Consequently, the cell block select gate lines SGD are electrically insulated from each other.

In the stacked structure 22, the word line WL0 to WL63 and the insulation layer 222 (refer to FIG. 14) are repeatedly stacked with one another in the Z axial direction. The word lines WL0 to WL63 are respectively composed of plate-shaped conductive films extending in the XY axial direction. In the following, the word lines WL0 to WL63 may be referred to as a conductive film WL. Moreover, the word lines WL0 to WL63 are separated into odd word lines WL0$_o$ to WL63$_o$ and even word lines WL0$_e$ to WL63$_e$. In the stacked structure 22, the plurality of conductive films WL0 to WL63 are disposed to be separated from one another in the Z axial direction. Each conductive film WL0 to WL63 is formed with a material that is formed of a conductive material (e.g., a metal such as tungsten) as a principal component. Each insulation layer 222 is formed with an insulating material (e.g., silicon oxide) as a principal component.

Figure 15:
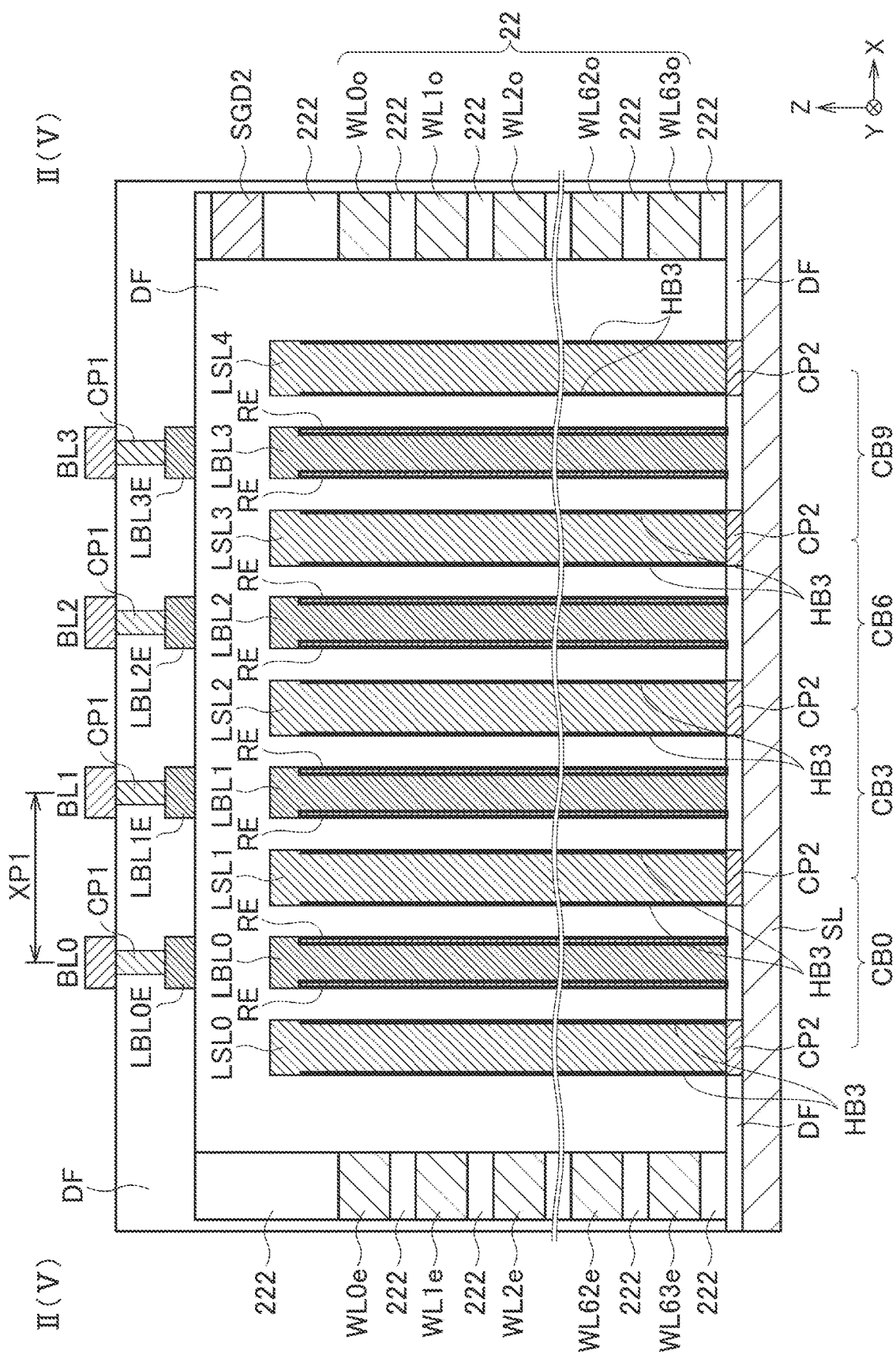
FIG. 15 is a cross-sectional diagram taken in the line II-II of FIG. 12 and the line V-V of FIG. 13.

FIG. 15 is a cross-sectional diagram taken in the line II-II of FIG. 12 and the line V-V of FIG. 13. As illustrated in FIG. 15, the local source lines LSL0 to LSL4 and the local bit lines LBL0 to LBL3 are arranged in the X axial direction. The local source lines LSL0 to LSL4 are connected to the source line SL through the contact plug CP2 in the minus Z axial direction. The local bit lines LBL0 to LBL3 are respectively connected to end portions LBL0E to LBL3E of the local bit lines in the plus Z axial direction. Connections between the local bit lines LBL0 to LBL3 and the end portions LBL0E to LBL3E of local bit line are respectively turned on and off by the select gate transistors SG0 to SG3 including the semiconductor film CH(SG). The end portions LBL0E to LBL3E of local bit line are respectively connected to the bit lines BL0 to BL3 through the contact plugs CP1.

Figure 16:
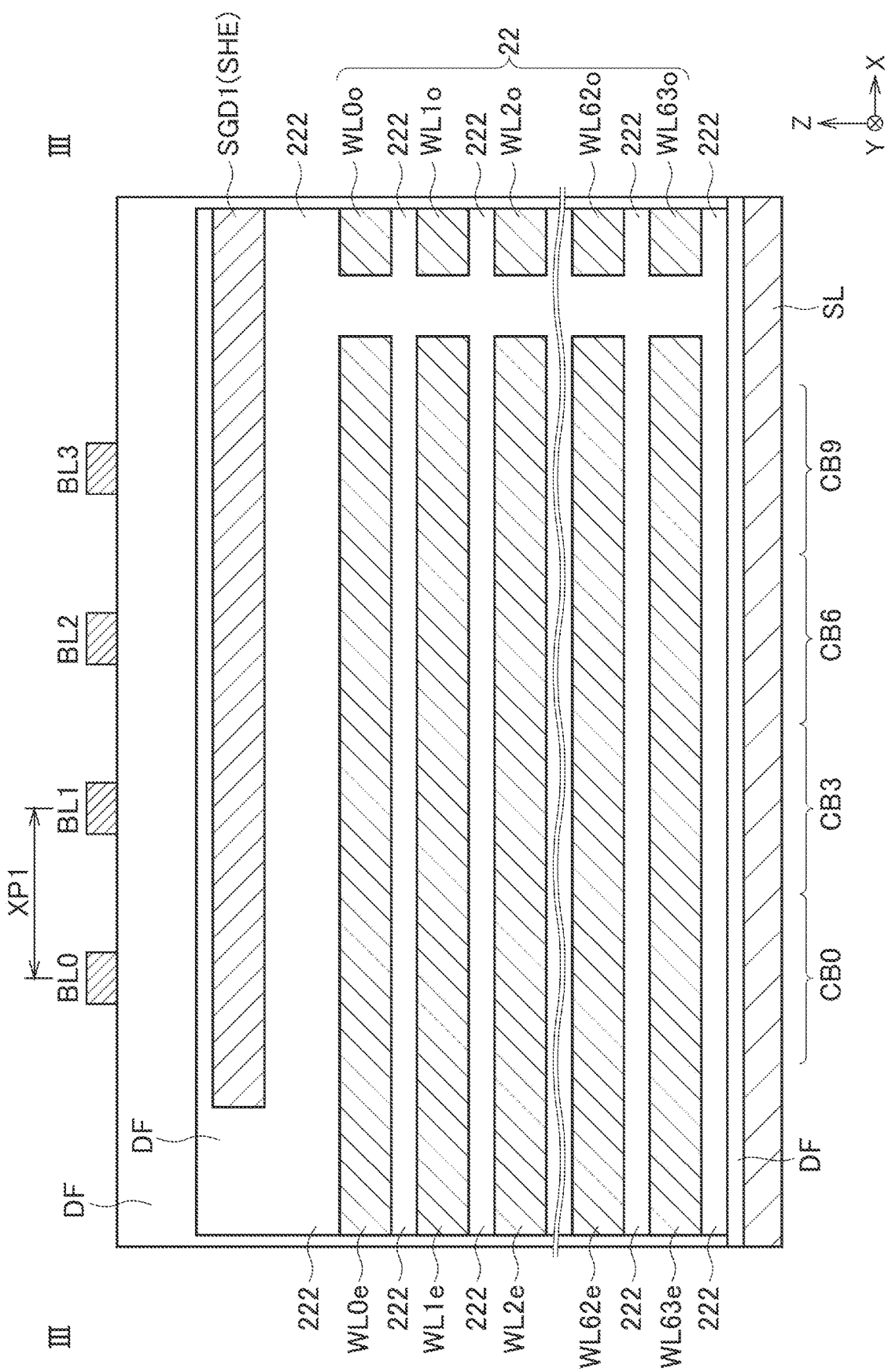
FIG. 16 is a cross-sectional diagram taken in the line III-III of FIG. 12.

FIG. 16 is a cross-sectional diagram taken in the line III-III of FIG. 12. As illustrated in FIG. 16, the word line WL0 to WL63 and the insulation layer 222 are repeatedly stacked with each other in the Z axial direction. The word lines WL0 to WL63 are separated into odd word lines WL0$_o$ to WL63$_o$ and even word lines WL0$_e$ to WL63$_e$. Select gate lines SGD1 and SGD2 are stacked on the uppermost insulation layer 222 of the stacked structure 22. The select gate line SGD1 and SGD2 respectively select the cell blocks CB0 to CB3. The conductive films SGD1 and SGD2 are separated in the Y axial direction with the separating film SHE. The separating film SHE is provided above the conductive films WL0$_o$ and WL0$_e$ (i.e., plus Z axial direction side), extends in the XZ axial direction, and reaches the uppermost insulation layer 222 in the stacked structure 22. Consequently, the cell block select gate lines SGD are electrically insulated from each other.

Figure 17:
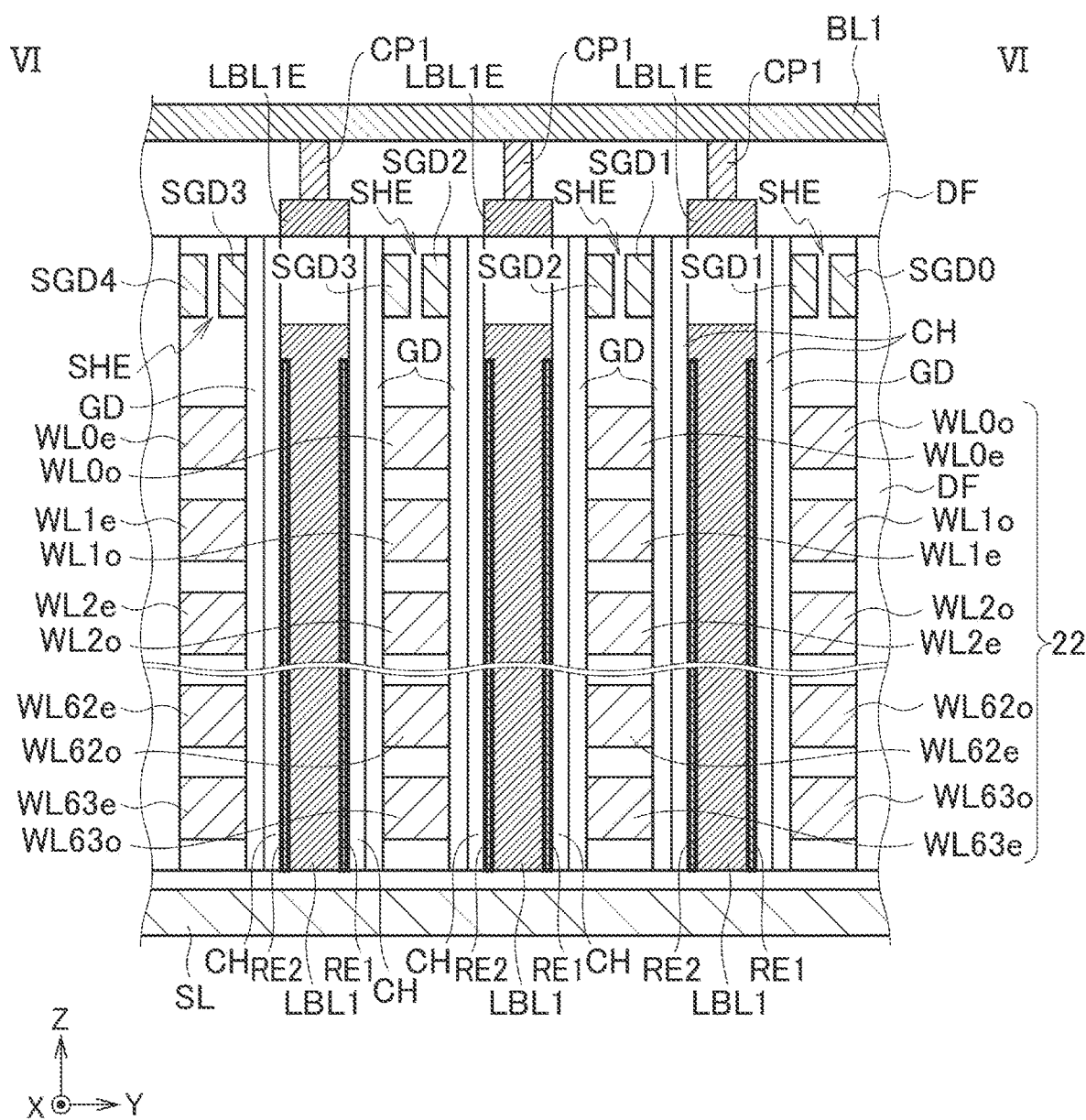
FIG. 17 is a cross-sectional diagram taken in the line VI-VI of FIG. 12.

FIG. 17 is a cross-sectional diagram taken in the line VI-VI of FIG. 12. As illustrated in FIG. 17, a plurality of local bit lines LBL1 extending in the Z axial direction are arranged in the Y axial direction. Odd word lines WL0, to WL63$_o$ are stacked in the Z axial direction through the insulation layer 222, in the plus Y axial direction of the 0th local bit line LBL1 sandwiched by the select gate lines SGD1. Moreover, even word lines WL0$_e$ to WL63$_e$ are stacked in the Z axial direction through the insulation layer 222, in the minus Y axial direction of the 0th local bit line LBL1 sandwiched by the select gate lines SGD1. Even word lines WL0$_e$ to WL63$_e$ are stacked in the Z axial direction through the insulation layer 222, in the plus Y axial direction of the first local bit line LBL1 sandwiched by the select gate lines SGD2. Moreover, odd word lines WL0$_o$ to WL63$_o$ are stacked in the Z axial direction through the insulation layer 222, in the minus Y axial direction of the first local bit line LBL1 sandwiched by the select gate lines SGD2. Odd word lines WL0$_o$ to WL63$_o$ are stacked in the Z axial direction through the insulation layer 222, in the plus Y axial direction of the second local bit line LBL1 sandwiched by the select gate lines SGD3. Moreover, even word lines WL0$_e$ to WL63$_e$ are stacked in the Z axial direction through the insulation layer 222, in the minus Y axial direction of the second local bit line LBL1 sandwiched by the select gate lines SGD3. Select gate lines SGD0 to SGD4 separated by the separating film SHE in the Y axial direction are stacked on the uppermost insulation layer 222 in the stacked structure 22. The local bit line LBL1 is connected to an end portion LBL1E of local bit line in the plus Z axial direction. The local bit line LBL1 and the end portion LBL1E of local bit line are connected to the bit line BL1 through the contact plug CP1.

Figure 18:
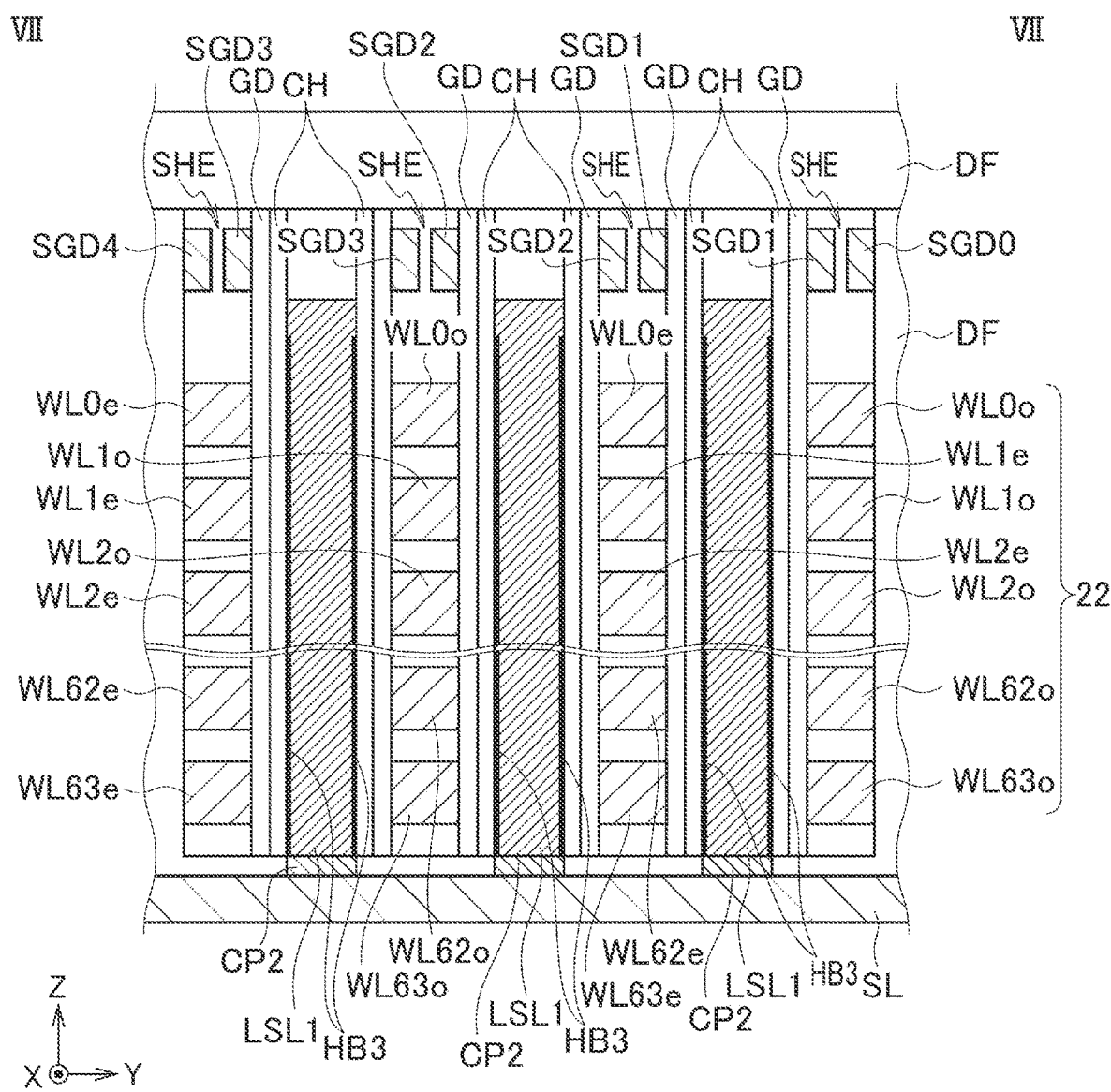
FIG. 18 is a cross-sectional diagram taken in the line VII-VII of FIG. 12.

FIG. 18 is a cross-sectional diagram taken in the line VII-VII of FIG. 12. As illustrated in FIG. 18, a plurality of local source lines LSL1 extending in the Z axial direction are arranged in the Y axial direction. Odd word lines WL0, to WL63$_o$ are stacked in the Z axial direction through the insulation layer 222, in the plus Y axial direction of the 0th local source line LSL1 sandwiched by the select gate lines SGD1. Moreover, even word lines WL0$_e$ to WL63$_e$ are stacked in the Z axial direction through the insulation layer 222, in the minus Y axial direction of the 0th local source line LSL1 sandwiched by the select gate lines SGD1. Even word lines WL0$_e$ to WL63$_e$ are stacked in the Z axial direction through the insulation layer 222, in the plus Y axial direction of the first local source line LSL1 sandwiched by the select gate lines SGD2. Moreover, odd word lines WL0$_o$ to WL63$_o$ are stacked in the Z axial direction through the insulation layer 222, in the minus Y axial direction of the first local source line LSL1 sandwiched by the select gate lines SGD2. Odd word lines WL0$_o$ to WL63$_o$ are stacked in the Z axial direction through the insulation layer 222, in the plus Y axial direction of the second local source line LSL1 sandwiched by the select gate lines SGD3. Moreover, even word lines WL0$_e$ to WL63$_e$ are stacked in the Z axial direction through the insulation layer 222, in the minus Y axial direction of the second local source line LSL1 sandwiched by the select gate lines SGD3. Select gate lines SGD0 to SGD4 separated by the separating film SHE in the Y axial direction are stacked on the uppermost insulation layer 222 in the stacked structure 22. The local source line LSL1 is connected to the source line SL through the contact plug CP2 in the minus Z axial direction.

(Contact Plug CP1)

As illustrated in FIGS. 15 and 17, contact plugs CP1 are respectively disposed between the bit lines BL0 to BL3 and the end portions LBL0E to LBL3E of local bit line. In this case, the contact plugs CP1 are respectively in contact with the bit lines BL0 to BL3 at an upper edge and are respectively in contact with the end portions LBL0E to LBL3E of local bit line at a lower edge. Cell block select gate transistors SG0 to SG3 are respectively formed at locations where the semiconductor film CH(SG) and the conductive films SGD0 to SGD3 between the end portions LBL0E to LBL3E of local bit line and the local bit lines LBL0 to LBL3 intersect with each other. The end portions LBL0E to LBL3E of local bit line and the local bit lines LBL0 to LBL3 can be electrically connected through the semiconductor film CH(SG). The contact plug CP1 is formed with a material that is formed of a conductive material (e.g., a metal such as tungsten) as a principal component.

(Contact Plug CP2)

As illustrated in FIGS. 15 and 18, a contact plug CP2 is disposed between the source line SL and the local source line LSL. In this case, the contact plug CP2 can be in contact with each local source line LSL0 to LSL4 at an upper edge and in contact with the source line SL at a lower edge, and can electrically connect between the source line SL and the local source lines LSL0 to LSL4. The contact plug CP2 is formed with a material that is formed of a conductive material (e.g., a metal such as tungsten) as a principal component.

(Effect of First Embodiment)

According to the first embodiment, there can be provided the 3D stacked semiconductor memory capable of increasing the cell density.

Second Embodiment

Figure 19:
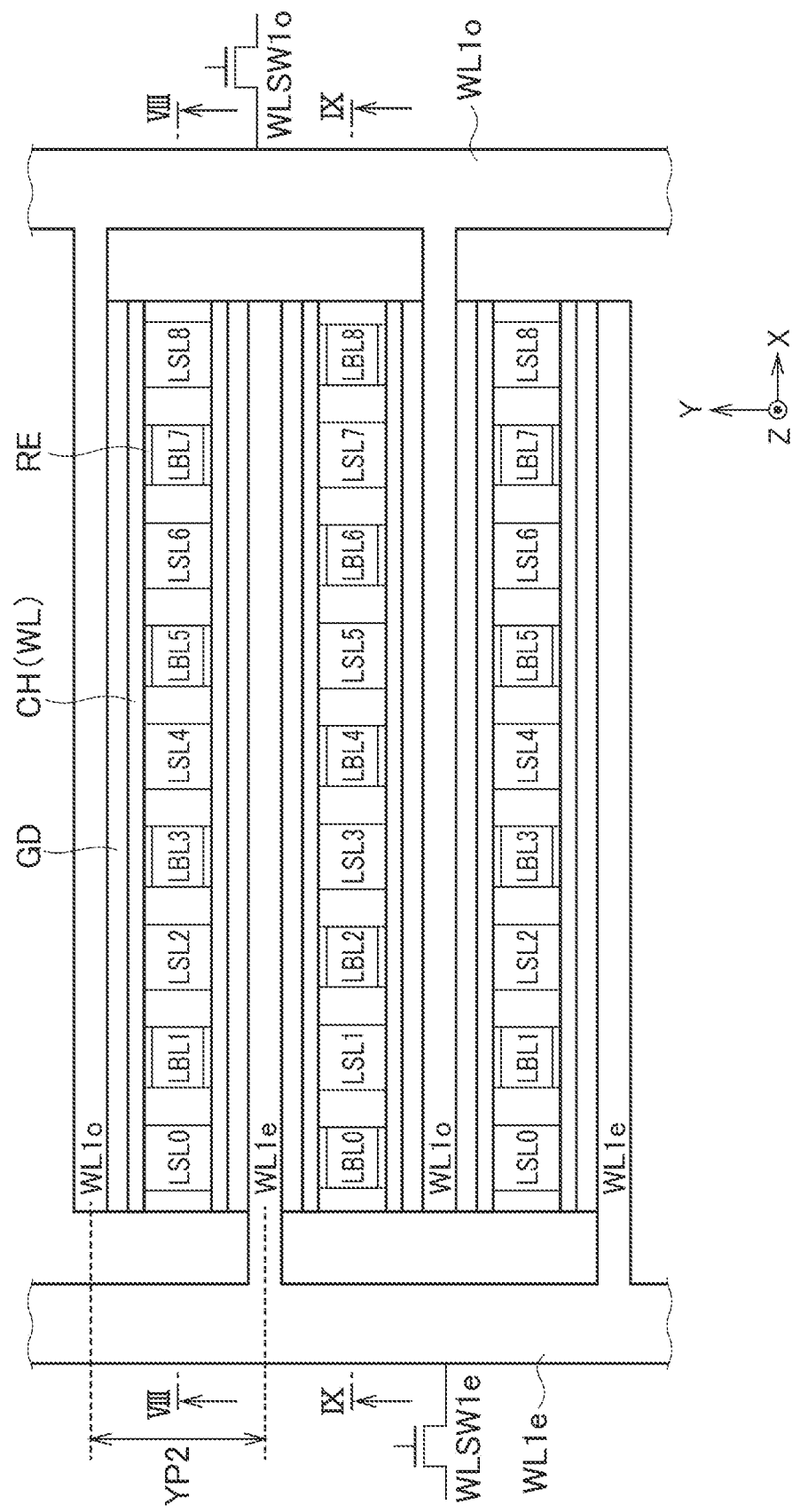
FIG. 19 is a top view diagram at word line level of a 3D stacked semiconductor memory according to a second embodiment.
Figure 20:
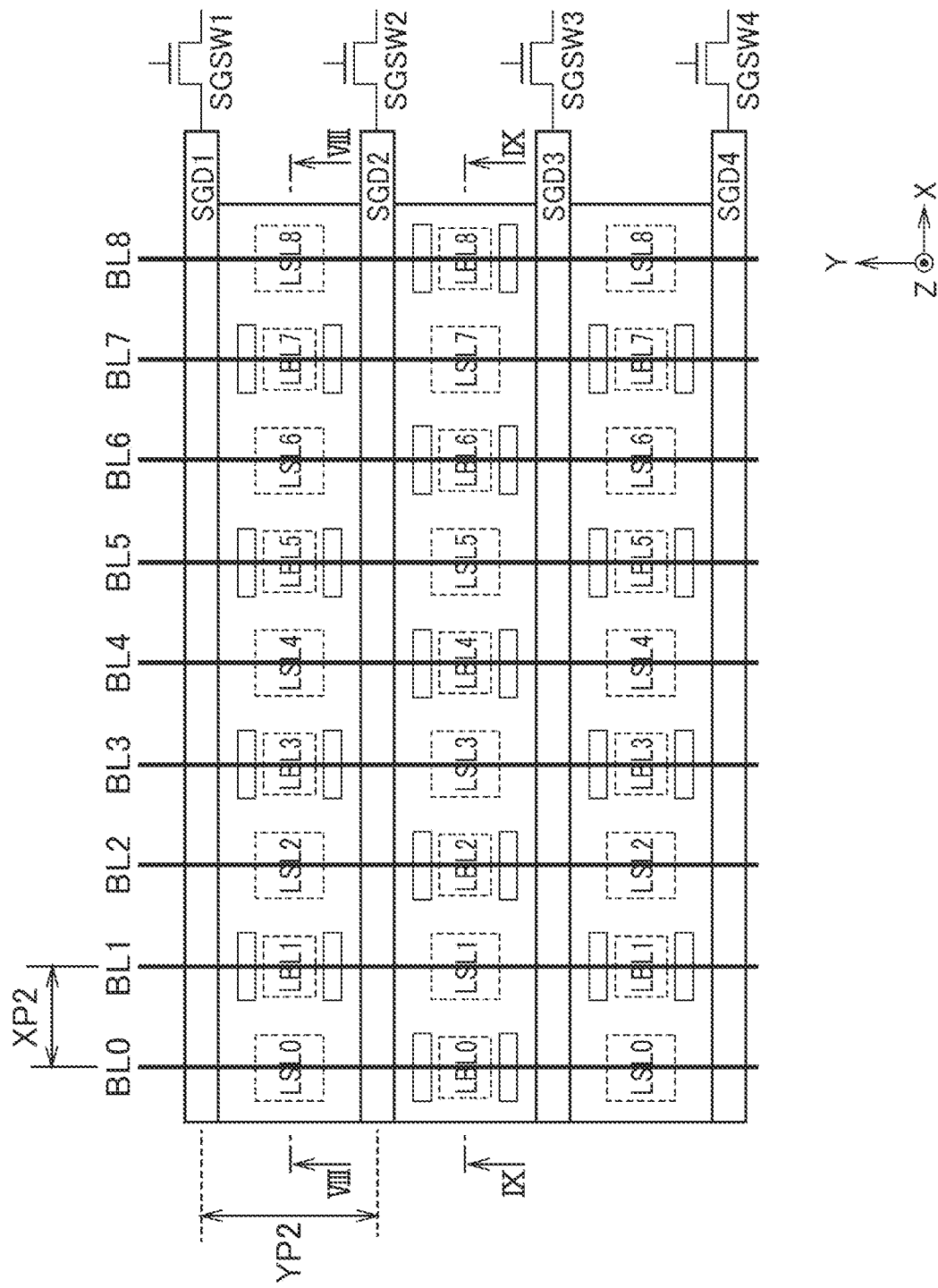
FIG. 20 is a top view diagram at select gate line level of the 3D stacked semiconductor memory according to the second embodiment.

FIG. 19 is a top view diagram at word line level of a 3D stacked semiconductor memory according to a second embodiment. FIG. 20 is a top view diagram at select gate line level of the 3D stacked semiconductor memory according to the second embodiment. The 3D stacked semiconductor memory according to the second embodiment has a structure in which an arrangement of the local bit line LBL and the local source line LSL is shifted by the pitch XP2 in the X axial direction between an even-numbered line and an odd-numbered line, as illustrated in FIGS. 19 and 20. The even-numbered line used herein is an arrangement line of the local source line LSL and the local bit line LBL alternately arranged in the X axial direction in a line shape between the odd word line $WL_o$ and the even word lines $WL_e$ arranged at the minus Y axial direction side with respect to the odd word line $WL_o$. The odd-numbered line used herein is an arrangement line of the local bit line LBL and the local source line LSL alternately arranged in the X axial direction in a line shape between the even word line $WL_e$ and the odd word lines $WL_o$ arranged at the minus Y axial direction side with respect to the even word line $WL_e$. For example, in an example of FIG. 19, the 0th line is an arrangement line of the local source line LSL and the local bit line LBL alternately arranged in the X axial direction in a line shape between the odd word line $WL1_o$ and the even word line $WL1_e$ arranged at the minus Y axial direction side with respect to the odd word line $WL1_o$. The first line is an arrangement line of the local bit line LBL and the local source line LSL alternately arranged in the X axial direction in a line shape between the even word line $WL1_e$ and the odd word line $WL1_o$ arranged at the minus Y axial direction side with respect to the even word line $WL1_e$. The second line is an arrangement line of the local source line LSL and the local bit line LBL alternately arranged in the X axial direction in a line shape between the odd word line $WL1_e$ and the even word line $WL1_e$ arranged at the minus Y axial direction side with respect to the odd word line $WL1_o$. In the 0th and second lines, LSL0, LBL1, LSL2, LBL3, LSL4, LBL5, LSL6, LBL7, and LSL8 are sequentially disposed. In the first line, LBL0, LSL1, LBL2, LSL3, LBL4, LSL5, LBL6, LSL7, and LBSL8 are sequentially disposed.

As illustrated in FIGS. 19 and 20, in the 3D stacked semiconductor memory according to the second embodiment, an arrangement pitch of the bit line BL is expressed by XP2. An arrangement pitch of the word line WL is expressed by YP2.

As illustrated in FIGS. 19 and 20, the 3D stacked semiconductor memory according to the second embodiment includes a plurality of lines sandwiched between the odd word line $WL_o$ and the even word line $WL_e$ disposed so as to be adjacent to each other in parallel in the Y axial direction, and the arrangement in the X axial direction of the local source line LSL and the local bit line LBL is shifted between the even-numbered line and the odd-numbered line. In the arrangement in the X axial direction of the local source line LSL and the local bit line LBL, the pitch in the X axial direction of the local source line LSL and the local bit line LBL is shifted by a pitch XP2, which is approximately half of the pitch in the X axial direction, between the even-numbered line and the odd-numbered line. The pitch XP2 is equal to an arrangement pitch of the bit lines BL.

The 3D stacked semiconductor memory according to the second embodiment has a structure in which the arrangement of local bit line LBL and local source line LSL is shifted in the X axial direction by the pitch XP2 of X axial direction between the even-numbered line and the odd-numbered line, no separating film SHE is necessary. Accordingly, the pitch YP2 in the Y axial direction can be reduced by the width of the separating film SHE compared with the pitch YP1 (refer to FIG. 13) in the first embodiment, and thereby the cell size can be reduced by that amount.

Figure 21:
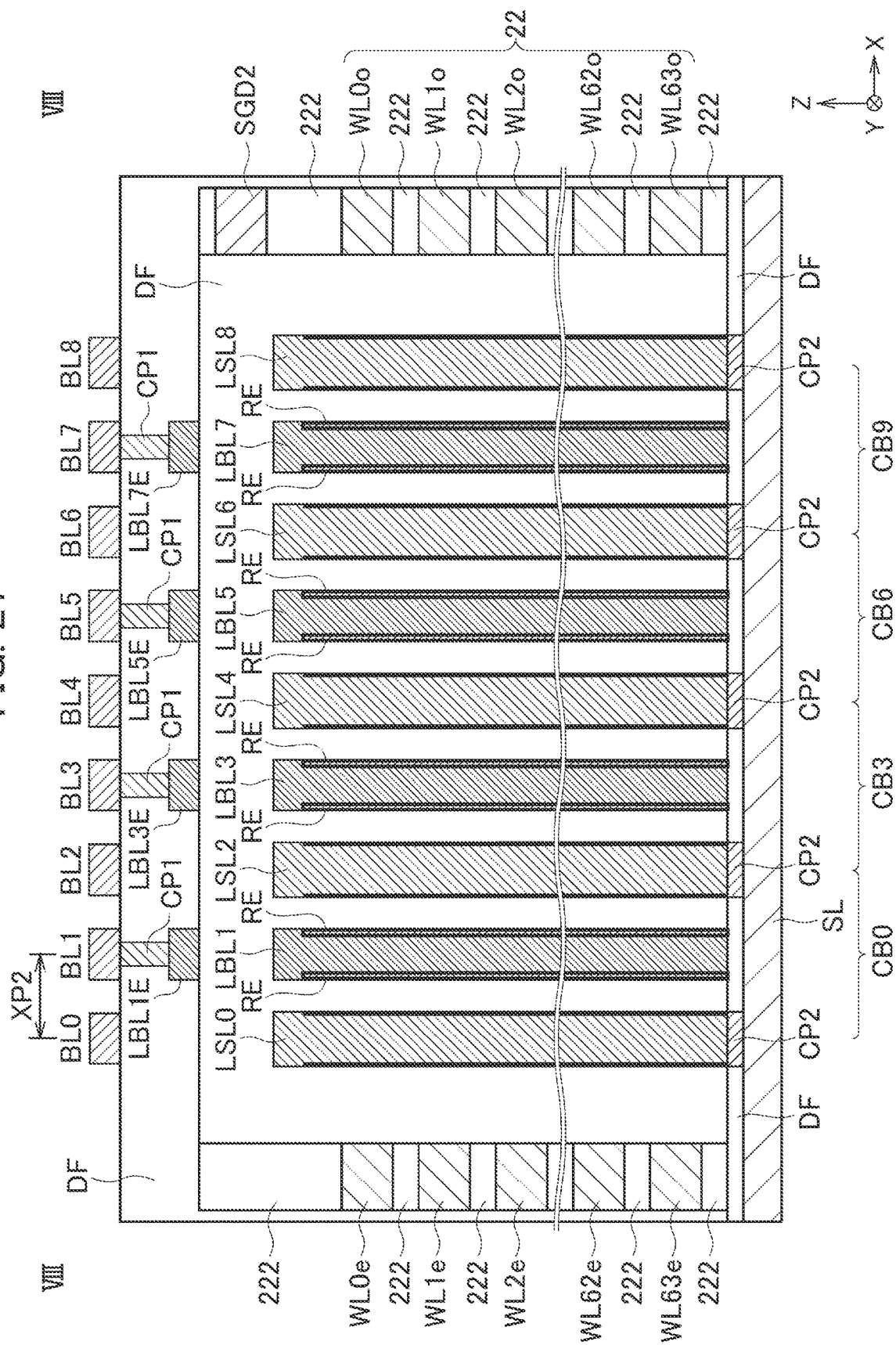
FIG. 21 is a cross-sectional diagram taken in the line VIII-VIII of FIGS. 19 and 20.

FIG. 21 is a cross-sectional diagram taken in the line VIII-VIII of FIGS. 19 and 20, illustrating a cross-sectional structure along the even-numbered line (e.g., 0th line). FIG. 21 corresponds to FIG. 15 of the first embodiment. The different is that the arrangement pitch of bit lines BL0 to BL8 are reduced, and thereby reducing the cell size in the X axial direction. As illustrated in FIG. 21, even-numbered local source lines LSL0 to LSL8 and odd-numbered local bit lines LBL1 to LBL7 are arranged in the X axial direction. The even-numbered local source line LSL0 to LSL8 is connected to the source line SL through the contact plug CP2 in the minus Z axial direction. The odd-numbered local bit lines LBL1 to LBL7 are respectively connected to end portions LBL1E to LBL7E of local bit line in the plus Z axial direction. The end portions LBL1E to LBL7E of local bit line are respectively connected to the odd-numbered bit lines BL1 to BL7 through the contact plugs CP1.

Figure 22:
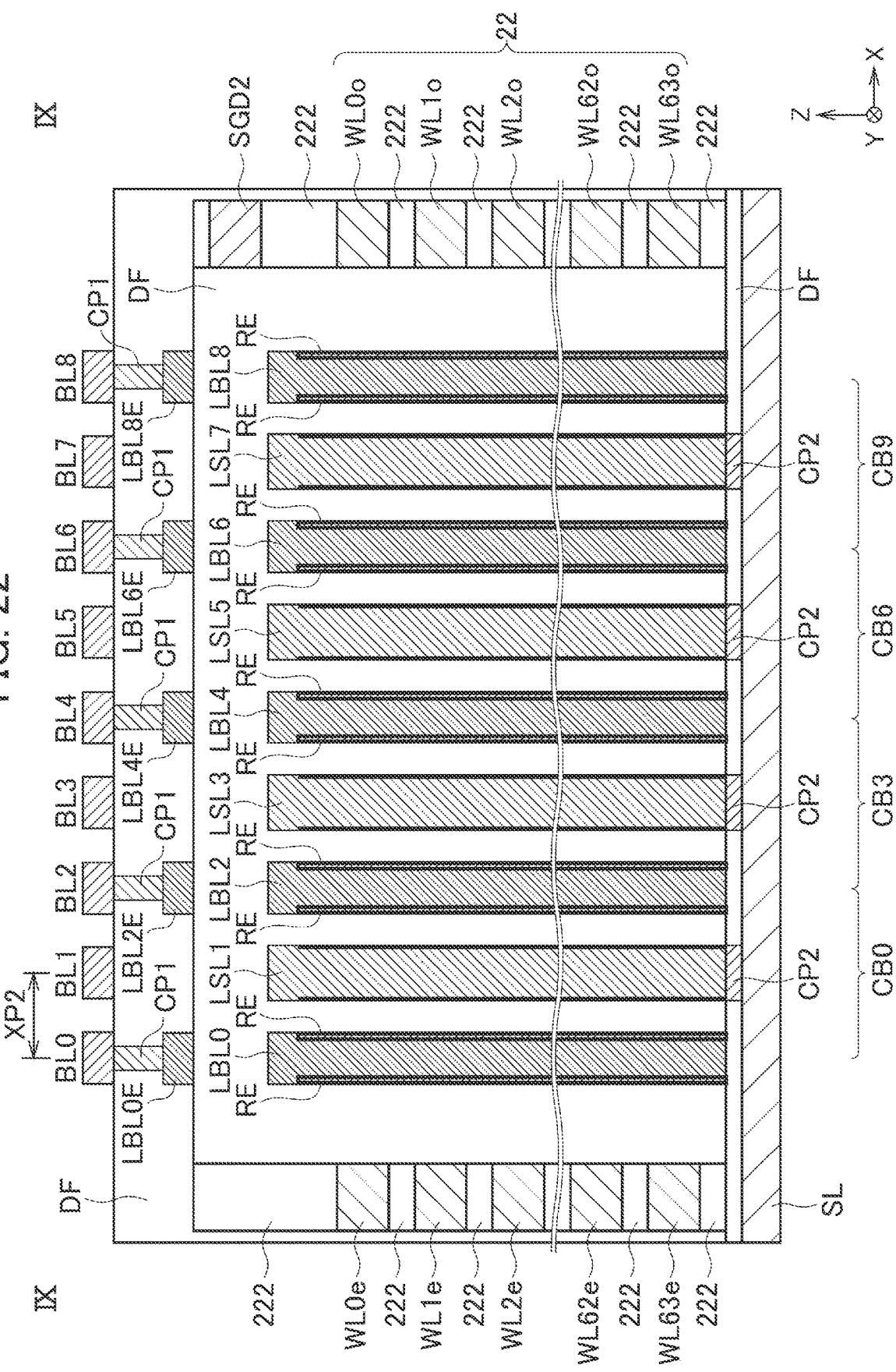
FIG. 22 is a cross-sectional diagram taken in the line IX-IX of FIGS. 19 and 20.

FIG. 22 is a cross-sectional diagram taken in the line IX-IX of FIGS. 19 and 20, illustrating a cross-sectional structure along the odd-numbered line (e.g., first line). As illustrated in FIG. 22, even-numbered local bit lines LBL0 to LBL8 and odd-numbered local source lines LSL1 to LSL7 are arranged in the X axial direction. Each odd-numbered local source line LSL1 to LSL7 is also connected to the source line SL through the contact plug CP2 in the minus Z axial direction. The even-numbered local bit lines LBL0 to LBL8 are respectively connected to end portions LBL0E to LBL8E of local bit line in the plus Z axial direction. The end portions LBL0E to LBL8E of local bit line are respectively connected to the even-numbered bit lines BL0 to BL8 through the contact plugs CP1.

When the local bit line LBL is disposed at the end portion of each line in the X axial direction or minus X axial direction, this local bit line may be a dummy bit line (i.e., a bit line that does not operate). Alternatively, this local bit line may be used if sufficient electric current to be conducted to the cell transistor can be secured and if it can operate.

In the 3D stacked semiconductor memory according to the second embodiment, it is not necessary to separate the select gate lines SGD1 to SGD4 by the separating film SHE. The select gate lines SGD1 to SGD4 are respectively connected to the select gate line select transistors SGSW1 to SGSW4, and thereby can be controlled independently. A driving method thereof is as follows. By driving any one of the select gate lines SGD1 to SGD4 disposed directly above the selected word line WL to be turned on, all bit lines BL0 to BL8 are connected to one memory cell each. When any one of the select gate lines that is not directly above the selected word line WL to be turned on is driven, the memory cell is connected to half the number of bit lines. The cell transistors MT and MT' on both sides, viewed from a certain word line WL, are respectively connected to different bit lines BL, and therefore they can be turned on at the same time. Accordingly, it is not necessary to separate the select gate lines SGD1 to SGD4 by the separating film SHE.

(Effect of Second Embodiment)

According to the second embodiment, there can be provided the 3D stacked semiconductor memory, capable of increasing the cell density, and having a simplified structure since the separating film is unnecessary. Since no separating film is necessary, the pitch YP in the Y axial direction can be reduced, and thereby the cell size can be reduced by that amount.

Third Embodiment

Figure 23:
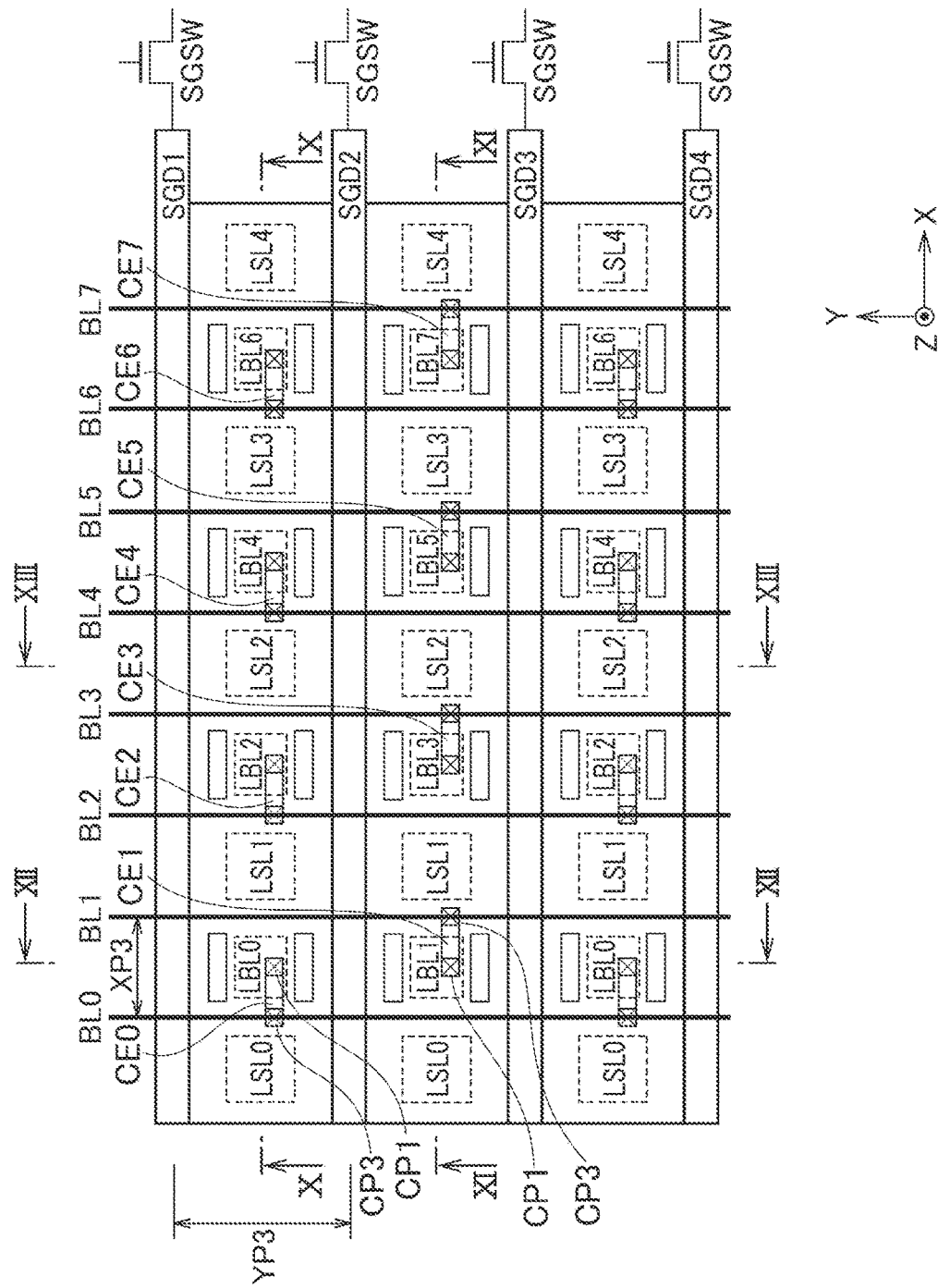
FIG. 23 is a top view diagram at select gate line level of a 3D stacked semiconductor memory according to a third embodiment.
Figure 24:
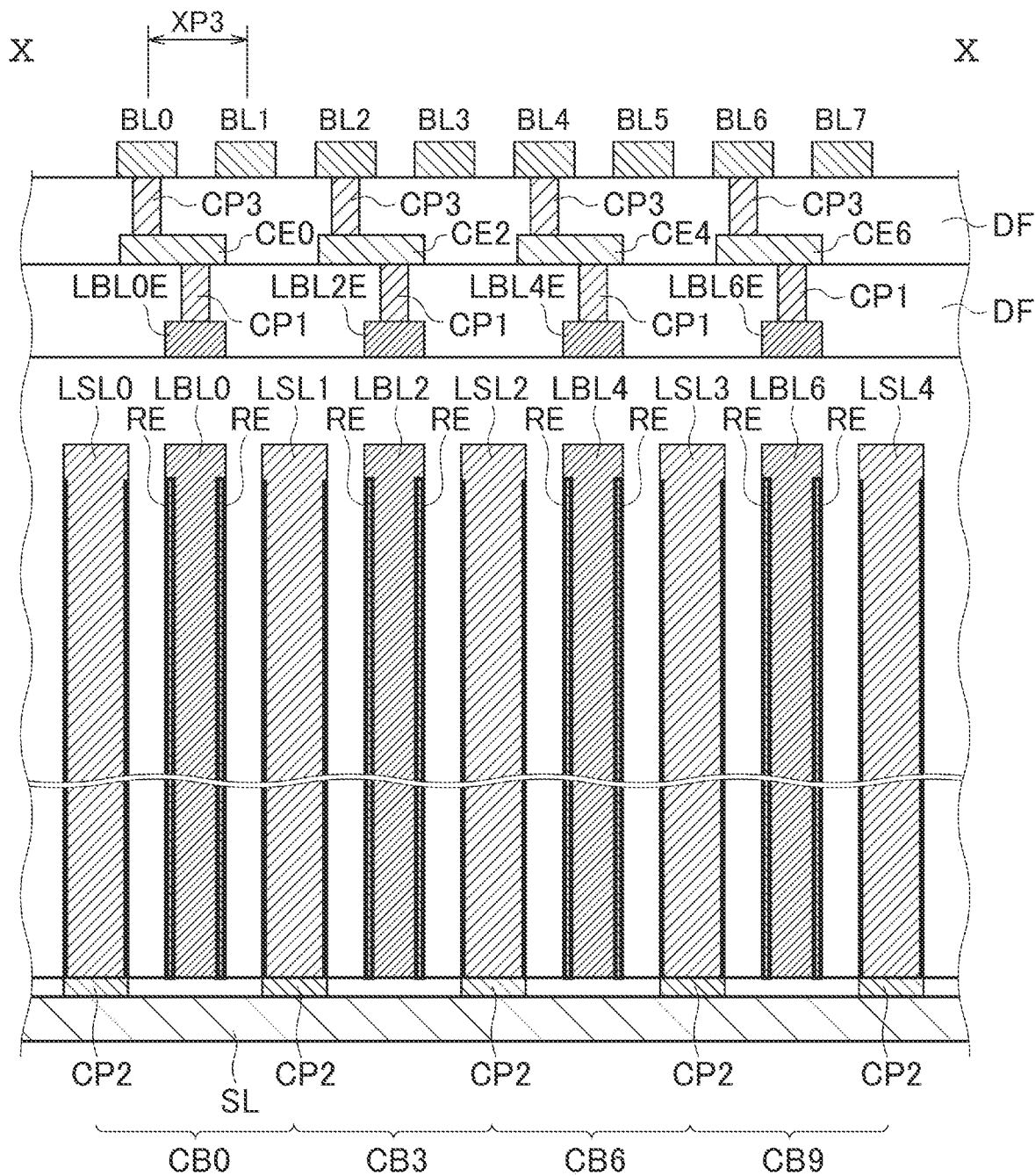
FIG. 24 is a cross-sectional diagram taken in the line X-X of FIG. 23.
Figure 25:
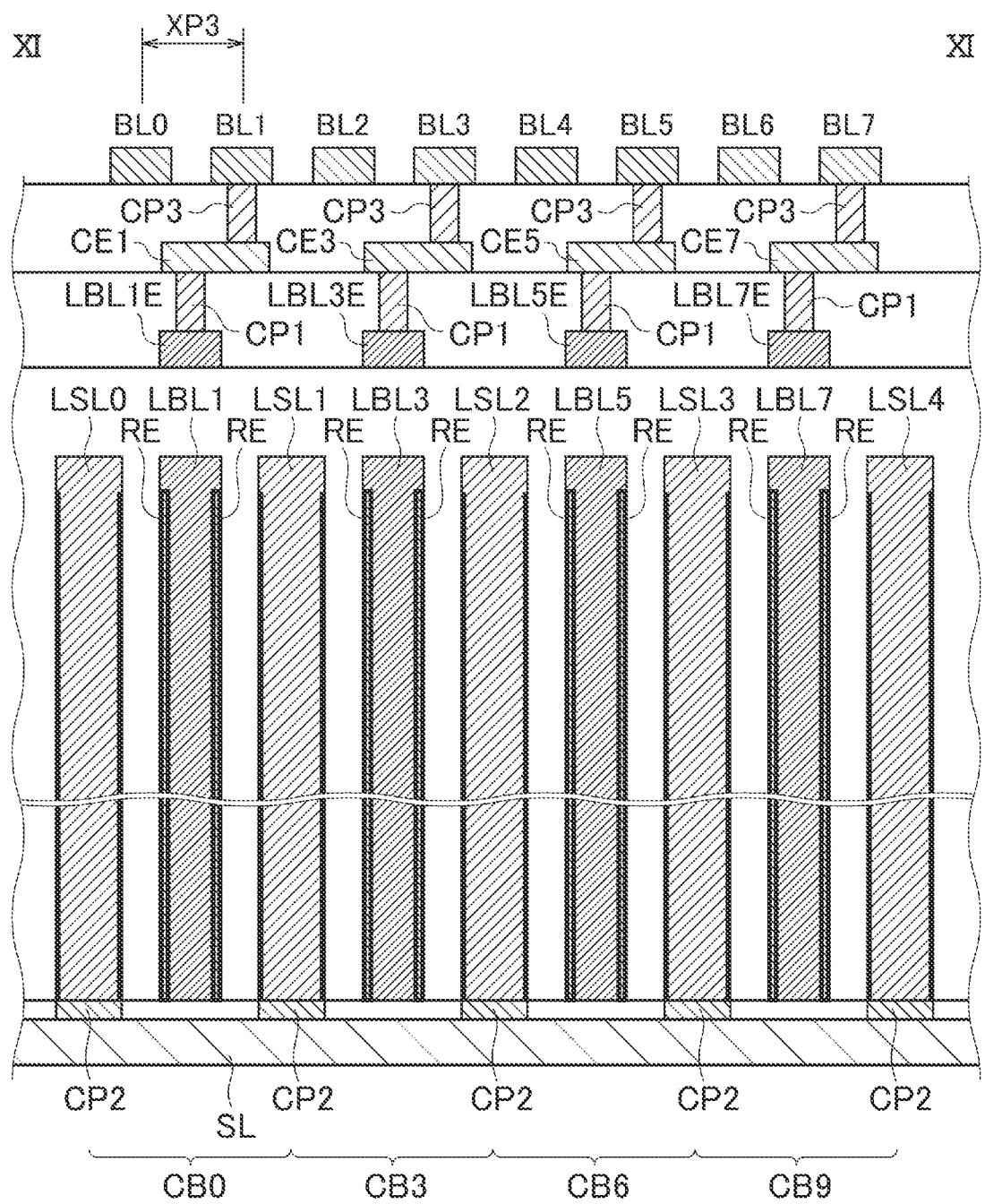
FIG. 25 is a cross-sectional diagram taken in the line XI-XI of FIG. 23.

FIG. 23 is a top view diagram at select gate line level of a 3D stacked semiconductor memory according to a third embodiment. Since a top view diagram at word line level is the same as that in FIG. 12 (first embodiment), illustration thereof is omitted. FIG. 24 is a cross-sectional diagram taken in the line X-X of FIG. 23. FIG. 25 is a cross-sectional diagram taken in the line XI-XI of FIG. 23. As illustrated in FIG. 23 to 25, the 3D stacked semiconductor memory according to the third embodiment includes a plurality of bit lines BL0 to BL7 extending in the Y axial direction, even-numbered bit lines BL0 to BL6 respectively connected to local bit lines LBL0 to LBL6 belonging to even-numbered lines, and odd-numbered bit lines BL1-BL7 respectively connected to local bit lines LBL1 to LBL7 belonging to odd-numbered lines.

In the 3D stacked semiconductor memory according to the third embodiment, each arrangement of the odd word line $WL_o$, the even word line $WL_e$, the local bit line LBL, and the local source line LSL is the same as that of the first embodiment. The arrangement of the select gate line SGD is the same as that of the second embodiment. In the 3D stacked semiconductor memory according to the third embodiment, no separating film SHE is necessary for the select gate line SGD.

As illustrated in FIGS. 23 and 24, in the 3D stacked semiconductor memory according to the third embodiment, an arrangement pitch of bit line BL is expressed by XP3. An arrangement pitch of the word line WL is expressed by YP3. The arrangement pitch XP3 of bit line BL in the 3D stacked semiconductor memory according to the third embodiment is equal to the arrangement pitch XP2 of bit line BL in the 3D stacked semiconductor memory according to the second embodiment. Moreover, the arrangement pitch YP3 of word line WL in the 3D stacked semiconductor memory according to the third embodiment is equal to the arrangement pitch YP2 of word line WL in the 3D stacked semiconductor memory according to the second embodiment.

As illustrated in FIGS. 23 and 24, the 3D stacked semiconductor memory according to the third embodiment includes contact plugs CP3 respectively connected to the bit lines BL0 to BL6, and metal layers CE0 to CE6 respectively connected to the contact plugs CP3. The contact plugs CP1 connected to the end portion LBL0E to LBL6E of local bit line are not directly connected to the bit lines BL0 to BL6, but are connected to the contact plugs CP3 and the bit lines BL0-BL6 by being shifted in the minus X axial direction, which is approximately half of the pitch XP3, through the metal layers CE0 to CE6 extending in the X axial direction.

As illustrated in FIGS. 23 and 25, the 3D stacked semiconductor memory according to the third embodiment includes contact plugs CP3 respectively connected to the bit lines BL1 to BL7, and metal layers CE1 to CE7 respectively connected to the contact plugs CP3. The contact plugs CP1 connected to the end portion LBL1E to LBL7E of local bit line are not directly connected to the bit lines BL1 to BL7, but are connected to the contact plugs CP3 and the bit lines BL1-BL7 by being shifted in the plus X axial direction, which is approximately half of the pitch XP3, through the metal layers CE1 to CE7 extending in the X axial direction.

In the 3D stacked semiconductor memory according to the third embodiment, as illustrated in FIGS. 23 and 24, the local bit line LBL and the local source line LSL are alternately disposed, in each line.

Figure 26:
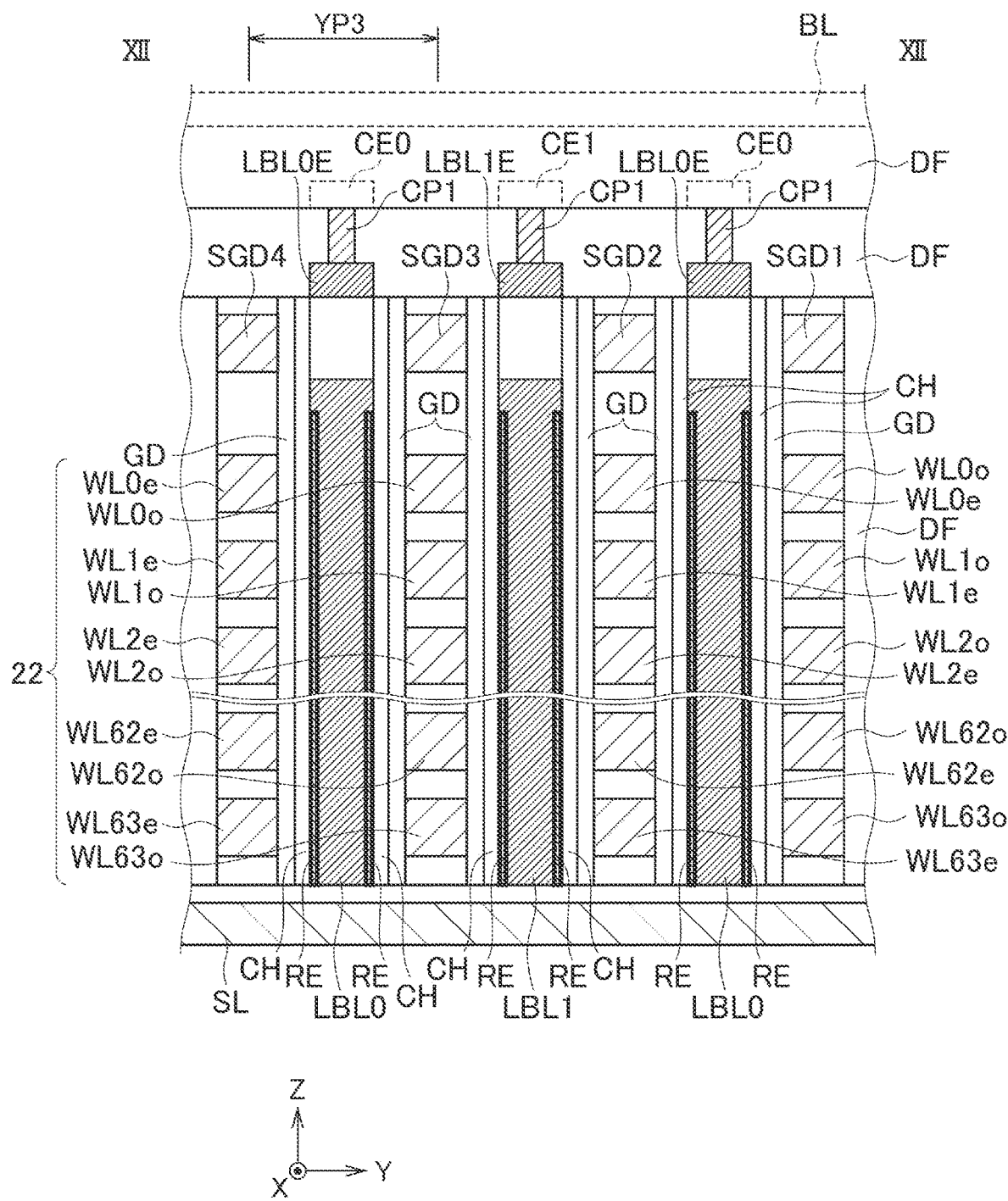
FIG. 26 is a cross-sectional diagram taken in the line XII-XII of FIG. 23.

FIG. 26 is a cross-sectional diagram taken in the line XII-XII of FIG. 23. As illustrated in FIG. 26, a plurality of local bit lines LBL0, LBL1, and LBL0 extending in the Z axial direction are arranged in the Y axial direction. Odd word lines $WL0_o$ to $WL63_o$ are stacked in the Z axial direction through the insulation layer 222, in the plus Y axial direction of the 0th local bit line LBL0 sandwiched by the select gate line SGD1 and the select gate lines SGD2. Moreover, even word lines $WL0_e$ to $WL63_e$ are stacked in the Z axial direction through the insulation layer 222, in the minus Y axial direction of the 0th local bit line LBL1 sandwiched by the select gate line SGD1 and the select gate lines SGD2. Even word lines $WL0_e$ to $WL63_e$ are stacked in the Z axial direction through the insulation layer 222, in the plus Y axial direction of the first local bit line LBL1 sandwiched by the select gate line SGD2 and the select gate lines SGD3. Moreover, odd word lines $WL0_o$ to $WL63_o$ are stacked in the Z axial direction through the insulation layer 222, in the minus Y axial direction of the first local bit line LBL1 sandwiched by the select gate lines SGD2 and the select gate lines SGD3. Odd word lines $WL0_o$ to $WL63_o$ are stacked in the Z axial direction through the insulation layer 222, in the plus Y axial direction of the second local bit line LBL0 sandwiched by the select gate line SGD3 and the select gate lines SGD4. Moreover, even word lines $WL0_e$ to $WL63_e$ are stacked in the Z axial direction through the insulation layer 222, in the minus Y axial direction of the second local bit line LBL1 sandwiched by the select gate line SGD3 and the select gate lines SGD4. Select gate lines SGD1 to SGD4 are stacked on the uppermost insulation layer 222 of the stacked structure 22. The local bit line LBL0 is connected to an end portion LBL0E of local bit line in the plus Z axial direction. The end portion LBL0E of local bit line is connected to the bit line BL0 through the contact plug CP1 and the metal layer CE0. The local bit line LBL1 is connected to an end portion LBL1E of local bit line in the plus Z axial direction. The end portion LBL1E of local bit line is connected to the bit line BL1 through the contact plug CP1 and the metal layer CE1.

Figure 27:
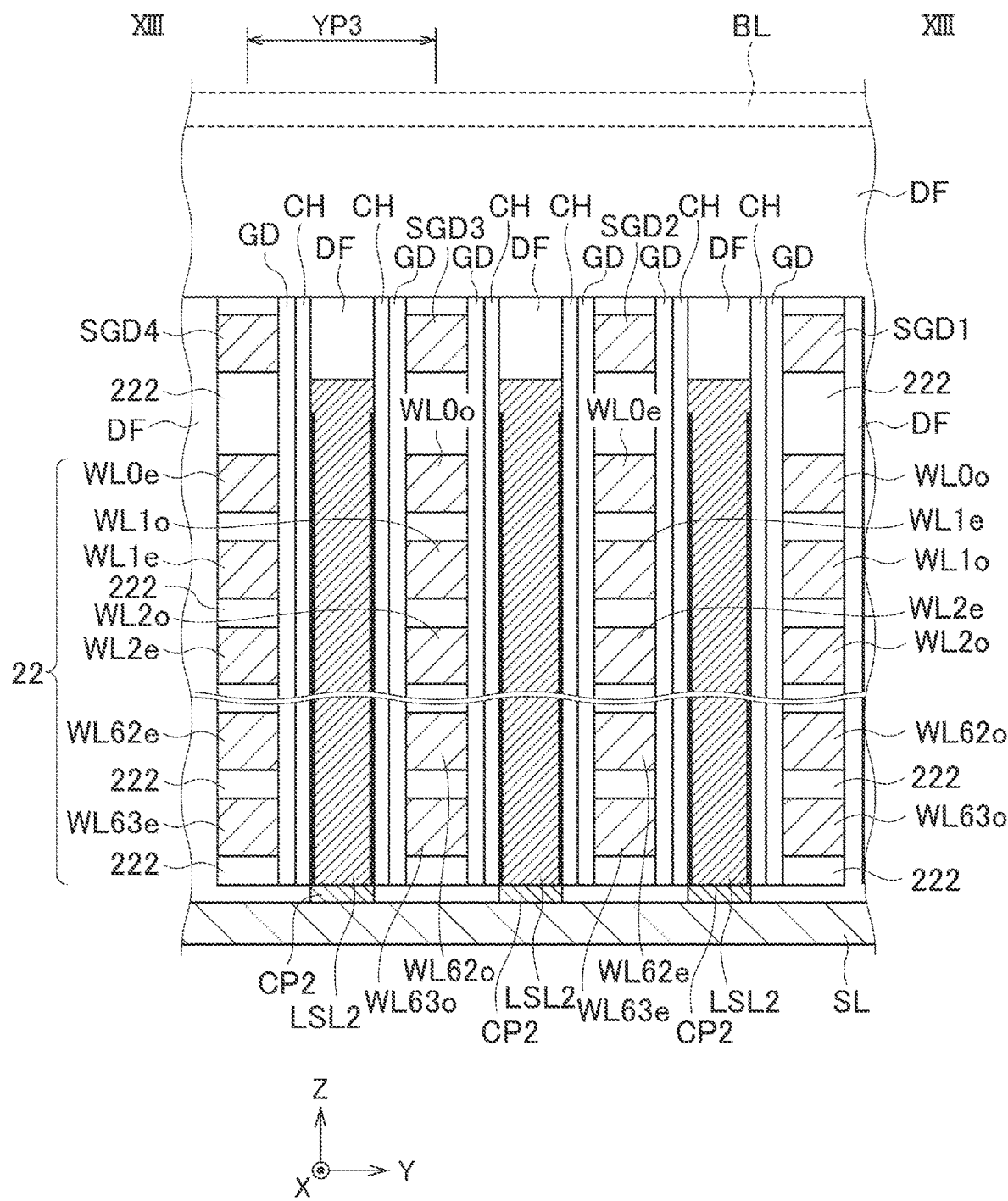
FIG. 27 is a cross-sectional diagram taken in the line XIII-XIII of FIG. 23.

FIG. 27 is a cross-sectional diagram taken in the line XIII-XIII of FIG. 23. As illustrated in FIG. 27, a plurality of local source lines LSL2 extending in the Z axial direction are arranged in the Y axial direction. Odd word lines $WL0_o$ to $WL63_o$ are stacked in the Z axial direction through the insulation layer 222, in the plus Y axial direction of the 0th local source line LSL2 sandwiched by the select gate line SGD1 and the select gate lines SGD2. Moreover, even word lines $WL0_e$ to $WL63_e$ are stacked in the Z axial direction through the insulation layer 222, in the minus Y axial direction of the 0th local source line LSL2 sandwiched by the select gate line SGD1 and the select gate lines SGD2. Even word lines $WL0_e$ to $WL63_e$ are stacked in the Z axial direction through the insulation layer 222, in the plus Y axial direction of the first local source line LSL2 sandwiched by the select gate line SGD2 and the select gate lines SGD3. Moreover, odd word lines $WL0_o$ to $WL63_o$ are stacked in the Z axial direction through the insulation layer 222, in the minus Y axial direction of the first local source line LSL2 sandwiched by the select gate lines SGD2 and the select gate lines SGD3. Odd word lines $WL0_o$ to $WL63_o$ are stacked in the Z axial direction through the insulation layer 222, in the plus Y axial direction of the second local source line LSL2 sandwiched by the select gate line SGD3 and the select gate lines SGD4. Moreover, even word lines $WL0_e$ to $WL63_e$ are stacked in the Z axial direction through the insulation layer 222, in the minus Y axial direction of the second local source line LSL2 sandwiched by the select gate line SGD3 and the select gate lines SGD4. The local source line LSL2 is connected to the source line SL through the contact plug CP2 in the minus Z axial direction.

The 3D stacked semiconductor memory according to the third embodiment does not need to shift the arrangement of local source line LSL and local bit line LBL in the X axial direction between the even-numbered line and the odd-numbered line. Accordingly, there is also an advantage that manufacturing processes is easier than that of the 3D stacked semiconductor memory according to the second embodiment.

In the 3D stacked semiconductor memory according to the third embodiment, it is not necessary to separate the select gate lines SGD1 to SGD4 by the separating film SHE. The select gate lines SGD1 to SGD4 are respectively connected to the select gate line select transistors SGSW1 to SGSW4, and thereby can be controlled independently. A driving method thereof is the same as that of the second embodiment.

In the 3D stacked semiconductor memory according to the third embodiment, the separating film SHE can be eliminated as in the second embodiment, while maintaining the arrangement of the local bit lines LBL as in the first embodiment.

(Effect of Third Embodiment)

According to the third embodiment, there can be provided the 3D stacked semiconductor memory, capable of increasing the cell density, and having a simplified structure since the separating film is unnecessary. Moreover, since no separating film is necessary, the pitch YP in the Y axial direction can be reduced, and thereby the cell size can be miniaturized. Moreover, since the arrangement of the local bit line LBL and the local source line LSL can be made the same between the even-numbered line and the odd-numbered line, a pattern layout can be simplified and manufacturing processes can also be facilitated.

Fourth Embodiment: Arrangement Structure of Contact

Figure 28:
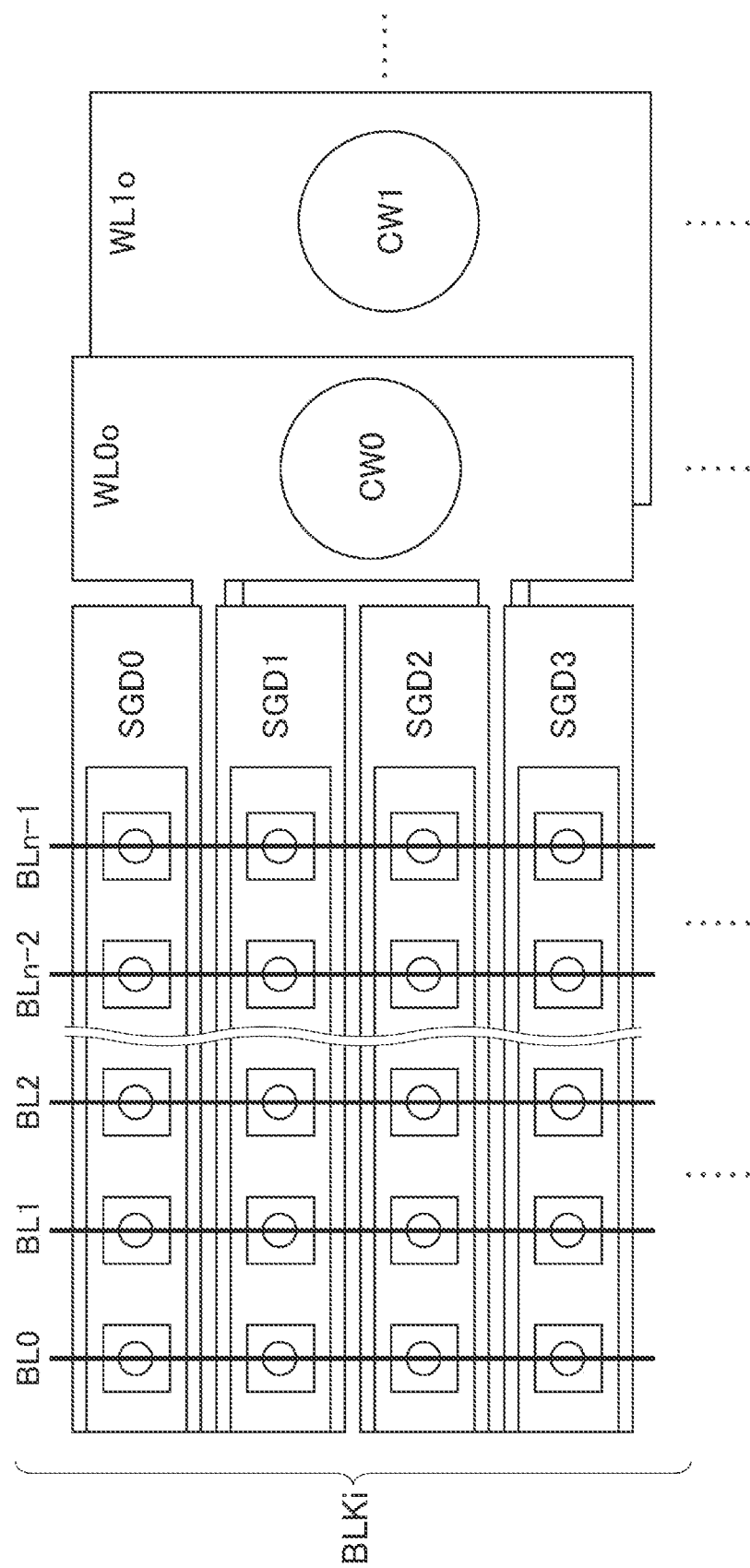
FIG. 28 is a top view diagram of a peripheral portion of a 3D stacked semiconductor memory according to a comparative example.

FIG. 28 is a top view diagram illustrating a block BLKi of a cell array in a 3D stacked semiconductor memory according to a comparative example, and the block BLKi includes select gate lines SGD0 to SGD3, word lines $WL0_o$, $WL1_o$, ..., and word line contacts CW0, CW1, ..., as a peripheral portion. As the cell array portion, bit lines BL0 to BLn−1 are illustrated and internal details are omitted. If the select gate lines SGD0 to SGD3 are arranged as illustrated in FIG. 28, a diameter of stairstep contact is larger than a width of each select gate line SGD0 to SGD3 as illustrated in FIG. 28 and, the way things stand, the stairstep contact with the select gate lines SGD0 to SGD3 cannot be established.

Figure 29:
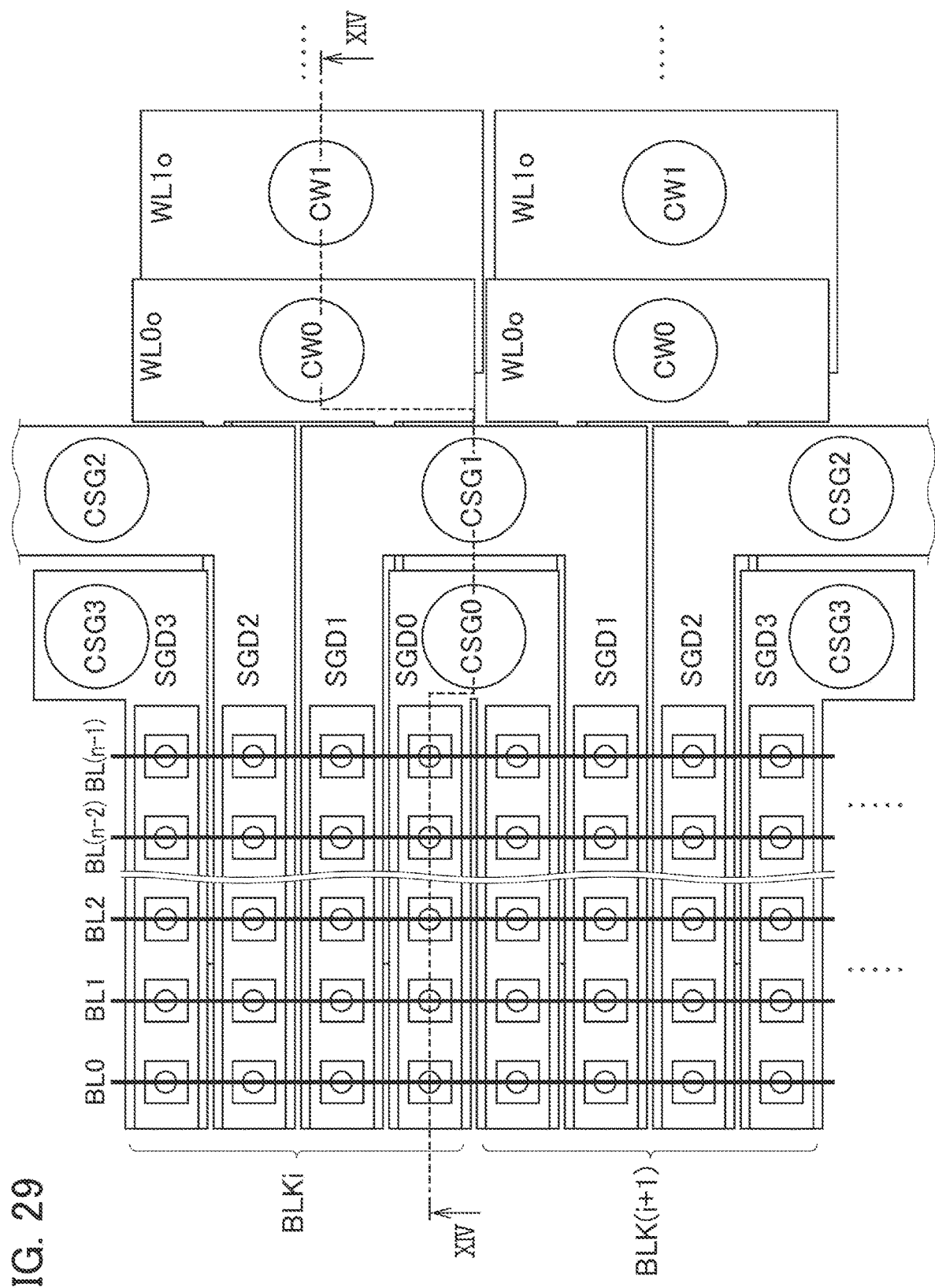
FIG. 29 is a top view diagram of a peripheral portion of a 3D stacked semiconductor memory according to a fourth embodiment.

FIG. 29 is a top view diagram illustrating blocks BLKi and BLK(i+1) of a cell array in a 3D stacked semiconductor memory according to the fourth embodiment, and the block BLKi includes select gate lines SGD0 to SGD3, word lines $WL0_o$, $WL1_o$, ..., select gate line contacts CSG0 to CSG3, and word line contacts CW0, CW1, ..., as a peripheral portion. As illustrated in FIG. 29, in the 3D stacked semiconductor memory according to the fourth embodiment, a location for establishing the select gate line contacts CSG0 to CSG3 can be secured by sharing the select gate lines SGD0 to SGD3 of the peripheral portion between the adjacent blocks BLKi and BLK(i+1). More specifically, the select gate line contacts CSG0 and CSG1 can be shared between the adjacent blocks BLKi and BLK(i+1). The select gate line contacts CSG2 and CSG3 can be shared between the adjacent block BLK(i−1) and BLKi, or can be shared between the adjacent block BLK(i+1) and BLK(i+2).

Figure 30:
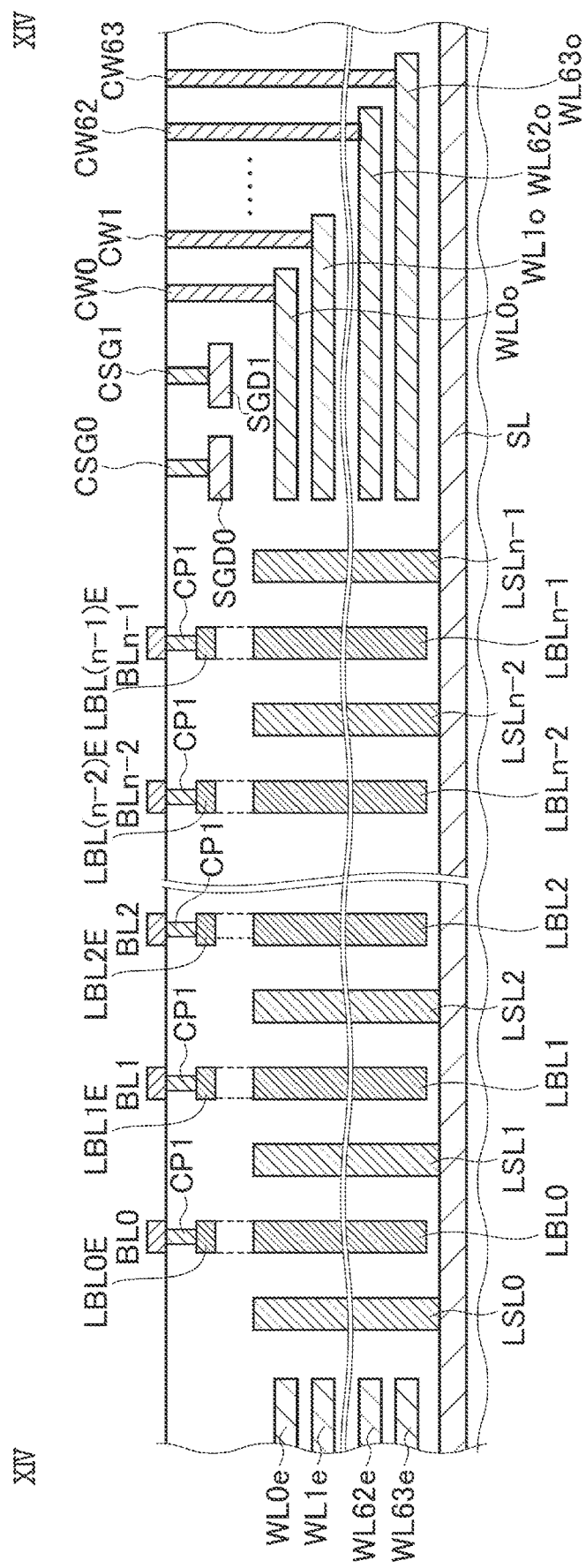
FIG. 30 is a cross-sectional diagram taken in the line XIV-XIV of FIG. 29, in the 3D stacked semiconductor memory according to the fourth embodiment.

FIG. 30 is a cross-sectional diagram taken in the line XIV-XIV of FIG. 29, in the 3D stacked semiconductor memory according to the fourth embodiment. As a cell array portion, there are illustrated bit lines BL0 to BLn−1 respectively connected to the end portions LBL0E to LBL(n−1)E of local bit line, through local source lines LSL0 to LSLn−1, local bit lines LBL0 to LBLn−1, end portions LBL0E to LBL(n−1)E of local bit line, and contact plugs CP1. Although internal details of the cell array are omitted, the structure as in the first to third embodiments can be applied. In the 3D stacked semiconductor memory according to the fourth embodiment, the select gate line contacts CSG0 and CSG1 can be extracted as illustrated in FIGS. 29 and 30. In the peripheral portion of the odd word lines $WL0_o$ to $WL63_o$ stacked in stair-like, the word line contacts CW0 to CW63 can be extracted. The same applies to the peripheral portion of the even word lines $WL0_e$ to $WL63_e$ but the illustration thereof is omitted.

(Effect of Fourth Embodiment)

According to the fourth embodiment, there can be provided the 3D stacked semiconductor memory capable of simplifying the arrangement structure of the word line contacts and the select gate line contacts in the peripheral portion, and capable of increasing the cell density.

In addition, in the resistive switching nonvolatile memory according to the first to third embodiments, the variable resistance film RE in the memory cell MC is formed with phase change materials, superlattice film materials, magnetic materials, or resistance variation materials. The phase change material includes chalcogenide-based materials. The superlattice film material includes stacked structure of GeTe and SbTe. The magnetic material is composed of a tunnel film sandwiched between a free layer and a pinned layer. The resistance variation material includes at least one selected from a group consisting of $NiO_X$, $WO_X$, $TaO_X$, $TiO_X$, $HfO_X$, $ZnO_X$, TiON, Ag—GeSe, Cu—GeSe, $FeO_Z$, $GeO_X$, and STO. The memory element MR in the memory cell MC specifically may be a configuration including, in addition to (I) the above-mentioned alloy type phase transition element ($Ge_2Sb_2Te_5$), any one of (II) an alternately stacked layer of GeTe and $Sb_2Te_3$ as an interface-type phase change memory, (III) an alternately stacked layer of BiSbTe and GeTe as an interface-type phase change memory, (IV) an alternately stacked layer of Ge and Sb and Te, or chalcogenide materials, (V) $TiO_X$, $WO_X$, $HfO_X$, $TaO_X$, or the like, as a variable resistance film, and (V) a CoFe alloy, a NiFe alloy, or the like, as an MTJ element.

In the resistive switching nonvolatile memory according to the first to third embodiments, the local source line LSL and the local bit line LBL are illustrated in a rectangular or approximately rectangular shape in the XY plane, but not always limited to such a rectangle. They may be in circular shape, elliptical shape, oval shape, or semicircular shape. The prismatic shape illustrated in FIG. 11 may also be cylindrical shape or the like.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A three dimensional stacked semiconductor memory comprising:
    a semiconductor substrate;
    a first electrode line extending in a first direction orthogonal to the semiconductor substrate;
    a second electrode line disposed so as to be adjacent to the first electrode line in a second direction, the second direction orthogonal to the first direction, the second electrode line extending in the first direction;
    a first variable resistance film extending in the first direction and in contact with the second electrode line;
    a first semiconductor film in contact with the first variable resistance film and the first electrode line;
    a first insulator layer extending in the first direction and in contact with the first semiconductor film;
    a first potential applying electrode extending in the second direction and in contact with the first insulator layer;
    a second variable resistance film extending in the first direction, the second variable resistance film disposed in a minus direction of the third direction orthogonal to the first direction and the second direction, the second variable resistance film in contact with the second electrode line;
    a second semiconductor film in contact with the second variable resistance film and the first electrode line;
    a second insulator layer extending in the second direction and in contact with the second semiconductor film; and
    a second potential applying electrode extending in the second direction and is contact with the second insulator layer, wherein
    the first potential applying electrode and the second potential applying electrode are electrically different nodes.

2. The three dimensional stacked semiconductor memory according to claim 1, further comprising:
    third potential applying electrodes disposed on the first potential applying electrode in the first direction, the third potential applying electrodes extending in the second direction; and
    a select gate transistor disposed at a location where the second semiconductor film and the third potential applying electrode intersect with each other.

3. The three dimensional stacked semiconductor memory according to claim 2, further comprising:
    a first memory cell disposed at a location where the second semiconductor film and the second potential applying electrode intersect with each other, wherein
    during a write operation for the first memory cell, a selected voltage is applied to the second potential applying electrode, and a non-selected voltage lower than the selected voltage is applied to the first potential applying electrode.

4. The three dimensional stacked semiconductor memory according to claim 3, wherein
    a first voltage is applied to the third potential applying electrodes during a read operation for the first memory cell, and a second voltage higher than the first voltage is applied to the third potential applying electrodes during the write operation for the first memory cell.

5. The three dimensional stacked semiconductor memory according to claim 3, wherein
    a first voltage is applied to the second potential applying electrode during a read operation for the first memory cell, and a second voltage higher than the first voltage is applied to the second potential applying electrode during the write operation for the first memory cell.

6. The three dimensional stacked semiconductor memory according to claim 3, further comprising
    a third electrode line extending in the third direction and connected to the second electrode line in the first direction in which the second electrode line extends.

7. The three dimensional stacked semiconductor memory according to claim 6, wherein
    a third voltage is applied to the third electrode line during the read operation for the first memory cell, and a fourth voltage higher than the third voltage is applied to the third electrode line during the write operation for the first memory cell.

8. The three dimensional stacked semiconductor memory according to claim 1, further comprising
    a fourth electrode line connected to the first electrode line in a minus direction of the first direction in which the first electrode line extends.

9. The three dimensional stacked semiconductor memory according to claim 2, further comprising:
    an insulation layer extending in the second direction and in contact with the third potential applying electrode, wherein
    the third potential applying electrodes are separated in the third direction from each other through the insulation layer.

10. A three dimensional stacked semiconductor memory comprising:
    a semiconductor substrate;
    a first electrode line extending a first direction orthogonal to the semiconductor substrate;
    a second electrode line disposed so as to be adjacent to the first electrode line in a second direction, the second direction orthogonal to the first direction, the second electrode line extending in the first direction;
    a first variable resistance film extending in the first direction and in contact with the second electrode line;
    a first semiconductor film in contact with the first variable resistance film and the first electrode line;
    a first insulator layer extending in the first direction and in contact with the first semiconductor film;
    a first potential applying electrode extending in the second direction and in contact with the first insulator layer;
    a second variable resistance film extending in the first direction, the second variable resistance film disposed in a minus direction of the third direction orthogonal to the first direction and the second direction, the second variable resistance film in contact with the second electrode line;
    a second semiconductor film in contact with the second variable resistance film and the first electrode line;
    a second insulator layer extending in the second direction and in contact with the second semiconductor film;

a second potential applying electrode extending in the second direction and is contact with the second insulator layer; and a plurality of lines sandwiched by the first potential applying electrode disposed in parallel so as to be adjacent to each other in the third direction and the second potential applying electrode, wherein the first potential applying electrode and the second potential applying electrode are electrically different nodes, and an arrangement in the second direction of the first electrode line and the second electrode line is shifted between the even-numbered line and the odd-numbered line.

11. The three dimensional stacked semiconductor memory according to claim 10, wherein the arrangement in the second direction of the second electrode line adjacent to the first electrode line is shifted between the even-numbered line and the odd-numbered line by a pitch, which is half of a pitch in the second direction between the first electrode line and the second electrode line.

12. A three dimensional stacked semiconductor memory comprising:

a semiconductor substrate;

a first electrode line extending a first direction orthogonal to the semiconductor substrate;

a second electrode line disposed so as to be adjacent to the first electrode line in a second direction, the second direction orthogonal to the first direction, the second electrode line extending in the first direction;

a first variable resistance film extending in the first direction and in contact with the second electrode line;

a first semiconductor film in contact with the first variable resistance film and the first electrode line;

a first insulator layer extending in the first direction and in contact with the first semiconductor film;

a first potential applying electrode extending in the second direction and in contact with the first insulator layer;

a second variable resistance film extending in the first direction, the second variable resistance film disposed in a minus direction of the third direction orthogonal to the first direction and the second direction, the second variable resistance film in contact with the second electrode line;

a second semiconductor film in contact with the second variable resistance film and the first electrode line;

a second insulator layer extending in the second direction and in contact with the second semiconductor film;

a second potential applying electrode extending in the second direction and in contact with the second insulator layer; and a plurality of third electrode lines extending in the third direction and in connect with the second electrode line in the first direction in which the second electrode line extends, wherein the first potential applying electrode and the second potential applying electrode are electrically different nodes, and the even-numbered third electrode line is connected to the second electrode line belonging to the even-numbered line, and the odd-numbered third electrode line is connected to the second electrode line belonging to the odd-numbered line.

13. The three dimensional stacked semiconductor memory according to claim 12, further comprising:

an end portion of second electrode line formed by extending the second electrode line in the first direction;

a first electrode connected to the end portion of second electrode line;

a third electrode connected to the even-numbered third electrode line; and a first metal layer connected to the third electrode and extending in a minus direction of the second direction, wherein the first electrode is connected to the third electrode through the first metal layer at a location where a distance of a half of an arrangement pitch of the third electrode line is shifted in a minus direction of the second direction.

14. The three dimensional stacked semiconductor memory according to claim 12, further comprising:

an end portion of second electrode line formed by extending the second electrode line in the first direction;

a first electrode connected to the end portion of second electrode line;

a third electrode connected to the odd-numbered third electrode line; and a second metal layer connected to the third electrode and extending in the second direction, wherein the first electrode is connected to the third electrode through the second metal layer at a location where a distance of a half of an arrangement pitch of the third electrode line is shifted in the second direction.

15. The three dimensional stacked semiconductor memory according to claim 1, further comprising:

a first barrier film disposed between the first variable resistance film and the second electrode line; and a second barrier film disposed between the first variable resistance film and the first semiconductor film.

16. The three dimensional stacked semiconductor memory according to claim 15, further comprising a third barrier film disposed between the first semiconductor film and the first electrode line.

17. The three dimensional stacked semiconductor memory according to claim 16, wherein the first barrier film, the second barrier film, and the third barrier film include at least one selected from a group consisting of TiN, TaN, $TiO_X$, C, CN, C—W, and C—WN.

18. The three dimensional stacked semiconductor memory according to claim 16, wherein the first barrier film, the second barrier film, and the third barrier film comprises a heat generation film.

19. The three dimensional stacked semiconductor memory according to claim 18, wherein The heat generation film comprises germanium or tellurium containing indium as an impurity, or a compound of group III-V.

20. The three dimensional stacked semiconductor memory according to claim 1, wherein the first variable resistance film is formed with a phase change material, a superlattice film material, a magnetic material, or a resistance variation material, the phase change material includes a chalcogenide-based material, the superlattice film material includes stacked structure of GeTe and SbTe, the magnetic material is composed of a tunnel film sandwiched between a free layer and a pinned layer, and the resistance variation material includes at least one selected from a group consisting of $NiO_X$, $WO_X$, $TaO_X$, $TiO_X$, $HfO_X$, $ZnO_X$, TiON, Ag—GeSe, Cu—GeSe, $FeO_X$, $GeO_X$, and STO.

\* \* \* \* \*